United States Patent
Tamagawa et al.

(10) Patent No.: US 7,476,113 B2
(45) Date of Patent: *Jan. 13, 2009

(54) JOINT MEMBER AND JOINT CONNECTOR FOR WIRE HARNESS

(75) Inventors: Tatsuo Tamagawa, Mie (JP); Hiroki Hirai, Mie (JP); Yuuji Saka, Mie (JP); Akinori Oishi, Mie (JP); Mitsuhiro Hattori, Mie (JP); Eiji Kojima, Mie (JP)

(73) Assignees: Autonetworks Technologies, Ltd., Mie (JP); Sumitomo Electric Industries, Ltd., Osaka (JP); Sumitomo Wiring Systems, Ltd., Mie (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/003,384

(22) Filed: Dec. 21, 2007

(65) Prior Publication Data

US 2008/0119064 A1  May 22, 2008

Related U.S. Application Data

(63) Continuation of application No. 10/892,380, filed on Jul. 16, 2004, now Pat. No. 7,351,085.

(30) Foreign Application Priority Data

| Jul. 17, 2003 | (JP) | ............................. 2003-198297 |
| Jul. 17, 2003 | (JP) | ............................. 2003-198298 |
| Jun. 24, 2004 | (JP) | ............................. 2004-186130 |
| Jul. 8, 2004 | (JP) | ............................. 2004-202052 |

(51) Int. Cl.
   *H01R 29/00* (2006.01)
(52) U.S. Cl. .................... 439/189; 439/511
(58) Field of Classification Search ............... 439/189, 439/511, 590, 710, 937
See application file for complete search history.

(56) References Cited

U.S. PATENT DOCUMENTS

| 4,149,768 | A | * | 4/1979 | Wise ........................... 439/730 |
| 4,214,361 | A | * | 7/1980 | Coldren et al. ................ 29/863 |
| 5,000,699 | A | | 3/1991 | Nadin |
| 5,106,318 | A | | 4/1992 | Endo et al. |
| 5,201,667 | A | | 4/1993 | Endo et al. |
| 5,556,291 | A | | 9/1996 | Ito et al. |
| 5,662,487 | A | | 9/1997 | Okamura et al. |
| 5,769,650 | A | | 6/1998 | Aoyama et al. |
| 5,788,519 | A | | 8/1998 | Stern |
| 6,402,569 | B1 | | 6/2002 | Spandon et al. |
| 6,447,331 | B1 | | 9/2002 | Fukatsu et al. |

(Continued)

FOREIGN PATENT DOCUMENTS

DE     197 33 328 A1    2/1999

(Continued)

*Primary Examiner*—Thanh-Tam T Le
(74) *Attorney, Agent, or Firm*—Oliff & Berridge, PLC

(57) ABSTRACT

A flexible wiring member, which is capable of being wound around a wire harness, is provided with joint-side terminals, which are capable of being fitted with wire-side terminals, and the flexible wiring member includes a connection circuit for electrically connecting specified joint-side terminals in the joint-side terminals. Or, a plurality of joint-side terminals are previously held in the insulation housing, and these joint-side terminals are connected with a common flexible wiring member.

18 Claims, 43 Drawing Sheets

U.S. PATENT DOCUMENTS

| | | | |
|---|---|---|---|
| 6,454,582 B2 * | 9/2002 | Yamanashi et al. | 439/189 |
| 6,707,689 B2 * | 3/2004 | Momota et al. | 361/833 |
| 6,840,820 B2 | 1/2005 | Oda | |
| 7,351,085 B2 * | 4/2008 | Tamagawa et al. | 439/189 |

FOREIGN PATENT DOCUMENTS

| | | |
|---|---|---|
| JP | A-08-079948 | 3/1996 |
| JP | A-08-279382 | 10/1996 |

* cited by examiner

JOINT MEMBER AND JOINT CONNECTOR FOR WIRE HARNESS

This is a Continuation of application Ser. No. 10/892,380 filed Jul. 16, 2004. The disclosure of the prior application is hereby incorporated by reference herein in their entirety.

BACKGROUND OF THE INVENTION

1. Field of the Invention

The present invention relates to a technique for electrically connecting specified wires included in a wire harness to each other.

2. Description of the Related Art

Conventionally, as a joint member for electrically connecting (i.e., short-circuiting) specified wires included in a wire harness to each other, a joint member disclosed in JP-A-8-079948 is known (c.f. pages 2-3, and FIGS. 1 and 8 of JP-A-8-079948). The joint member is arranged so that a plurality of terminal receiving portions is arranged in parallel on the external peripheral of a band wound around a wire harness, and inside thereof a conductive thin plate is disposed and when wire-side terminals fixed to the terminal of each wire are inserted with each of the terminal receiving portions, the wire-side terminals come into contact with the conductive thin plate from the outside in the diameter direction; thus, the specified wires are electrically connected via the wire-side terminals.

Here, each wire-side terminal has a leaf spring-like flexible portion for coming into contact with the conductive thin plate by pressure force, and it is provided so that, when the wire-side terminal is inserted into the terminal receiving portion by force in a state where the flexible portion is flexibly deformed, the pressed-contact state between the flexible portion and the conductive thin plate are maintained.

In the joint member disclosed in JP-A-8-079948, in order to ensure the contact between the wire-side terminal and the conductive thin plate, a leaf spring-like flexible portion, which has a large dimension in height, is formed on the wire-side terminal, and further, a terminal receiving portion having a size for accommodating the flexible portion is formed parallel to the band. As a result, the thickness of the entire joint member is considerably large. Accordingly, when the joint member is wound around a wire harness, the entire joint member largely protrudes to the outside in the diameter direction from the main body portion of the wire harness, and may become an obstacle for disposing the wire harness.

The joint connector described in JP-A-8-079948 is often used for short-circuiting specified electric wires contained in a wire harness with each other, in which case the joint connector is wound around a main portion of the wire harness by an adhesive tape and fixed to the main portion of the wire harness. At this stage, if the joint connector is too high, the joint connector as it is wound sticks out greatly beyond the main portion of the wire harness and could therefore intervene disposing of the wire harness, and hence, thickness reduction of the joint connector is desired.

However, in the case of the joint connector described in JP-A-8-079948 above, it is difficult to reduce thickness of the joint connector, i.e., to reduce the height of the joint connector, because of which the joint connector when wound around the wire harness could stick out greatly. The reason is as follows.

1) Since used as the wire-side terminals are terminals including the slit grooves which extend in the height direction and in which the bus bar plates can be inserted, the terminals easily tend to be higher than ordinary wire-side terminals and the entire connector becomes accordingly high.

2) In addition, since the bus bar plates are inserted within the insulation housing along the height direction of the wire-side terminals, a guide portion for guiding the bus bar plates must be provided along the direction of the insertion in the insulation housing, and as the guide portion is disposed, the insulation housing becomes even higher.

SUMMARY OF THE INVENTION

The present invention has been proposed in view of the above problems. One of objects of the present invention is to reduce the thickness of the joint member, and thus, to reduce the protrusion amount of the joint member when the joint member is wound around a wire harness.

Another object of the present invention is to provide a joint connector for a wire harness which can be made thin and is suitable for short-circuiting electric wires contained in a wire harness with each other.

According to a first aspect of the invention, there is provided a joint member for electrically connecting a plurality of wires included in a wire harness to each other, the joint member including: a flexible wiring member extending in one direction and having a flexibility so as to allow winding around the wire harness with a longitudinal direction of the flexible wiring member oriented in the peripheral direction of the wire harness or in a direction inclined with respect to the peripheral direction; joint-side terminals provided in a plurality of positions aligned in the longitudinal direction of the flexible wiring member and protruding outward from an edge portion extending in the longitudinal direction of the flexible wiring member to be connected to each of the wires; and a connection circuit provided in the flexible wiring member and electrically connects specific joint-side terminals of the joint-side terminals with one another.

According to a second aspect of the invention, there is provided a joint connector including: a joint member for electrically connecting a plurality of wires included in a wire harness to each other; and a plurality of wire-side terminals, wherein the joint member includes: a flexible wiring member extending in one direction and having a flexibility so as to allow winding around the wire harness with a longitudinal direction of the flexible wiring member oriented in the peripheral direction of the wire harness or in a direction inclined with respect to the peripheral direction; joint-side terminals provided in a plurality of positions aligned in the longitudinal direction of the flexible wiring member and protruding outward from an edge portion extending in the longitudinal direction of the flexible wiring member to be connected to each of the wires; and a connection circuit provided in the flexible wiring member and electrically connects specific joint-side terminals of the joint-side terminals with one another, wherein the wire-side terminals are fixed to terminals of specified wires in the wires included in the wire harness and capable of being fitted with each joint-side terminal included in the joint member, and wherein each of the wire-side terminals is fitted with a joint-side terminal of the joint member to be electrically connected to each other.

According to a third aspect of the invention, there is provided a joint connector for electrically connecting a plurality of wires included in a wire harness to each other, the joint connector including: a flexible wiring member, which extends in one direction and has flexibility allowing to be wound around the wire harness with the longitudinal direction thereof oriented in the peripheral direction of the wire harness; a plurality of wire-side insulation housings for holding wire-side terminals fixed to each of the wire terminals; joint-side insulation housings capable of being connected to each of the wire-side insulation housings; and joint-side terminals held by each of the joint-side insulation housings, and fitted with the wire-side terminals held by the wire-side insulation housing in a state where the joint-side insulation housings are connected with the wire-side insulation housings, the joint-side terminals having a wiring member connecting portion provided at an end portion opposite the end portion fitted therewith, and capable of being connected with the flexible wiring member, wherein the joint-side insulation housing holds the joint-side terminals in a state where wiring member connecting portions of each of the joint-side terminals are provided so as to allow the electrical connection of the flexible wiring member to the wiring member connecting portion, the flexible wiring member including a connection circuit for electrically connecting to specified wiring member connecting portions in the wiring member connecting portions to be connected to the flexible wiring member.

According to a fourth aspect of the invention, there is provided a wire harness including a joint connector to electrically connect specified wires to each other, the joint connector including: a joint member for electrically connecting a plurality of wires included in a wire harness to each other; and a plurality of wire-side terminals, wherein the joint member includes: a flexible wiring member extending in one direction and having a flexibility so as to allow winding around the wire harness with a longitudinal direction of the flexible wiring member oriented in the peripheral direction of the wire harness or in a direction inclined with respect to the peripheral direction; joint-side terminals provided in a plurality of positions aligned in the longitudinal direction of the flexible wiring member and protruding outward from an edge portion extending in the longitudinal direction of the flexible wiring member to be connected to each of the wires; and a connection circuit provided in the flexible wiring member and electrically connects specific joint-side terminals of the joint-side terminals with one another, wherein the wire-side terminals are fixed to terminals of specified wires in the wires included in the wire harness and capable of being fitted with each joint-side terminal included in the joint member, wherein each of the wire-side terminals is fitted with a joint-side terminal of the joint member to be electrically connected to each other, and wherein the flexible wiring member of the joint member is wound around a main body portion of the wire harness and fixed thereto in a state where each of the wire-side terminals are fixed to the terminals of specified wires and the wire-side terminal, each of the joint-side terminals of the joint member being fitted with other.

According to a fifth aspect of the invention, there is provided a wire harness including a joint connector to electrically connect specified wires to each other, the joint connector including: a flexible wiring member, which extends in one direction and has flexibility allowing to be wound around the wire harness with the longitudinal direction thereof oriented in the peripheral direction of the wire harness; a plurality of wire-side insulation housings for holding wire-side terminals fixed to each of the wire terminals; joint-side insulation housings capable of being connected to each of the wire-side insulation housings; and joint-side terminals held by each of the joint-side insulation housings, and fitted with the wire-side terminals held by the wire-side insulation housing in a state where the joint-side insulation housings are connected with the wire-side insulation housings, the joint-side terminals having a wiring member connecting portion provided at an end portion opposite the end portion fitted therewith, and capable of being connected with the flexible wiring member, wherein the joint-side insulation housing holds the joint-side terminals in a state where wiring member connecting portions of each of the joint-side terminals are provided so as to allow the electrical connection of the flexible wiring member to the wiring member connecting portion, the flexible wiring member including a connection circuit for electrically connecting to specified wiring member connecting portions in the wiring member connecting portions to be connected to the flexible wiring member, wherein the wiring member-connecting portion of the joint-side terminal held by each of the joint-side insulation housing, is connected to a common flexible wiring member, wherein specified wiring member connecting portions in the wiring member connecting portions are electrically connected to each other via the flexible wiring member, wherein each of the wire-side terminals is fitted with a joint-side terminal of the joint member to be electrically connected to each other, and wherein the flexible wiring member of the joint member is wound around a main body portion of the wire harness and fixed thereto in a state where each of the wire-side terminals are fixed to the terminals of specified wires and the wire-side terminal, each of the joint-side terminals of the joint member being fitted with other.

According to a sixth aspect of the invention, there is provided a wire harness including a joint connector to electrically connect specified wires to each other, the joint connector including: a joint member for electrically connecting a plurality of wires included in a wire harness to each other; a plurality of wire-side terminals; and a plurality of wire-side insulation housings for holding the wire-side terminals, wherein the joint member includes: a flexible wiring member extending in one direction and having a flexibility so as to allow winding around the wire harness with a longitudinal direction of the flexible wiring member oriented in the peripheral direction of the wire harness or in a direction inclined with respect to the peripheral direction; joint-side terminals provided in a plurality of positions aligned in the longitudinal direction of the flexible wiring member and protruding outward from an edge portion extending in the longitudinal direction of the flexible wiring member to be connected to each of the wires; and a connection circuit provided in the flexible wiring member and electrically connects specific joint-side terminals of the joint-side terminals with one another, wherein the wire-side terminals are fixed to terminals of specified wires in the wires included in the wire harness and capable of being fitted with each joint-side terminal included in the joint member, wherein each of the wire-side terminals is fitted with a joint-side terminal of the joint member to be electrically connected to each other, wherein, in a state where the wire-side terminals held by the wire-side insulation housings and the joint-side terminals are fitted with each other, the flexible wiring member is provided to be flexible within the positions between the wire-side insulation housings, wherein the flexible wiring members are formed in a stair-like shape so that a position of each of the wire-side insulation housings shifts in a stair-like shape in the direction perpendicular to the longitudinal direction of the flexible wiring member, wherein each of the wire-side terminals is fixed to the terminals of the specified wires, wherein the joint member to be connected to the wire-side terminals is held by the wire-side insulation housing, and wherein the flexible wiring member of the joint member is wound around a main body portion of the wire harness in a spiral configuration and fixed thereto.

According to a seventh aspect of the invention, there is provided a wire harness including a joint connector to electrically connect specified wires to each other, the joint connector including: a flexible wiring member, which extends in one direction and has flexibility allowing to be wound around the wire harness with the longitudinal direction thereof oriented in the peripheral direction of the wire harness; a plurality of wire-side insulation housings for holding wire-side terminals fixed to each of the wire terminals; joint-side insulation housings capable of being connected to each of the wire-side insulation housings; and joint-side terminals held by each of the joint-side insulation housings, and fitted with the wire-side terminals held by the wire-side insulation housing in a state where the joint-side insulation housings are connected with the wire-side insulation housings, the joint-side terminals having a wiring member connecting portion provided at an end portion opposite the end portion fitted therewith, and capable of being connected with the flexible wiring member, wherein the joint-side insulation housing holds the joint-side terminals in a state where wiring member connecting portions of each of the joint-side terminals are provided so as to allow the electrical connection of the flexible wiring member to the wiring member connecting portion, the flexible wiring member including a connection circuit for electrically connecting to specified wiring member connecting portions in the wiring member connecting portions to be connected to the flexible wiring member, wherein the flexible wiring member is formed in a stair-like shape so that the position of the each joint-side insulation housing shifts in a stair-like shape in the direction perpendicular to the longitudinal direction of the flexible wiring member, wherein each of the wire-side terminal is fixed to terminals of the specified wires, wherein the wire-side terminals are held by the wire-side insulation housing, and wherein the flexible wiring member of the joint member is wound around a main body portion of the wire harness in a spiral configuration and fixed thereto in a state where the wire-side insulation housing and each of the joint-side insulation housing are fitted with each other.

According to an eighth aspect of the invention, there is provided a joint connector for electrically connecting a plurality of electric wires contained in a wire harness with each other, the joint connector including: wire-side terminals fixed to ends of specified electric wires among the electric wires contained in the wire harness, the wire-side terminals including on their tip end side female contacts in which male terminals are to be inserted in axial direction of the wire-side terminals; an insulation housing that holds the wire-side terminals such that the wire-side terminals adjacent to each other approximately on the same plane, the insulation housing including terminal release portions in which the female contacts of the wire-side terminals are released to the tip end side; and a short-circuit member that short-circuits specified wire-side terminals among the wire-side terminals with each other, wherein the short-circuit member includes: a plurality of male terminal sections that are to be inserted respectively in the female contacts of the specified wire-side terminals through the terminal release portions of the insulation housing; and a terminal linking section that links the male terminal sections to each other and electrically connects specified male terminal sections with each other.

According to a ninth aspect of the invention, there is provided a wire harness in which specified electric wires are electrically connected with each other by a joint connector including: wire-side terminals fixed to ends of specified electric wires among the electric wires contained in the wire harness, the wire-side terminals including on their tip end side female contacts in which male terminals are to be inserted in axial direction of the wire-side terminals; an insulation housing that holds the wire-side terminals such that the wire-side terminals adjacent to each other approximately on the same plane, the insulation housing including terminal release portions in which the female contacts of the wire-side terminals are released to the tip end side; and a short-circuit member that short-circuits specified wire-side terminals among the wire-side terminals with each other, wherein the short-circuit member includes: a plurality of male terminal sections that are to be inserted respectively in the female contacts of the specified wire-side terminals through the terminal release portions of the insulation housing; and a terminal linking section that links the male terminal sections to each other and electrically connects specified male terminal sections with each other, and wherein the joint connector is wound around and fixed to a main portion of the wire harness.

According to a tenth aspect of the invention, there is provided a method of electrically connecting a plurality of electric wires contained in a wire harness with each other using the joint connector according to the ninth aspect of the invention, the method including: fixing the wire-side terminals to the ends of specified electric wires among the electric wires contained in the wire harness; holding the wire-side terminals within the insulation housing; fitting the male terminal sections of the short-circuit members in the female contacts of the specified wire-side terminals held within the insulation housing and electrically connecting the wire-side terminals with each other; and fixing the insulation housing to a main portion of the wire harness after the electric connection.

BRIEF DESCRIPTION OF THE DRAWINGS

These and other objects and advantages of the present invention will become more fully apparent from the following detailed description taken with the accompanying drawings, in which:

FIG. 6 is wound and fixed to a main body portion of the wire harness;

DETAILED DESCRIPTION OF THE PREFERRED EMBODIMENTS

Referring now to the accompanying drawings, a description will be given in detail of preferred embodiments of the invention.

Figure 1:
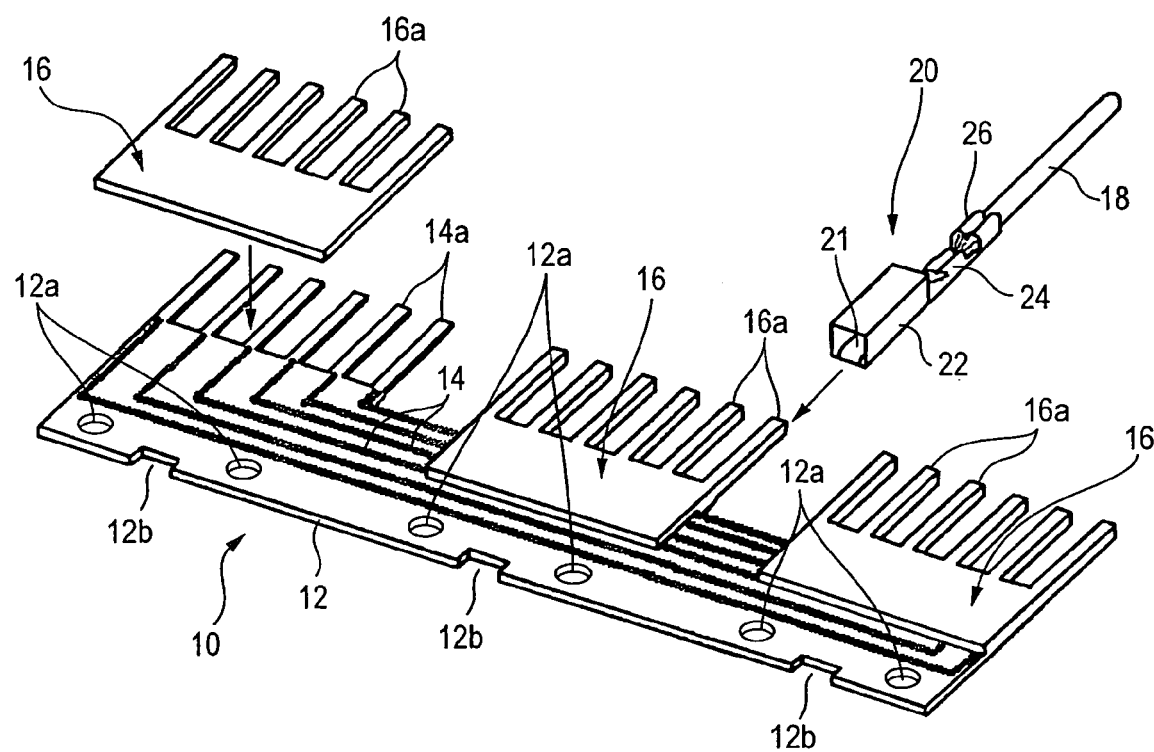
FIG. 1 is a perspective view showing an example of a joint member according to a first embodiment formed of a flexible printed circuit substrate.

FIG. 1 shows an example of a joint member 10 according to a first embodiment of the present invention, the joint member 10 having a flexible printed circuit substrate. The joint member 10 shown in the figure is a base material 12 made of a thin insulating material extending in one direction, on which a conductor pattern 14 is printed. The conductor pattern 14 includes protruding portions 14a, which protrude outward from the edge portion extending in the longitudinal direction of the joint member 10 and constitutes joint-side terminals, and a connection circuit for electrically connecting between specified protruding portions 14a.

In the example shown in the figure, protruding portions 14a for 3 groups (total 18), in which one group includes 6 portions, are formed. Also, in each group, formed in the edge portion of the base material 12 opposite the protruding portions 14a are notches 12b. And formed in two positions sandwiching the notch 12b are through-holes 12a.

Further, in the joint member 10, each of the groups is allotted with a comb-like reinforcement plate 16, which has protruding portions 16a substantially corresponding to the protruding portions 14a, and each of them is overlapped with the protruding portion 14a and fixed with a bonding or the like, thereby a satisfactory rigidity of the joint-side terminals having the protruding portions 14a is ensured.

On the other hand, fixed on the terminal of each wire 18 constituting a wire harness is a female terminal 20 as the wire-side terminal. The female terminal 20 shown in the figure has a box-like electrical contact portion 22 for storing a spring contact piece 21 at the front-end side thereof; and in the rear portion thereof, a conductor barrel 24, which is pressed to the conductor portion of the wire 18, and insulation barrel 26, which is pressed to the insulation coating of the wire 18 are provided. By inserting an appropriate protruding portion 14a (and protruding portion 16a of the reinforcement plate 16 overlapped with the protruding portion 14a) on the joint member 10 into the electrical contact portion 22 of the female terminal 20 on a specified wire 18 to make contact with the spring contact piece 21, it is provided so that specified female terminals 20 are connected to each other via the connection circuit formed by the conductor pattern 14 on the joint member 10.

Figure 2:
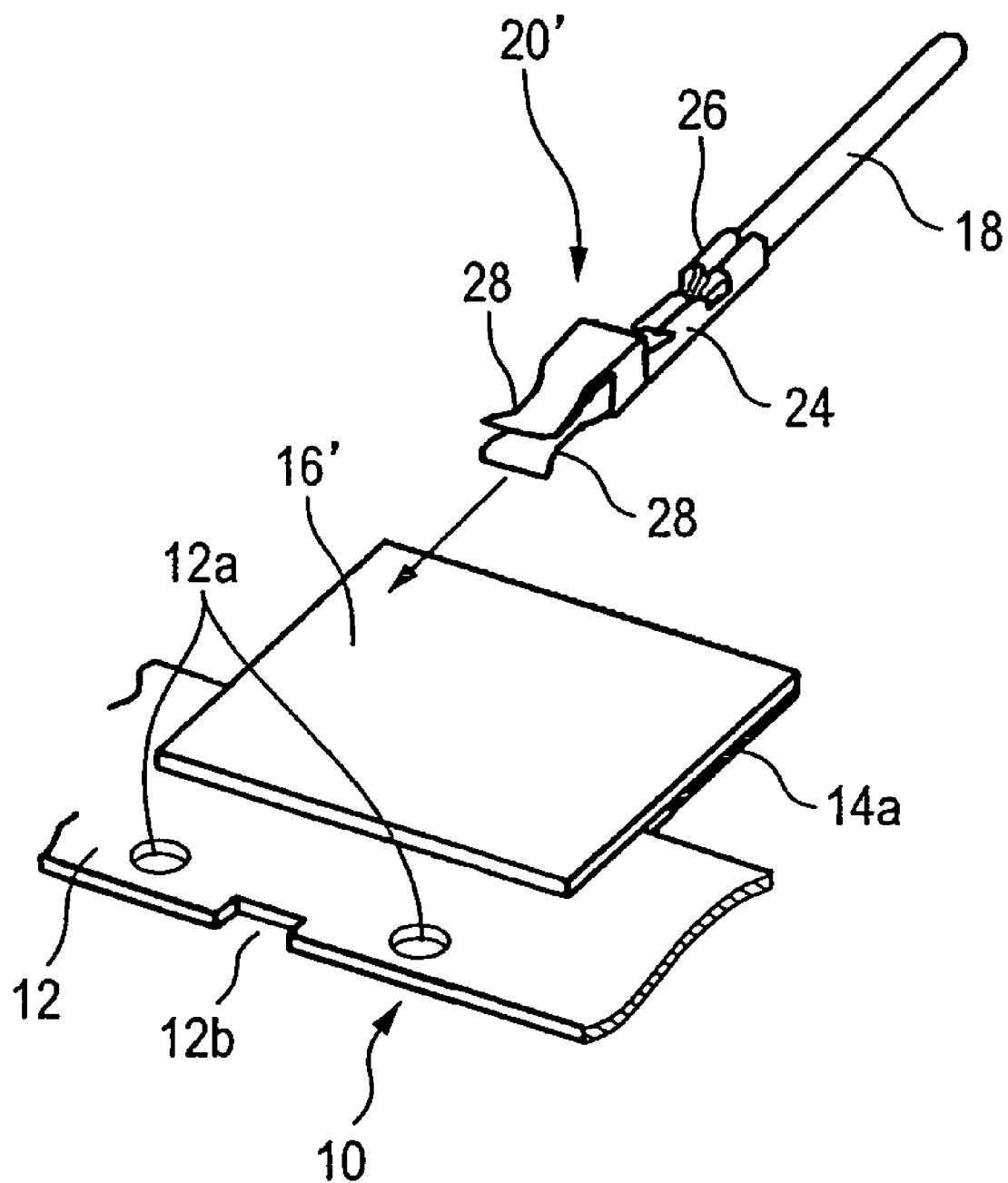
FIG. 2 is a perspective view showing an example of a reinforcement plate provided to the joint member.

The above-mentioned reinforcement plate 16 is not always needed, and may be appropriately omitted depending on the specifications therefor. Also, the configuration of the reinforcement plate 16 is not limited to the comb-like configuration shown in the figure, but a simple plate-like reinforcement plate 16', for example, shown in FIG. 2 may be used. In such a case, it may be arranged so that, as the wire-side terminal, a wire-side terminal 20' having a pair of spring nip-pieces 28 as shown in FIG. 2 is used, and between the spring nip-pieces 28, the protruding portion 14 and reinforcement plate 16' are inserted.

It may be arranged so that, for example, the wire-side terminals are fitted one by one with the joint member 10. However, it may be arranged so that, a plurality of wire-side terminals are integrally joined in a dedicated wire-side insulation housing in each group beforehand and are assembled as a job lot in the housing in the final process of the wire harness. Thereby, the assembly efficiency of the wire harness is largely increased, and the insulation conditions between the wire-side terminals outside the joint member 10 are further reliably maintained. Accordingly, such a problem that wire-side terminals, which should not be short-circuited, are circuited is prevented further reliably.

An example of the wire-side insulation housing is shown in FIG. 3 to FIG. 6. The housing 30 shown in the figures is integrally constituted of a flat housing main body 32 formed of an insulating material such as synthetic resin, a thin plate cover 34, which is attached thereon and a thin hinge section 36, which connects the one ends of the housing main body 32 and the cover 34, which is capable of deforming flexibly so as to allow relative rotation movement therebetween.

The housing main body 32 has a plurality of (in the figures, 6) terminal receiving chambers 38, which are lined on the same plane, and formed at the front end of each terminal receiving chamber 38 is a terminal insertion hole 39 capable of being inserted by protruding portions 14a and 16a of the joint member 10 shown in FIG. 1. Formed on the top wall of each terminal-receiving chamber 38 is a lance 40 for primary hooking a catch to be hooked 23 in the electrical contact portion 22 of the inserted female terminal 20, and formed behind the lance 40 is a window 42 for exposing the intermediate portion of the terminal upward.

Further, from the end portion of the housing main body 32 at the front-end side (the side where the terminal insertion hole 39 is formed), wiring member supporting section 44 for holding the flexible wiring member of the joint member 10 is extended. The wiring member supporting section 44 is connected with the housing main body 32 at the position immediately below each of the terminal insertion holes 39, and has substantially the same dimension as the width dimension of the joint member 10.

Formed in an end portion of the wiring member supporting section 44 is a locking projection 44b. Formed in two positions sandwiching the locking projection 44b are through-holes 44a, which go through the wiring member supporting section 44 in the thickness direction. The locking projection 44b is formed at a position where, in the state fitted with the terminals that the protruding portions 14a and 16a of the joint member 10 are plugged in each of the female terminals 20 in the terminal receiving chamber 38, the locking projection 44b is engaged with the notch 12b in the joint member 10. The through-holes 44a are formed at the position where, in the state fitted with terminals, the through-holes 44a coincide with the through-holes 12a in the joint member 10.

On the other hand, the cover 34 is integrally constituted of a main body cover section 46, which is, in the closed state thereof, attached on the housing main body 32 and a wiring member cover section 48, which, in the closed state, sandwiches the flexible wiring member of the joint member 10 with the wiring member supporting section 44 therebetween.

Formed on the rear face of the main body cover section 46 are projections 47, which are, in the closed state, inserted into the windows 42. When the projections 47 are inserted into the windows 42, the projections 47 turn into a contact possible state with electrical contact portion 22 of the respective female terminals 20 from the backside thereof, thus a secondary hooking with the female terminals 20 is achieved.

Formed on the rear face of the wiring member cover section 48 being protruding therefrom are a pair of wire disposing member holding pins (wiring member holding projections) 48a, which are capable of inserting into through-holes 44a in the through-hole 12a and wiring member supporting section 44 of the joint members 10. And formed in the end portion of the wiring member cover section 48 is a locking frame 48b, which is capable of engaging with the locking projection 44b. When the locking projection 44b and the locking frame 48b are engaged with each other, the cover 34 is locked in the closed position, and in the closed position, the wire disposing member holding pins 48a are plugged in the through-holes 12a in the joint member 10. Thus, it is provided so that the joint member 10 is held in the terminal fitted position (position where the protruding portions 14a and 16a are fitted with the female terminal 20).

Accordingly, according to this connector, by carrying out the following steps, the short-circuiting process between the specified wires 18 in the wire harness is readily made.

Figure 3:
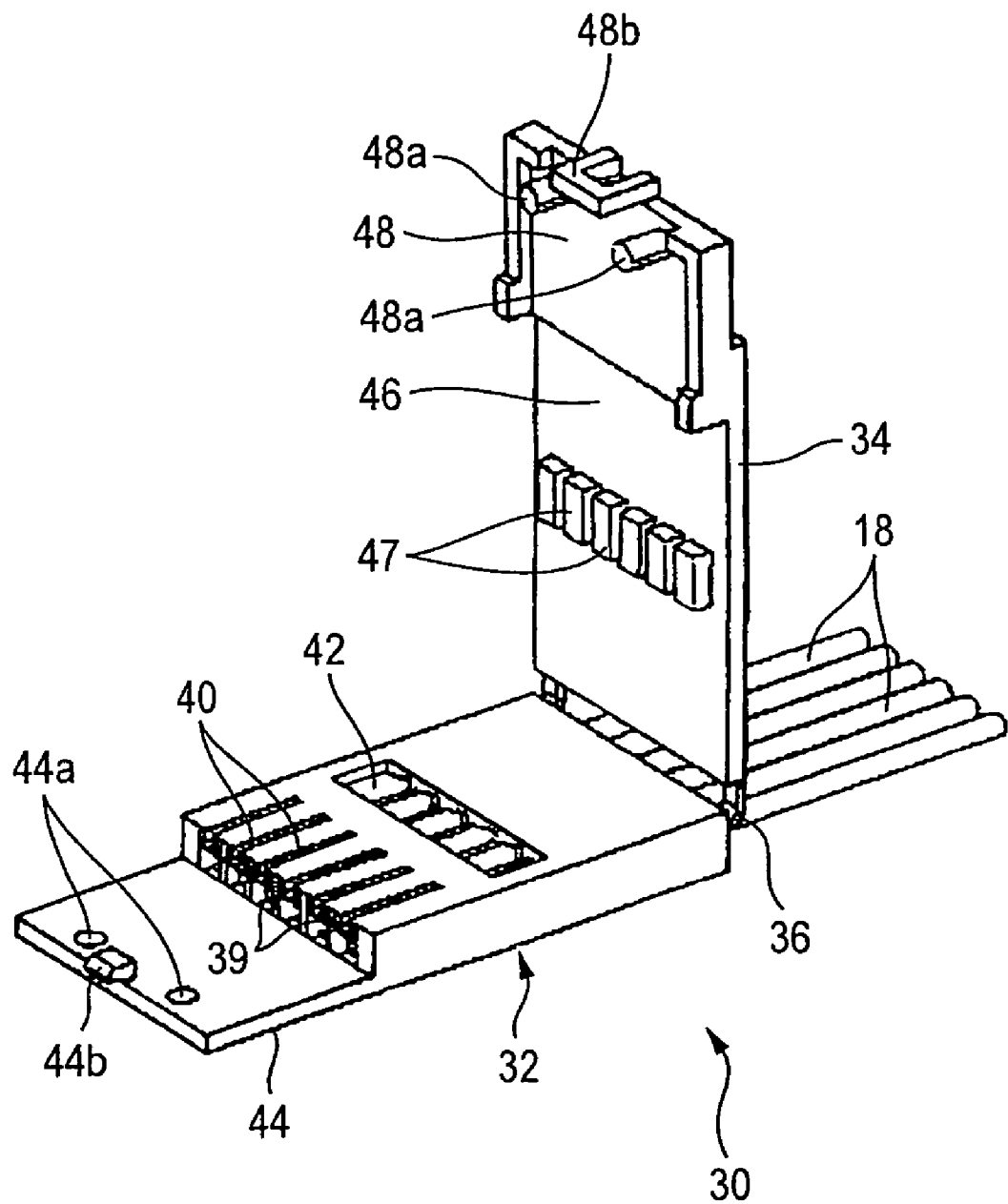
FIG. 3 is a perspective view of a wire-side insulation housing for holding joint members and wire-side terminals.
Figure 4:
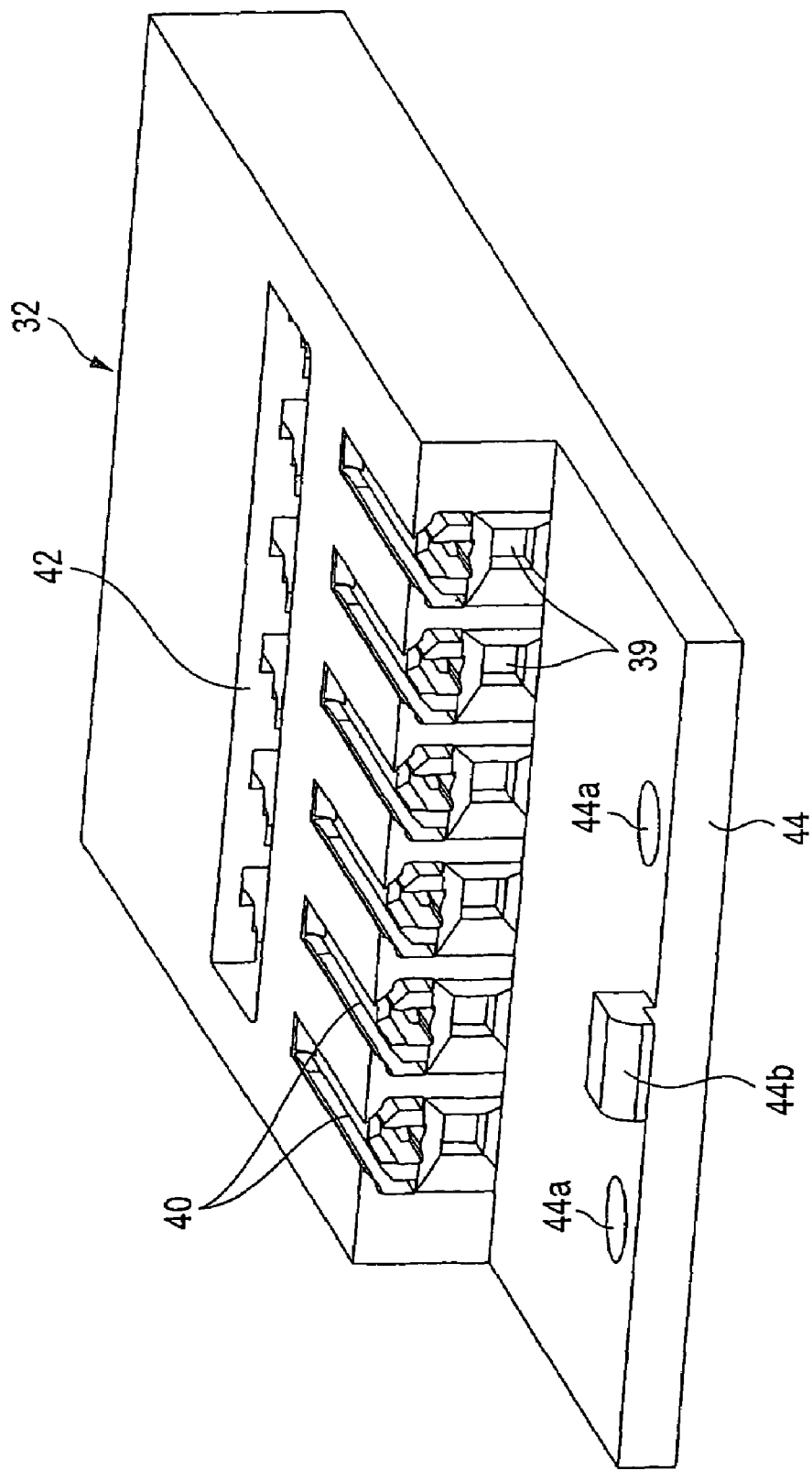
FIG. 4 is a perspective view of a main body portion of the housing for holding joint members and wire-side terminals.

1) In the pre-assembly of the wire harness, each of the female terminals 20 is held by the wire-side insulation housing 30 (FIG. 3).

2) In the final process, in a state where the cover 34 of the wire-side insulation housings 30 is opened, the female terminals 20 are fitted with the joint-side terminals of the joint member 10, i.e, protruding portions 14a and 16a.

3) The cover 34 is closed; thereby the joint member 10 is sandwiched by the wiring member cover section 38 on the cover 34 and the wiring member supporting section 44, and the wire disposing member holding pins 48a are fitted with the through-holes 12a. Thereby, joint member 10 is fixed to the wire-side insulation housing 30 and the state fitted with terminals is maintained (FIG. 5 and FIG. 6).

Figure 5:
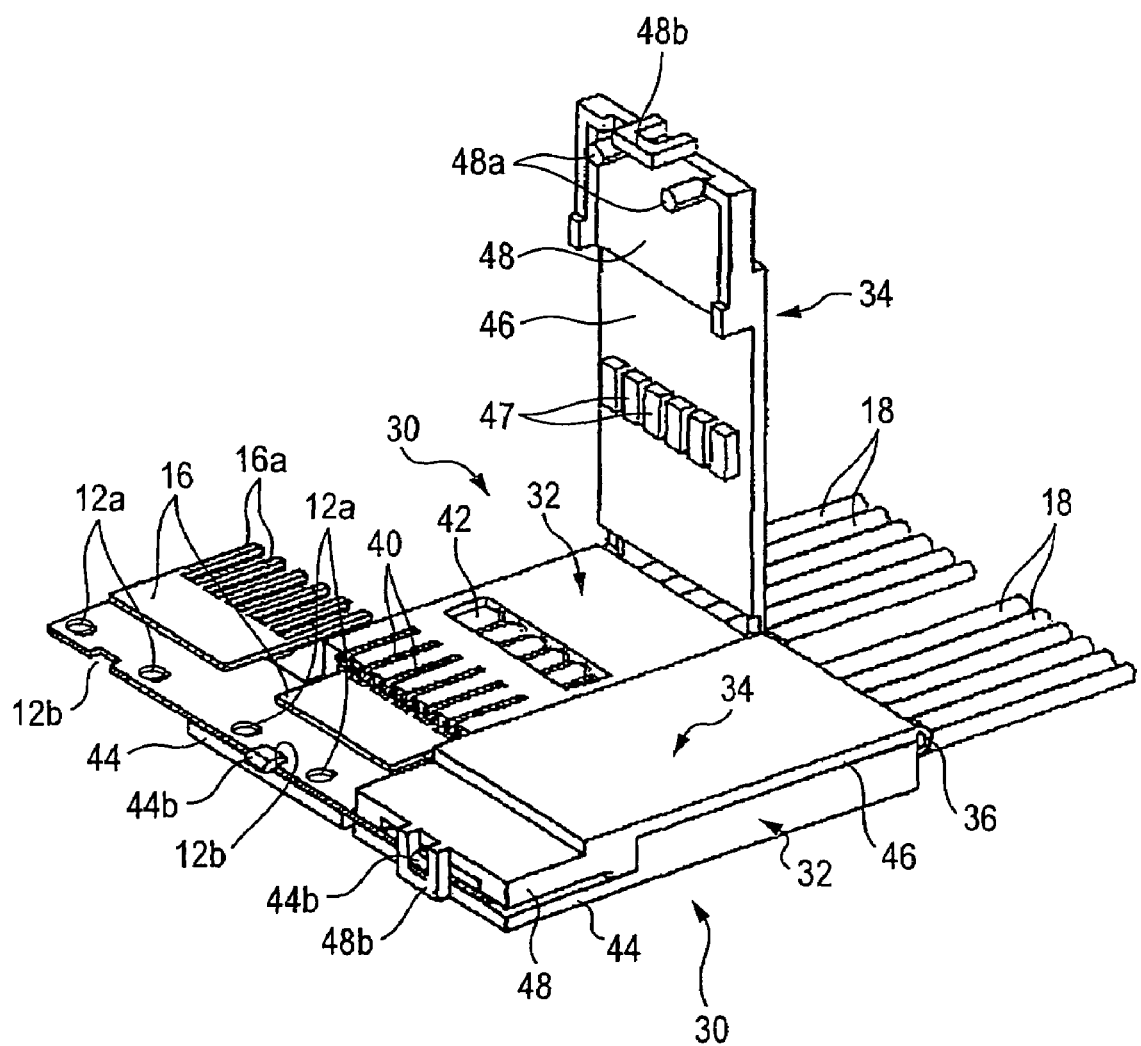
FIG. 5 is a perspective view showing a process to connect the wire-side insulation housing and the joint member.
Figure 6:
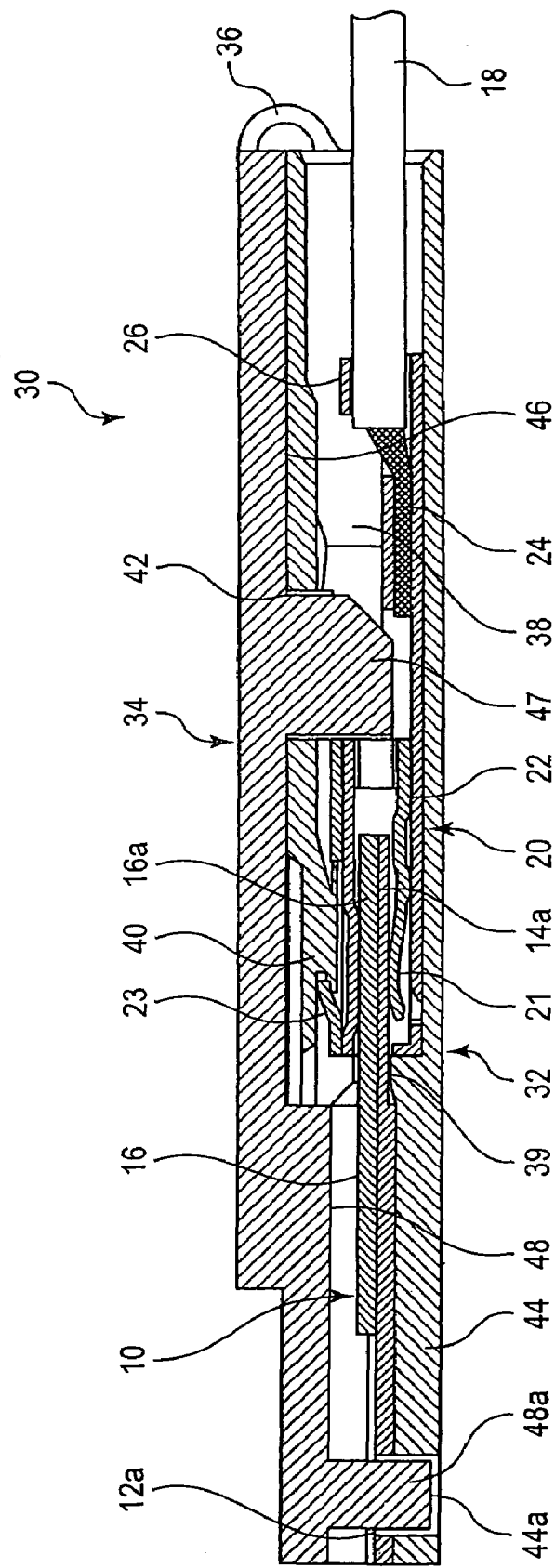
FIG. 6 is a sectional view showing a state where the wire-side insulation housing is connected with the joint member.
Figure 7:
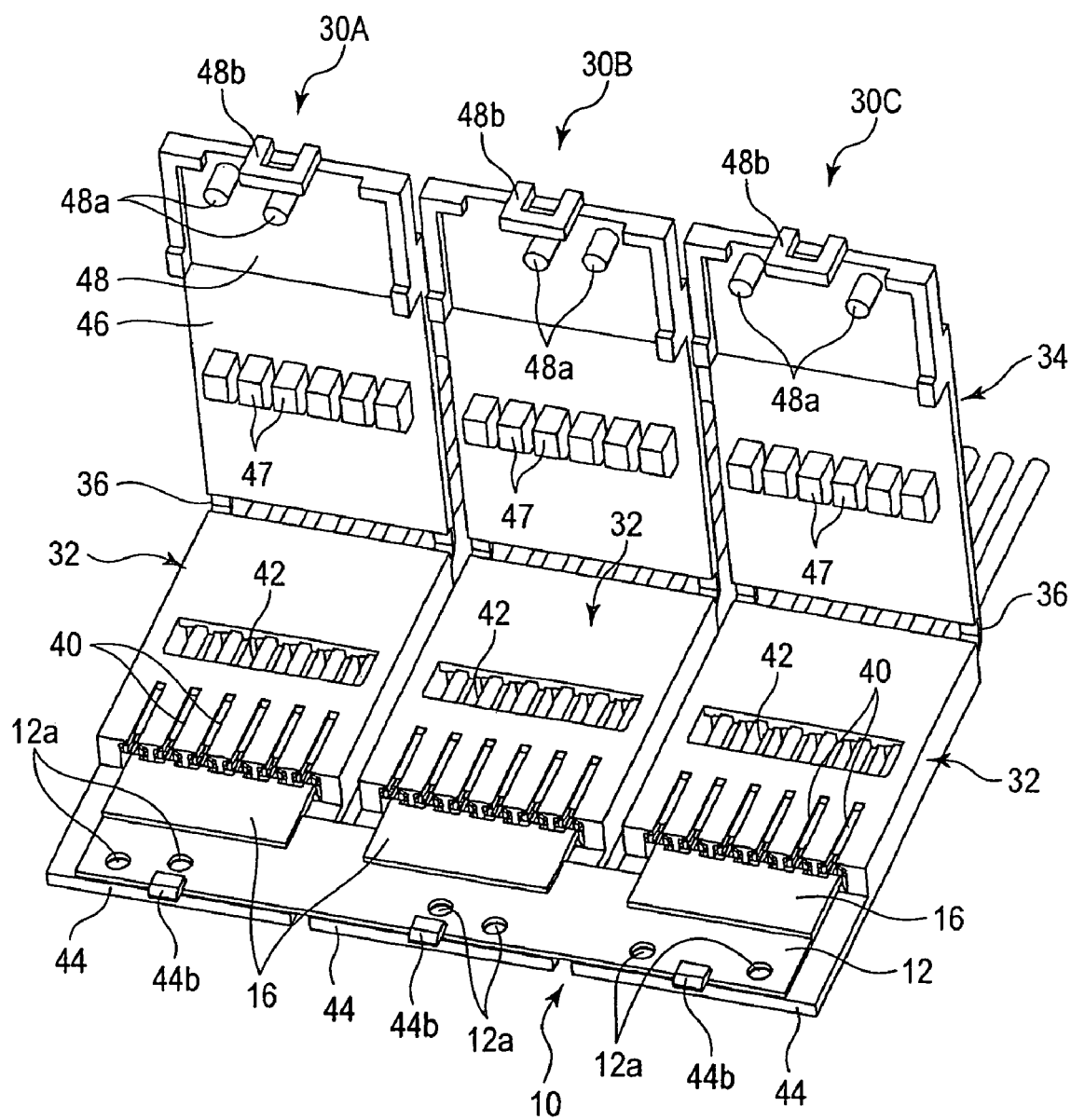
FIG. 7 is a perspective view showing the joint connector in which the position of the wire disposing member holding pins in the used wire-side insulation housing is different from each other.

Further, in place of using the same wire-side insulation housings 30 as shown in FIG. 5, the relative positions between the wire disposing member holding pins 48a in each of the wire-side insulation housings 30A, 30B and 30C to be used and the wire-side terminals to be held by the wire-side insulation housing are made different from each other for each housing as shown in FIG. 7. Thereby, incorrect connection of the joint-side terminal and the wire-side terminal (a joint-side terminal is erroneously connected to a wire-side terminal, which should not be connected therewith) can be reliably prevented.

In the embodiment, the number of wire-side insulation housings 30 to be used is not particularly limited. Also, the wire-side insulation housing 30 may hold a single wire-side terminal. Further, a specified structure for holding the flexible wiring member may be appropriately arranged. For example, in place of the wire disposing member holding pins 48a, by increasing the holding force of the wiring member by the wiring member supporting section 44 and the wiring member cover section 48, the holding function is ensured.

Figure 8:
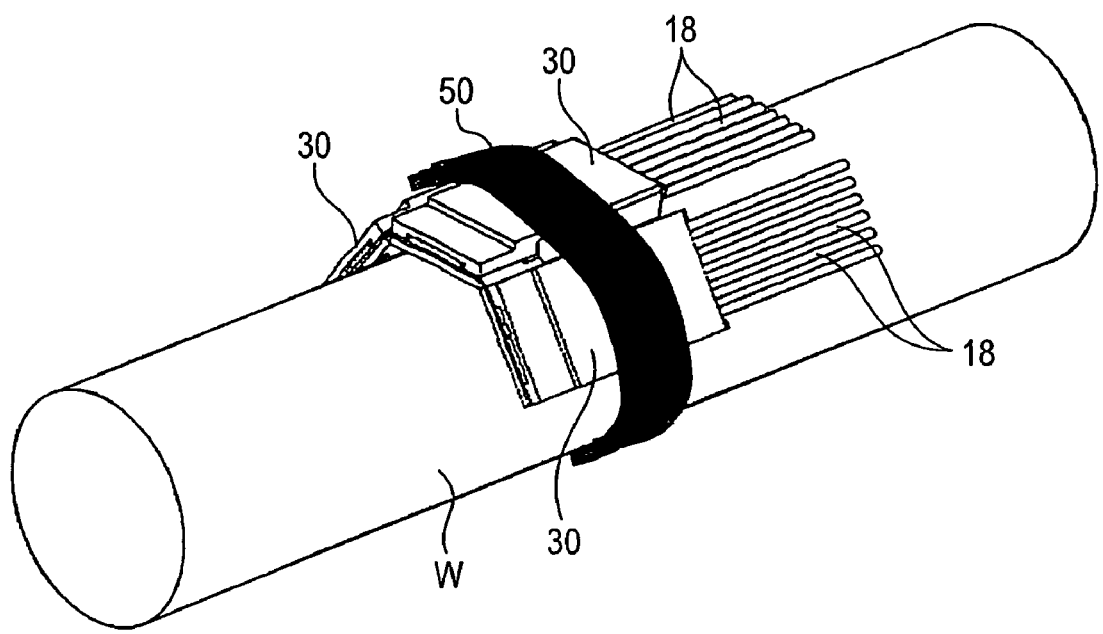
FIG. 8 is a perspective view showing a state where the joint connector shown in FIG. 5

4) Since the joint member 10 is flexibly deformed in the position between the wire-side insulation housings 30, using the flexibility, the entire connector is wound around the main body portion of the wire harness W as shown in FIG. 8. In particular, the entire connector is wound around the main body portion of the wire harness with the longitudinal direction of the joint member 10 oriented in the peripheral direction of the wire harness W, and then fixed by an adhesive tape 50.

Here, the joint member 10 is formed of an extremely thin flexible wiring member; and each of the wire-side insulation housings 30, in which female terminals 20 are held on the same plane, is flat. Accordingly, even when the above are wound around the main body portion of the wire harness W, the protrusion amount thereof is extremely smallowingly, even in a narrow space, the wire harness W can be disposed without problem.

In FIG. 1, an example, in which a flexible printed circuit substrate is used as the flexible wiring member, is shown. However, in the embodiment, other than the above, a thin type wiring member, for example, a combination of a plurality of insulated wires, or the following flexible flat wiring member, may be used.

Figure 9:
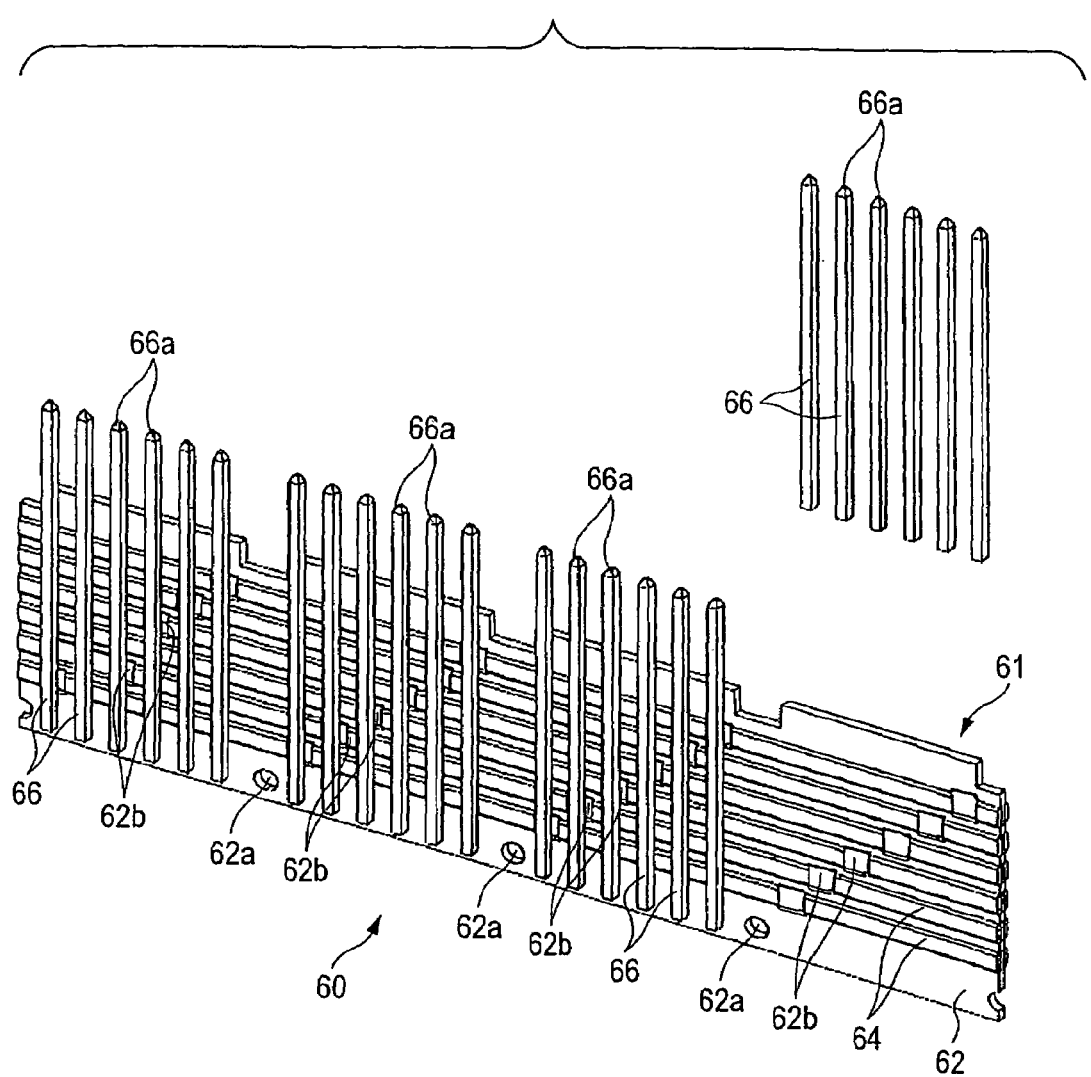
FIG. 9 is a perspective view showing an example of the joint member formed of a flexible flat wiring member.

FIG. 9 shows a joint member 60 formed by using a flexible flat wiring member 61. In the flexible flat wiring member 61, a plurality of flat conductors 64 are arranged on the same plane parallel to each other, and are integrated as a unit by coating with an insulation coating layer 62. In appropriate portions on the insulation coating layer 62, through-holes 62a, with which the wire disposing member holding pins 48a on the wire-side insulation housing 30 shown in FIG. 3 etc., can be fitted, are formed.

On the flexible flat wiring member 61, a plurality of terminal component pins 66 equivalent to the joint-side terminal are arranged in the longitudinal direction thereof in a posture substantially perpendicular to the longitudinal direction of the wiring member, and are connected to appropriate flat conductors 64. In particular, in appropriate portions, both of the front and rear faces of the insulation coating layer 62 are locally removed to form windows (aperture) 62b, and through the windows 62b, the flat conductor 64 is exposed. In a state where the terminal component pins 66 come in contact with the exposed portions, the both are joined by a welding or the like through the windows 62b. The pin front ends 66a of the terminal component pins 66 constituting the terminal fitting portions protrude outward from one edge portion in the width direction of the flexible flat wiring member 61.

When the joint member 60 as described above is used, by appropriately fitting wire-side terminals (female terminals) with pin front ends 66a of the respective terminal component pins 66, the wire-side terminals can be electrically connected via the flat conductor 64. Also, by combining the flat conductor 64 and the terminal component pins 66 to be connected thereto, the connection circuit can be designed freely.

Figure 10:
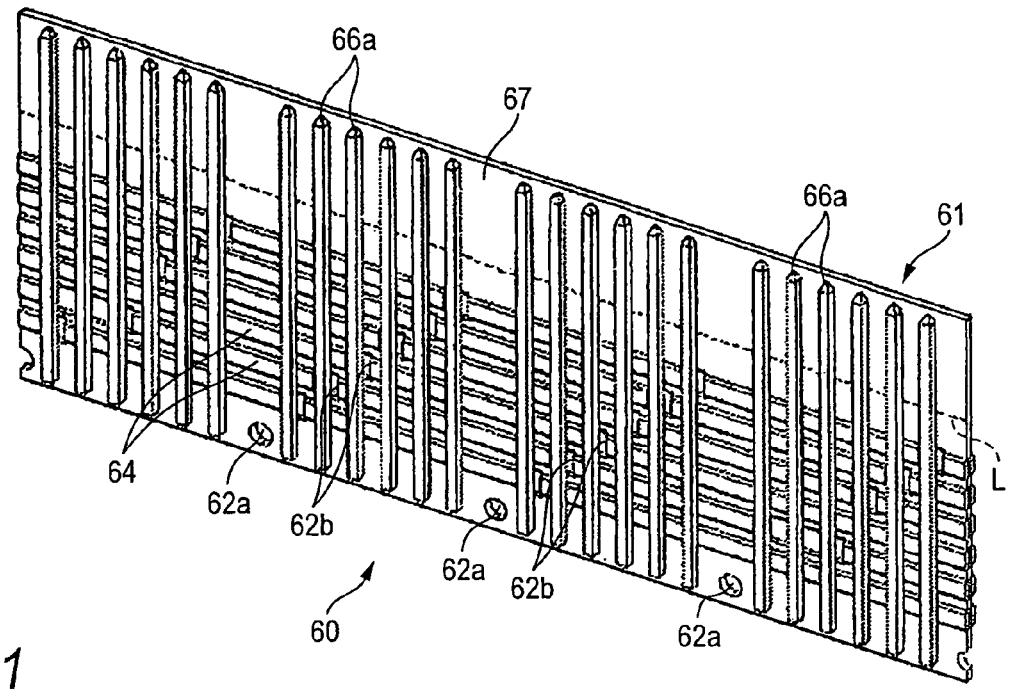
FIG. 10 is a perspective view showing an example of modification in configuration of the flexible flat wiring member.

In the manufacturing of the joint member 60, for example, first of all, as shown in FIG. 10, the insulation coating layer 62 of the flexible flat wiring member 61 is formed in a wider configuration including the pin front ends 66a of the respective terminal component pins 66. Immediately before using, for example, the insulation-coating layer 62 is cut off along the broken line L in the figure to remove portion 67 outside than the broken line L, thus the protrusions of the pin front ends 66a are formed. While handling the joint member 60, it is possible to prevent the pin front ends 66a from coming into contact with fingers or the like further increasing the safety thereof.

Figure 11:
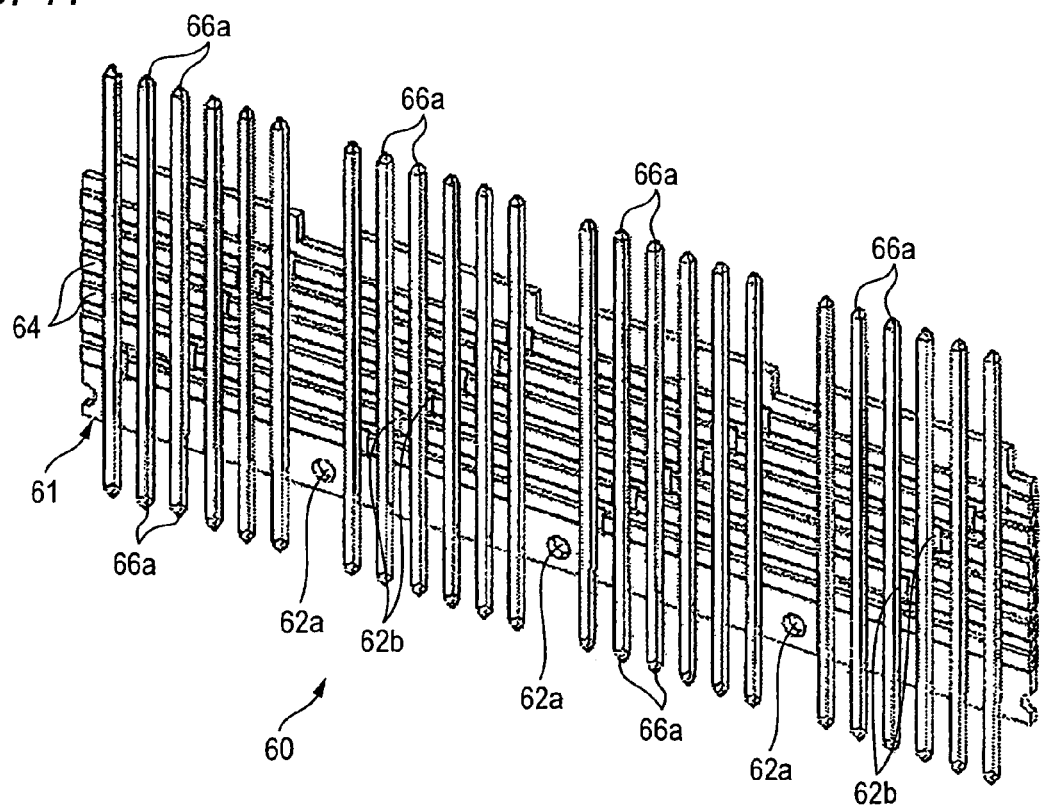
FIG. 11 is a perspective view showing an example of the flexible flat wiring member in which a pin front ends are protruded at both sides thereof in a width direction.

Also, as shown in FIG. 11, by arranging so that both ends 66a of the terminal component pins 66 protrude as the terminal fitting portions from both edge portions in the width direction of the flexible flat wiring member 61, a substantial number of terminals can be largely increased without increasing the number of the terminal component pins 66.

Figure 12:
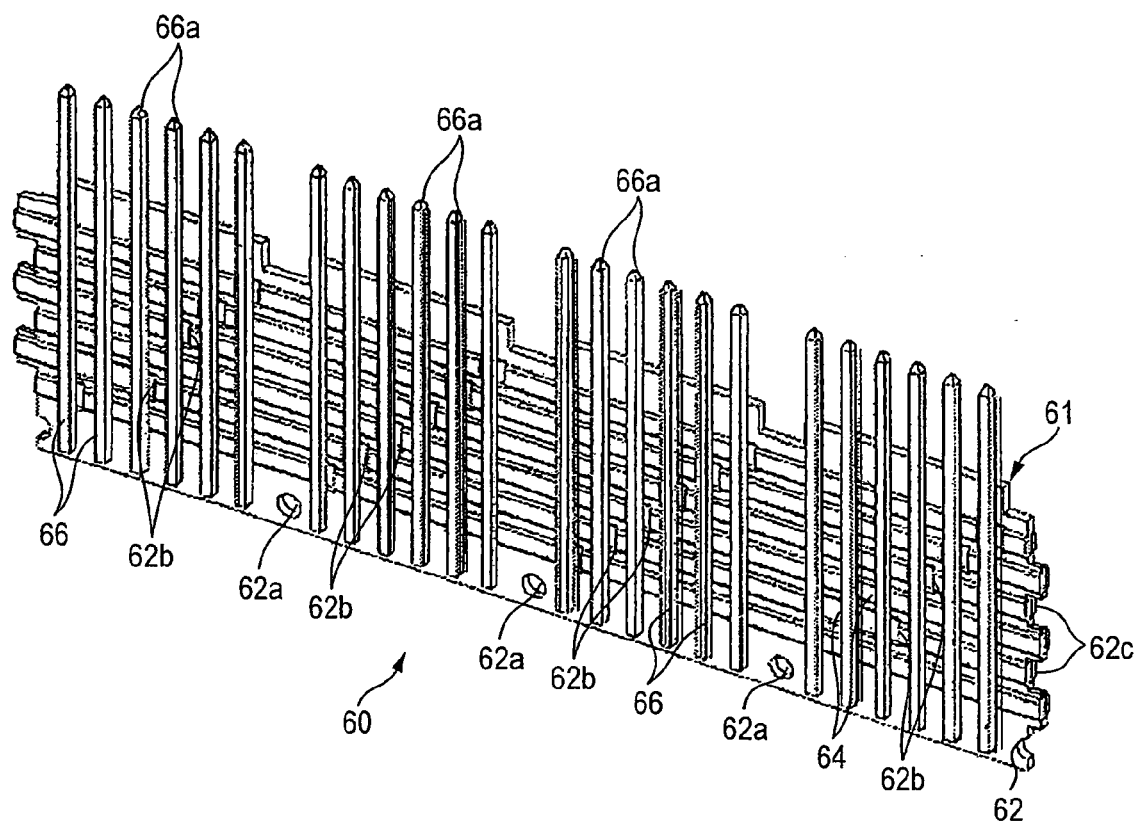
FIG. 12 is a perspective view showing an example in which projections and recesses are formed on the end portions in the longitudinal direction of the flexible flat wiring member.

Further, as shown in FIG. 12, on the end portions in the longitudinal direction of the flexible flat wiring member 61, by forming recessed portions 62c (or projections) between the flat conductors 64 to obtain a longer surface between the flat conductors 64, it is possible to prevent a short-circuit between the flat conductors due to moisture condensation or the like further reliably.

As for the means for forming windows 62b for connecting the terminal component pins in the insulation-coating layer 62, various means are available.

Figure 13:
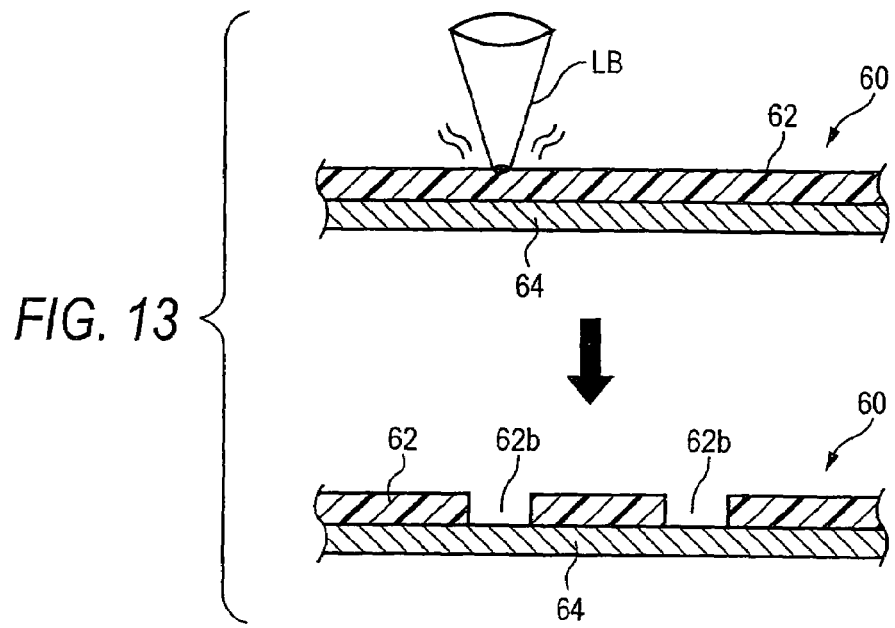
FIG. 13 is a sectional view showing a process in which the insulation coating layer of the flexible flat wiring member is subjected to a laser beam to evaporate the same and expose the conductor.
Figure 14:
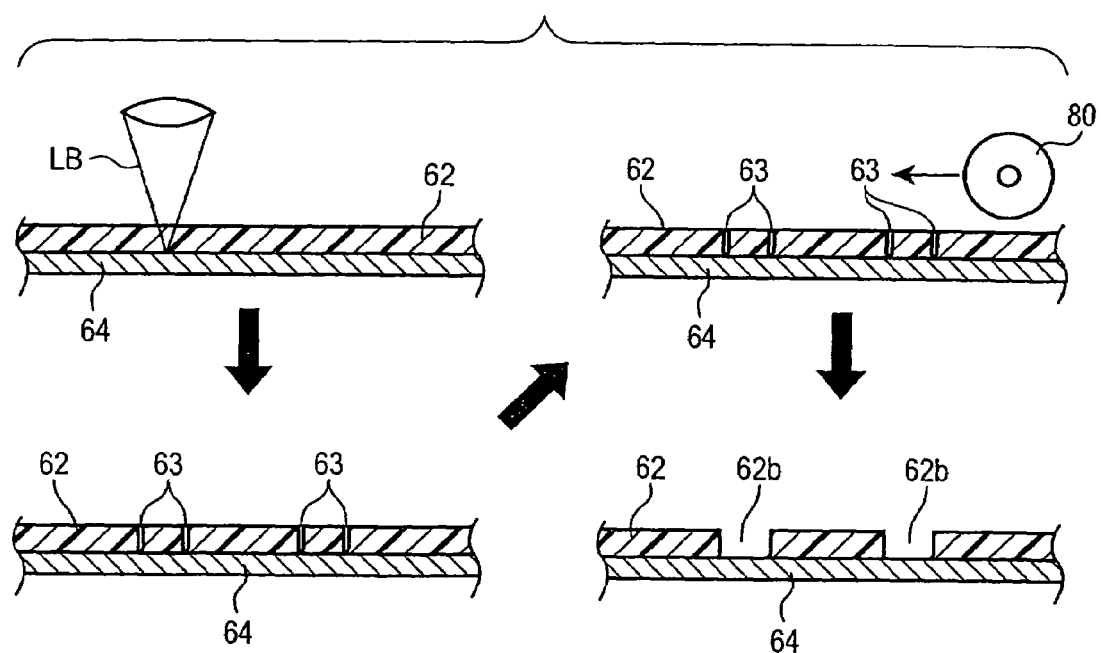
FIG. 14 is a sectional view showing a process in which the insulation coating layer of the flexible flat wiring member is cut with a laser beam and then a specific portion is peeled off with an adhesive roller.

For example, as shown in FIG. 13, the insulation coating layer 62 may be irradiated with a laser beam LB locally to evaporate the insulation coating material in the areas equivalent to windows 62b. Or, as shown in FIG. 14, after forming a pair of cuts 63 in the insulation-coating layer 62 using the laser beam LB, the insulation-coating portion between the cuts 63 may be removed to form the windows 62b. To remove the insulation coating portion, for example, an adhesive roller 80 shown may be rolled on the insulation-coating layer 62; an adhesive tape may be applied to peel off the portion; or a high-pressure air may be used to blow the same.

Here, the type of laser is not particularly limited. $CO_2$ laser, YAG laser or excimer laser may be employed. The advantage in using a laser is that any pattern can be peeled off by controlling the irradiation point, and since it is a non-contact method, intervals of maintenance are long resulting in an easy control.

Figure 15:
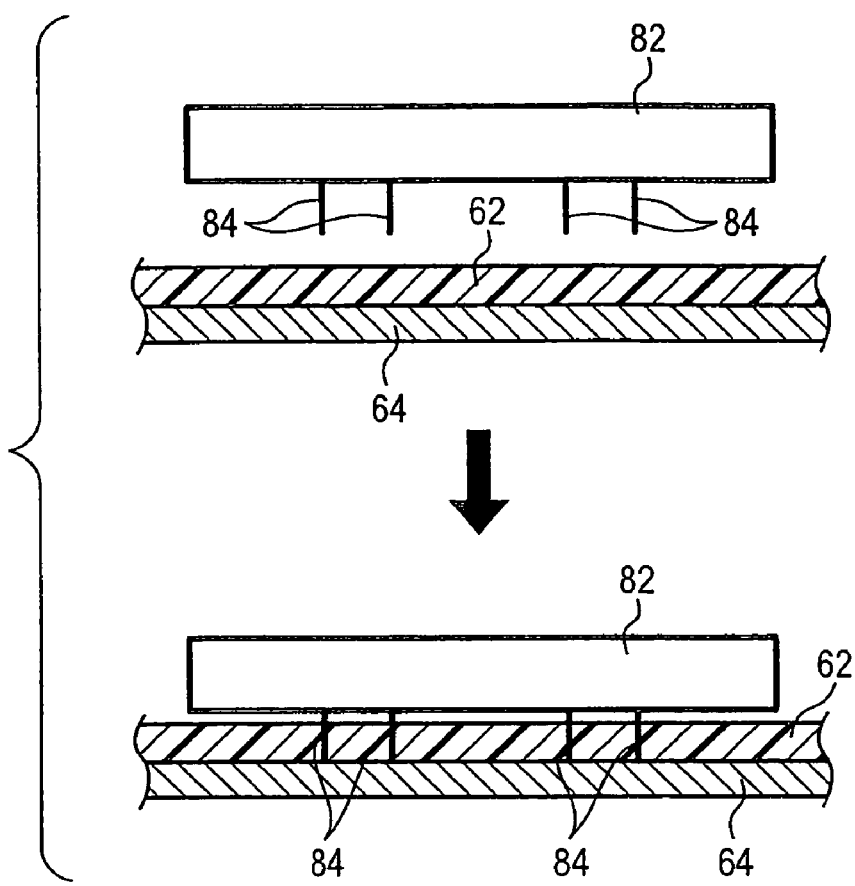
FIG. 15 is sectional view showing an example in which a die having blades is used to form the cut.

Further, as for forming the cut, for example, as show in FIG. 15, the blades 84 of a die 82 is pressed against the insulation coating layer 62 at the position corresponding to the cutting position, thus, the insulation coating layer 62 only may be half-cut.

The above-described cut forming method is capable of removing as a job lot from the portions corresponding to the windows 62b by using the above-mentioned adhesive roller or the like after forming the cuts. Accordingly, the above is superior in productivity. However, if the adhesive agent interposes between the insulation-coating layer 62 and the conductor, it is extremely difficult to remove the insulation coating layer 62. Accordingly, it is preferred to use a non-adhesive method.

Next, a second embodiment of the joint connector having the joint-side insulation housing will be described.

Figure 16:
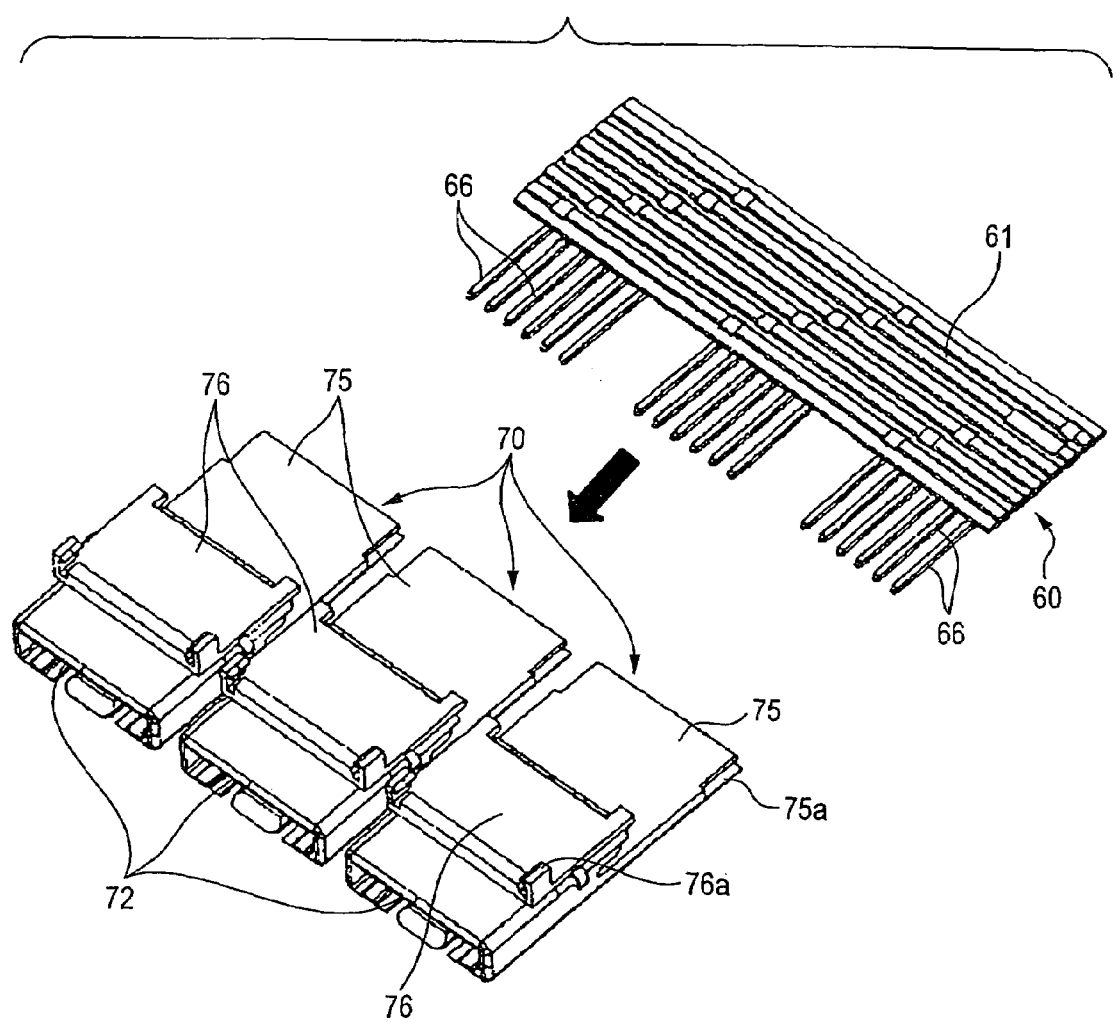
FIG. 16 is a perspective view showing a process in which the respective terminal component pins of the joint member are pressed into predetermined pin press-in holes on a joint-side insulation housing.
Figure 17:
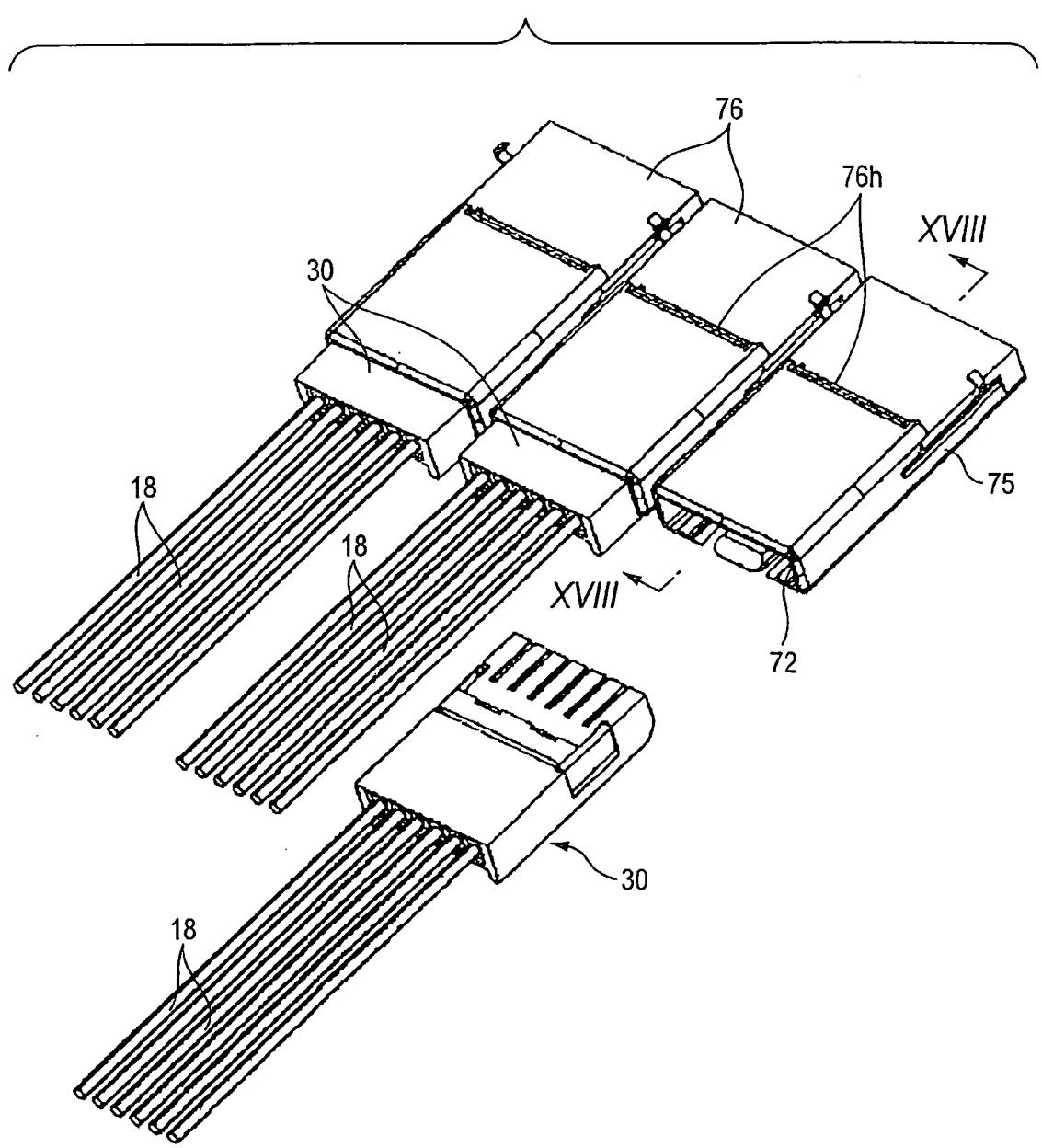
FIG. 17 is a perspective view showing a process in which a joint-side insulation housing is fitted with the wire-side insulation housing.

In FIG. 5, an example, in which the joint-side terminals are directly fitted with the wire-side terminals 20 held by the wire-side insulation housing 30, is shown. Joint connectors shown in FIG. 16 and FIG. 17 are arranged so that a plurality of joint-side insulation housing 70 for holding a plurality of joint-side terminals, which are evenly aligned (in the figures, the terminal component pins 66 of the joint member 60 shown in FIG. 9) are provided, and with these joint-side insulation housings 70, the wire-side insulation housings 30 corresponding to the housings 70 are fitted.

Figure 18:
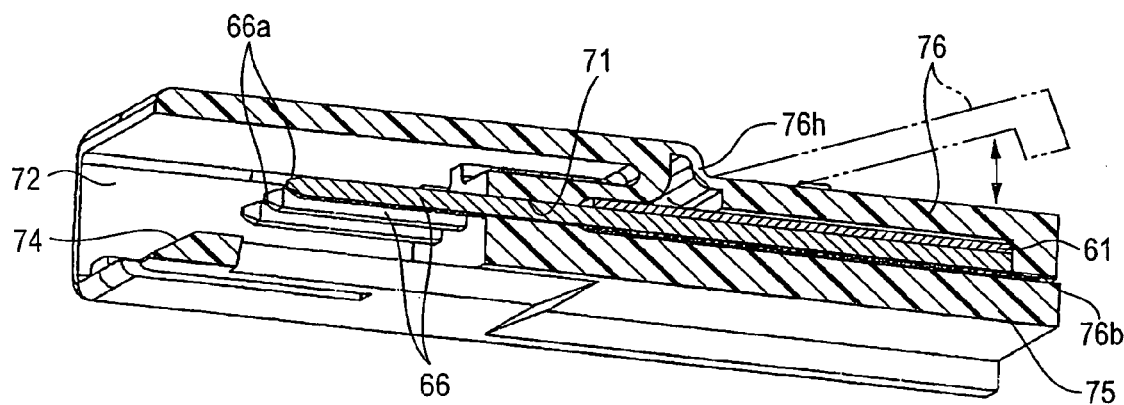
FIG. 18 is a perspective view showing a section taken along an XVIII-XVIII line shown in FIG. 17.

As shown in FIG. 18, each of the joint-side insulation housings 70 is provided so that, in the mid-portion in the axial direction thereof (in the figure, right-left direction), a pin press-in hole 71, which is capable of being pressed-in by the respective terminal component pins 66, is formed, and by pressing-in the pins, the mid-portion in the axial direction of each terminal component pin 66 is held by the joint-side insulation housing 70.

Formed on one end portion of the joint-side insulation housing 70 is a hood 72, which covers the pin front ends 66a protruding from the pin press-in hole 71. And it is provided so that, when the wire-side insulation housing 30 is inserted into the hood 72, the respective wire-side terminals held by the wire-side insulation housing 30 (terminals fixed by the terminals of the wires 18) are fitted with the pin front ends 66a. Also, in an appropriate portion of the hood 72, a housing fitting lock section 74 is formed; and it is provided so that, in a stat that the insulation housings 30 and 70 are fitted with each other, the housing fitting lock section 74 is engaged with the wire-side insulation housing 30; thereby the locked state between the housings is locked.

On the other end portion of the joint-side insulation housing 70, the wiring member holding section for holding the flexible flat wiring member 61 connected to the terminal component pins 66 is formed (another flexible wiring member may be employed). In particular, a wire disposing member supporting plate 75 for supporting the flexible flat wiring member 61 is formed, and above the wire disposing member supporting plate 75, a cover 76 is formed so as to open/close.

The cover 76 is integrally connected with the housing main body portion via the thin hinge section 76h, and is arranged so as to rotate between the open position (indicated by the chain double-dashed line in FIG. 18), where the upper face of the wire disposing member supporting plate 75 is opened and the close position (indicated by a solid line in FIG. 18), where the upper face is covered, with a flexible deformation of the hinge section 76h. Also, on the right and left sides of the rotation end portion of the cover 76, a hook section 76a is formed. On the other hand, on the wire disposing member supporting plate 75, a hooking section 75a, which is capable of engaging with the hook section 76a, is formed, and it is provided so that, in a state where the cover 76 is closed, when the hook section 76a and the hooking section 75a are engaged with each other, the closed state is locked.

Further, on the rotation end portion (rear end portion) of the cover 76, a wiring member restricting wall 76b, which is protruded downward, is formed; and it is provided so that, when the cover 76 is closed, the wiring member restricting wall 76b restricts the flexible flat wiring member 61 from the backside thereof.

According to the joint connector as described above, by carrying out the following steps, the predetermined wires 18 can be electrically connected to each other.

1) In a state where the cover 76 on the joint-side insulation housing 70 is opened, the terminal component pins 66 are pressed into the pin press-in holes 71 from the cover 76 side to protrude the pin front ends 66a within the hood 72. Here, the flexible flat wiring member 61 connected to the respective terminal component pins 66 is placed on the wire disposing member supporting plate 75 on the respective joint-side insulation housing 70.

2) The cover 76 is closed. According to this, the flexible flat wiring member 61 is sandwiched by the cover 76 and the wire disposing member supporting plate 75 from the top and bottom, and is restricted by the wiring member restricting wall 76b from the backside thereof. That is, a state where the flexible flat wiring member 61 is held by the joint-side insulation housing 70 is obtained.

3) The respective joint-side insulation housings 70 are fitted with the corresponding wire-side insulation housings 30. According to this fitting, the terminal component pins 66 held by the joint-side insulation housing 70 are fitted with the wire-side terminals held by the wire-side insulation housing 30. According to this, a state where the predetermined wires 18 are connected to each other via the wire-side terminal, the terminal component pins 66 and the flexible flat wiring member 61 is obtained.

In this configuration also, the entire joint connector can be wound around the wire harness main body portion while deforming the flexible flat wiring member 61 at the positions between the insulation housings 30 as well as the positions between the insulation housings 70. Furthermore, by fitting the insulation housings 30 and 70 with each other, a plurality of wire-side terminals and a plurality of terminal component pins 66 can be fitted with each other at the same time resulting in an increased efficiency in connecting work. And by holding the terminal component pins 66 with joint-side insulation housings 70, it is possible to prevent the terminal component pins 66 from being short-circuited further reliably.

In the above-described embodiments, the joint-side terminals such as terminal component pins 66 are previously connected to a flexible wiring member such as flexible flat wiring member 61 to complete the joint member, and then held by the wire-side insulation housing 30 and joint-side insulation housing 70. However, the present invention is not limited to the above. That is, it may be arranged so that the joint-side terminals such as terminal component pins 66 are previously held by the joint-side insulation housing 70; and in that state, the predetermined conductor of the flexible wiring member is electrically connected to the joint-side terminals.

Figure 19:
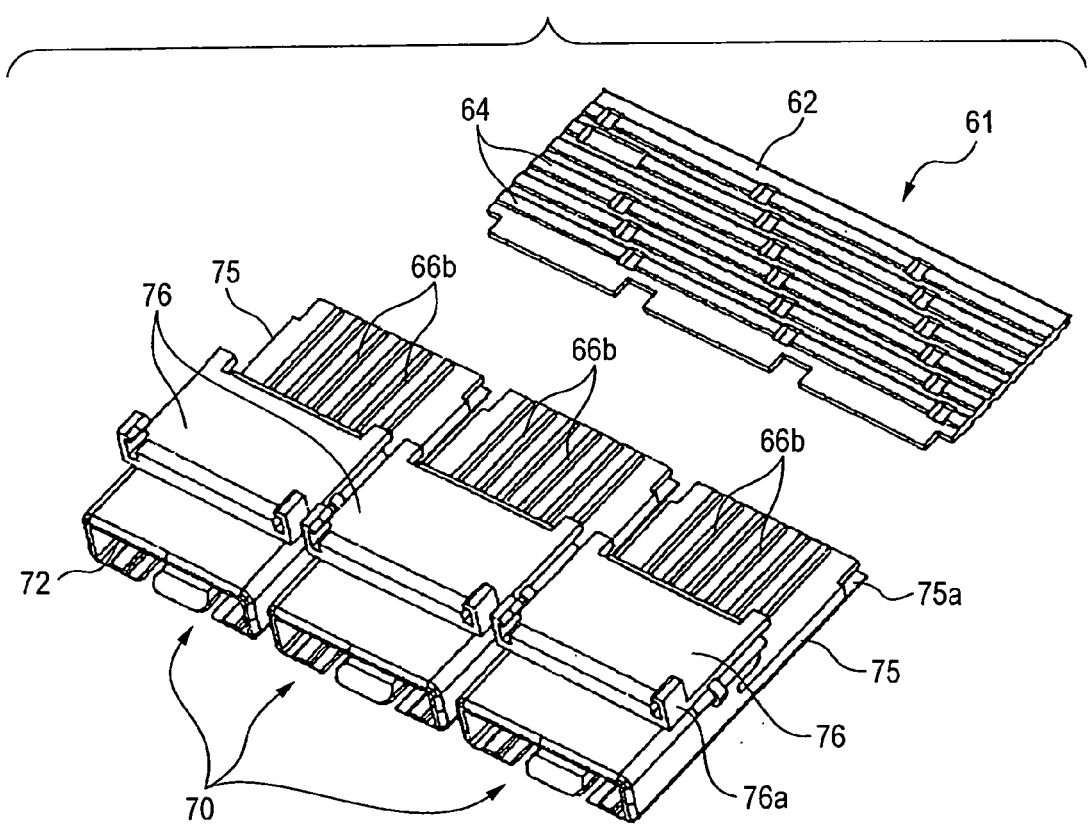
FIG. 19 is a perspective view showing a process in which terminal component pins previously held by the joint-side insulation housing are connected to a common flexible wiring member.
Figure 20:
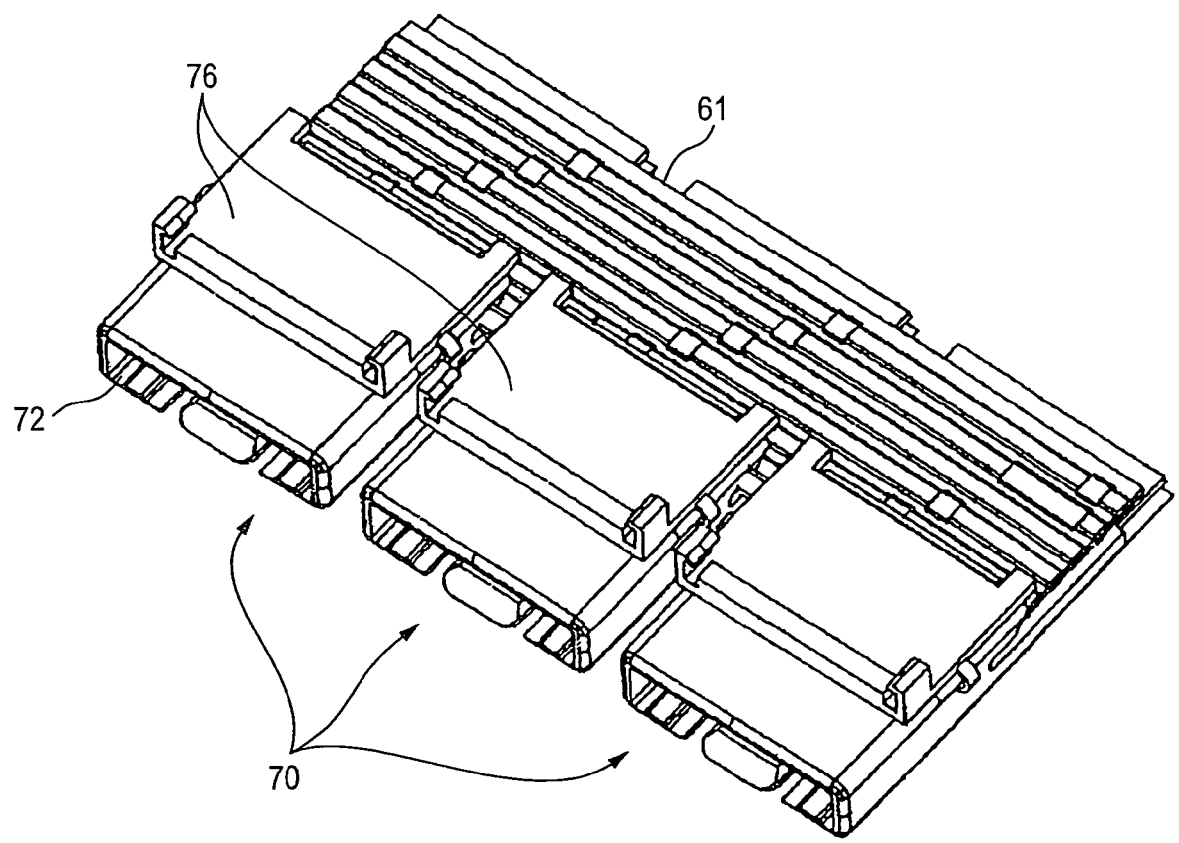
FIG. 20 is a perspective view showing a state where the terminal component pins shown in FIG. 19 has been connected to a common flexible wiring member.

FIG. 19 and FIG. 20 show an example of the above. The joint-side insulation housing 70 shown in the figures has the same structure as that shown in FIGS. 16-18. In each of the pin press-in holes 71, only the terminal component pins 66 are previously pressed in (that is, in a state where the same are not connected to the flexible flat wiring member 61), and pin rear-end portions 66b at the opposite side of the pin front ends 66a of the terminal component pins 66 are arranged horizontally on the wire disposing member supporting plate 75 as the wiring member connecting portion. In a state where the cover 76 is opened as shown in FIG. 19, the pin rear-end portions 66*b* are exposed upward. It is possible that the flexible flat wiring member 61 is placed on the respective pin rear-end portions 66*b* and predetermined flat conductors 64 on the flexible flat wiring member 61 are electrically connected to the pin rear-end portions 66*b* in welding or the like (that is, the joint member 60 shown in FIG. 9 is completed). After the above connection, the cover 76 is closed as shown in FIG. 20. Thereby, the flexible flat wiring member 61 can be held by the joint-side insulation housing 70 and covered thereby.

According to the above arrangement, in a state where a plurality of terminal component pins 66 are previously held by the joint-side insulation housing 70 in a predetermined arrangement, the pin rear-end portions 66*b* of the terminal component pins 66 are electrically connected to the flexible flat wiring member 61. Accordingly, such an advantage that the connecting work is carried out effectively is obtained.

Figure 21:
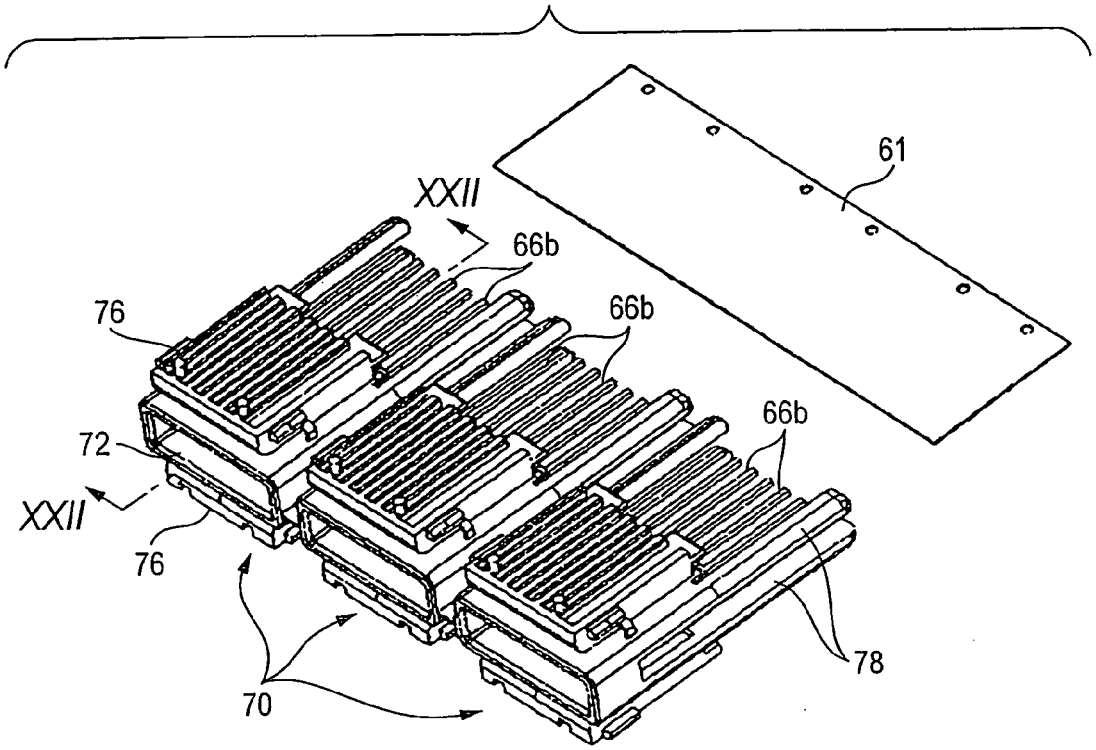
FIG. 21 is a perspective view showing an example in which a cover, of the joint-side insulation housing which previously holds the joint-side terminals, is arranged to a double-open structure.
Figure 22:
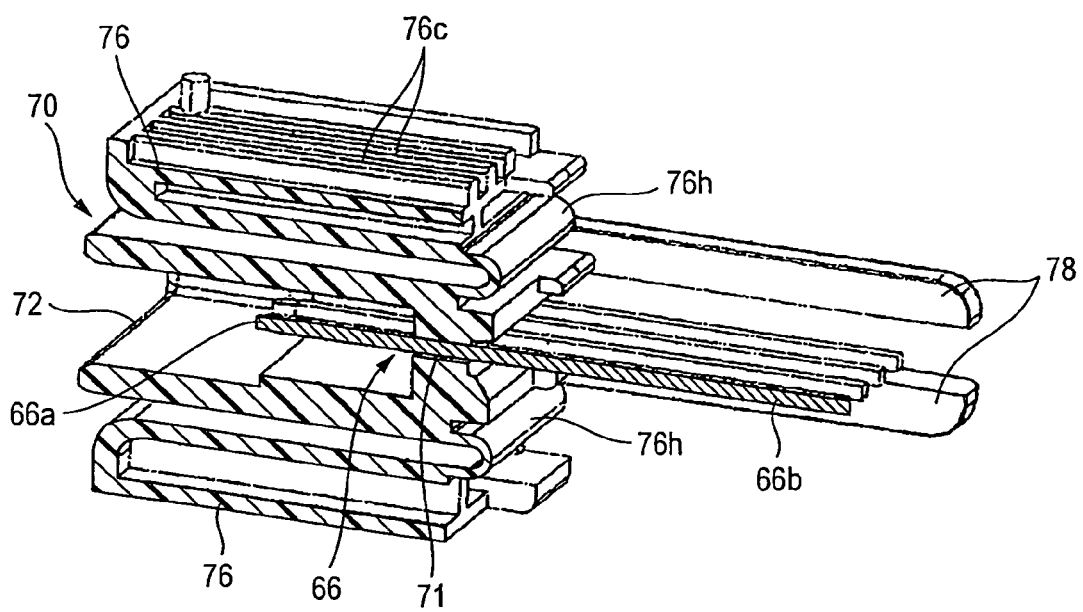
FIG. 22 is a perspective view showing a section taken along a XXII-XXII line shown in FIG. 21.
Figure 23:
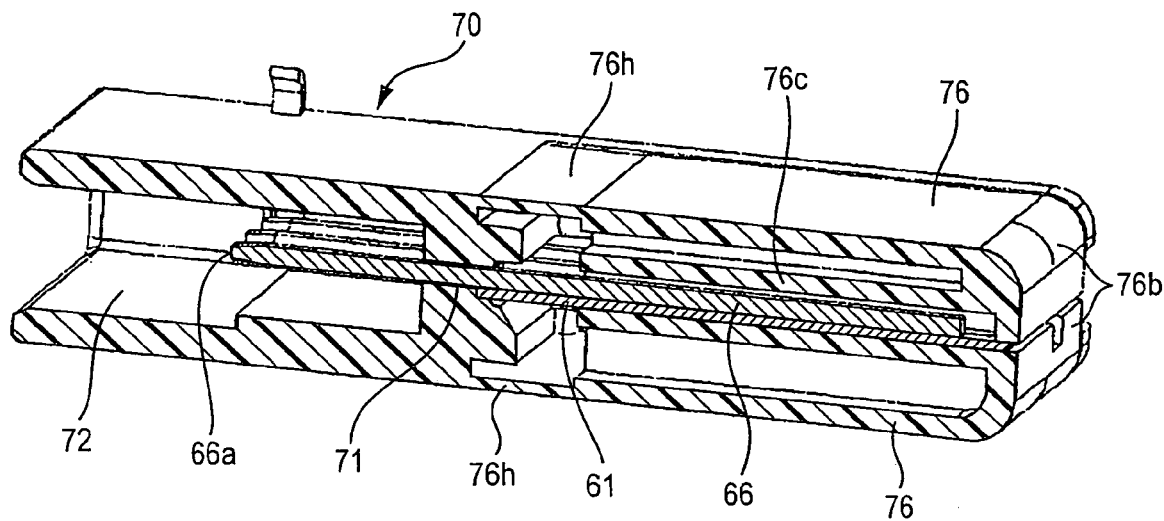
FIG. 23 is a sectional perspective view corresponding to the FIG. 22 showing a state where the both covers are closed.

Further, by eliminating the wire disposing member supporting plate 75 and disposing covers 76 on the top and the bottom as shown in FIGS. 21-23 (that is, double-open); thus, in the open state thereof, the degree of exposure of the pin rear-end portions 66*b* can be further increased. In this case, for example, as shown in the figures, a pair of wiring member sandwiching pieces 78 (upper/lower) is formed extending from the right and left side portions of the main body of the joint-side insulation housing 70, and between these wiring member sandwiching pieces 78, the flexible flat wiring member 61 is inserted to hold the wiring member 61. Thereby, the connecting work of the wiring member 61 and the respective pin rear-end portions 66*b* can be made further readily.

Further, as shown in the figures, by arranging so that a terminal partitioning wall 76*c*, which interposes between the pin rear-end portions 66*b*, extends to the rear face of the upper cover 76, it is possible to prevent the short-circuit between the terminal component pins 66 more reliably.

Figure 24:
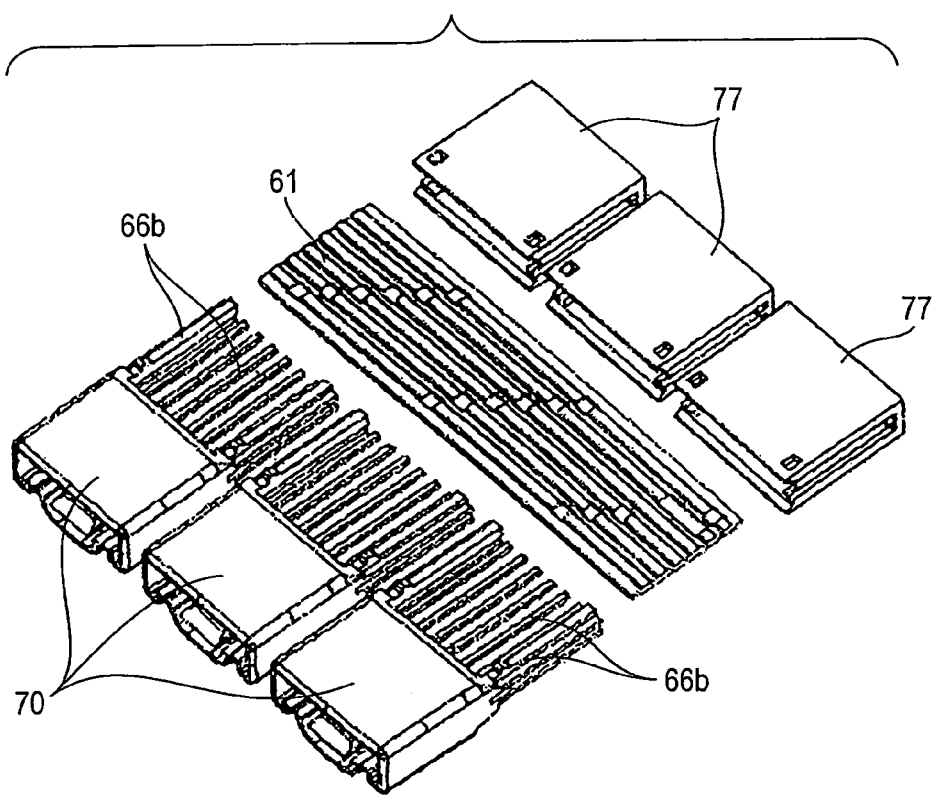
FIG. 24 is an exploded perspective view showing the joint connector of which the main body of the joint-side insulation housing is attached with a cap for covering the flexible wiring member.
Figure 25:
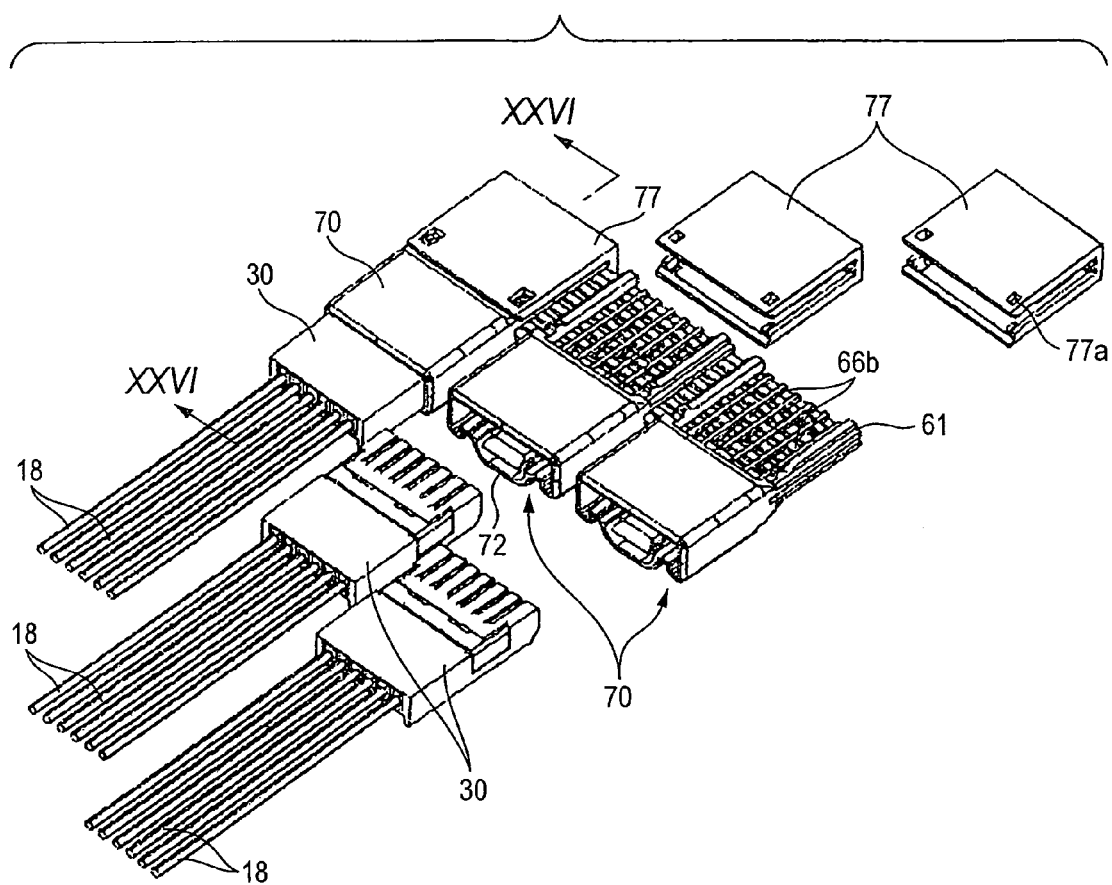
FIG. 25 is a perspective view showing a process to mount the cap.
Figure 26:
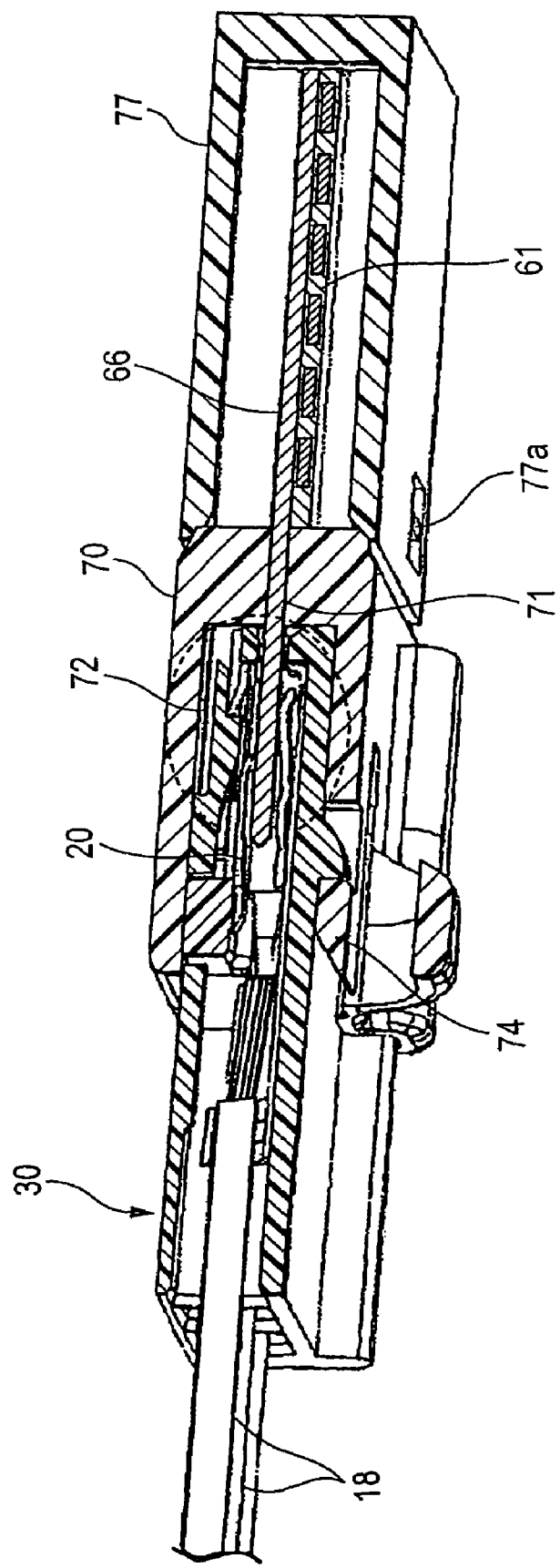
FIG. 26 is a perspective view showing a section taken along a XXVI-XXVI line shown in FIG. 25.
Figure 27:
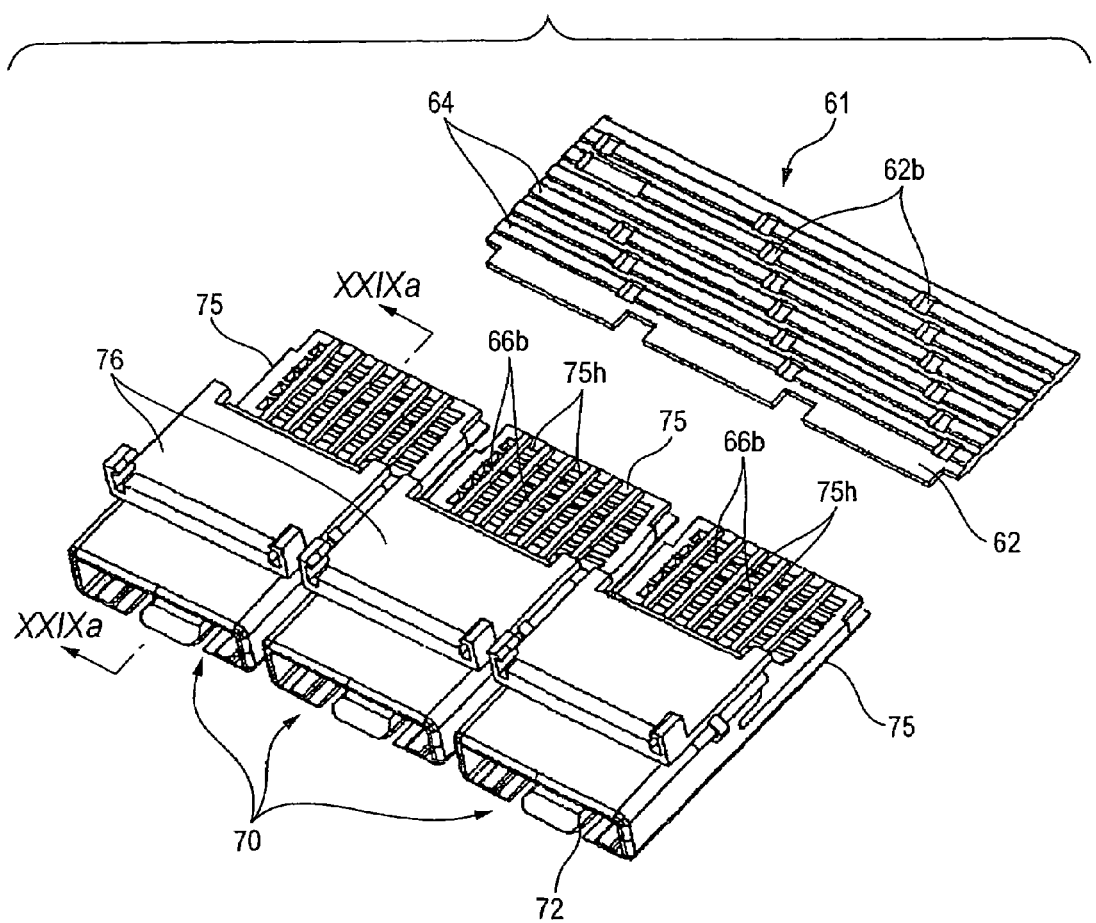
FIG. 27 is a perspective view showing a joint connector in which through-holes for welding are formed in the wire disposing member supporting plate in the joint-side insulation housing.
Figure 28:
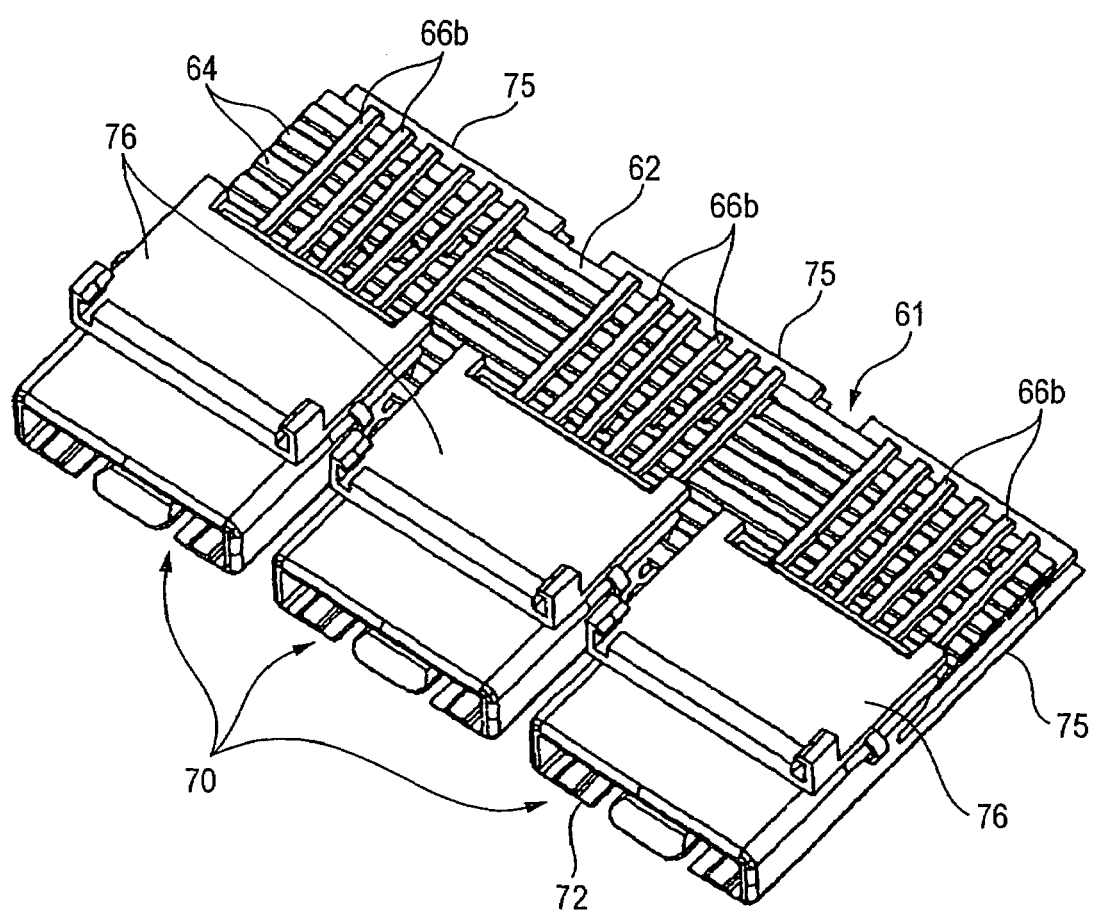
FIG. 28 is a perspective view showing a state where, in the joint connector shown in FIG. 27, each of the terminal component pins are connected to the common flexible flat wiring member.
Figure 29A:
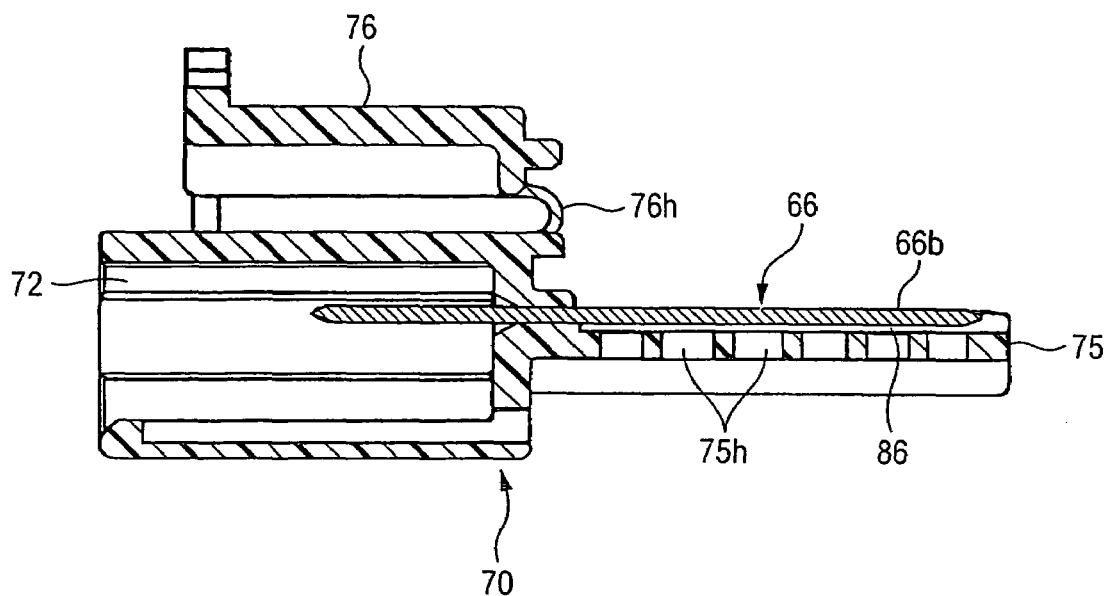
FIG. 29A is a sectional view taken along a XXIXa-XXIXa line shown in FIG. 27.
Figure 29B:
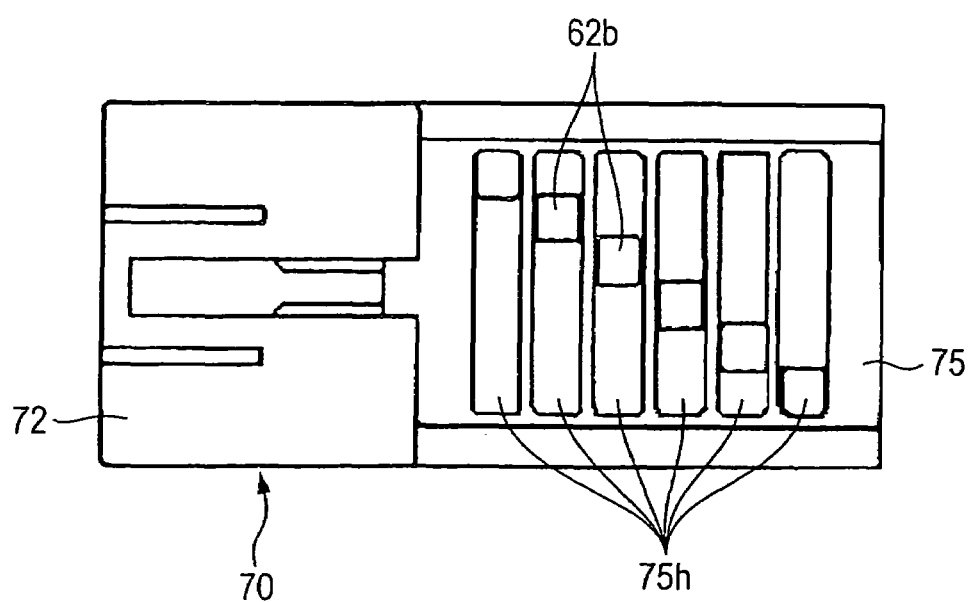
FIG. 29B is a bottom view of the joint-side insulation housing shown in FIG. 29A.

In the joint-side insulation housing 70, concretely open/close structure of the wiring member holding section is not limited to the above-describe rotatable type. For example, a detachable structure shown in FIG. 24-FIG. 26 may be employed. In the figures, in place of the wire disposing member supporting plate 75 and the cover 76 shown in FIG. 16 and FIG. 17, flat caps 77 are provided detachably to the rear end of the main body portion of the joint-side insulation housing 70. In a state where the caps 77 are removed, pin rear-end portions 66*b* of the respective terminal component pins 66 are exposed to the outside so as to be electrically connected to the flexible flat wiring member 61. It is provided so that, after that connection, by attaching the cap 77 to the rear end of the housing main body, the flexible flat wiring member 61 is restricted from the rear end thereof by the cap 77 as well as covered thereby (FIG. 26).

Further, in an appropriate portion of the caps 77, hooking hole 77*a* is formed. When a projection (not shown) at the housing main body is engaged, the mounted state of the cap 77 is locked.

In the embodiment, when a wiring member supporting section is formed, various arrangements for facilitating the connecting work of the flexible wiring member and the joint-side terminals, which are supported by the wiring member supporting section, are possible.

For example, in the joint connector, in which the joint-side insulation housing 70 has the wire disposing member supporting plate 75 as shown in FIG. 19 and FIG. 20, a through-hole for welding 75*h*, which goes through in the direction of the plate (vertical direction in the figures) is formed in the position corresponding to the respective conductor 64 of the flexible flat wiring member 61 in the wire disposing member supporting plate 75, as shown in FIG. 27-FIG. 29B. When it is provided so that the disposing position of the conductors 64 on the flexible flat wiring member 61, which is inserted in the space 86 between the wire disposing member supporting plate 75 and each pin rear-end portions 66*b*, is exposed downward also through the through-hole for welding 75*h*, by inserting welding electrodes from the bottom of the through-hole for welding 75*h*, in a state where the flexible flat wiring member 61 is supported on the wire disposing member supporting plate 75, it is to sandwich the specified conductor portion and the pin rear-end portions 66*b* overlapped therewith a pair of electrodes from the top and bottom thereof. By applying a voltage between the electrodes, the pin rear-end portion 66*b* and the predetermined conductor 64 of the flexible flat wiring member 61 can be welded.

Further, as a means for eliminating the above-described welding or soldering work, it may be arranged so that the conductor 64 of the flexible flat wiring member 61, which is supported by the wiring member supporting section, comes into contact with the corresponding terminal component pins 66.

Figure 30:
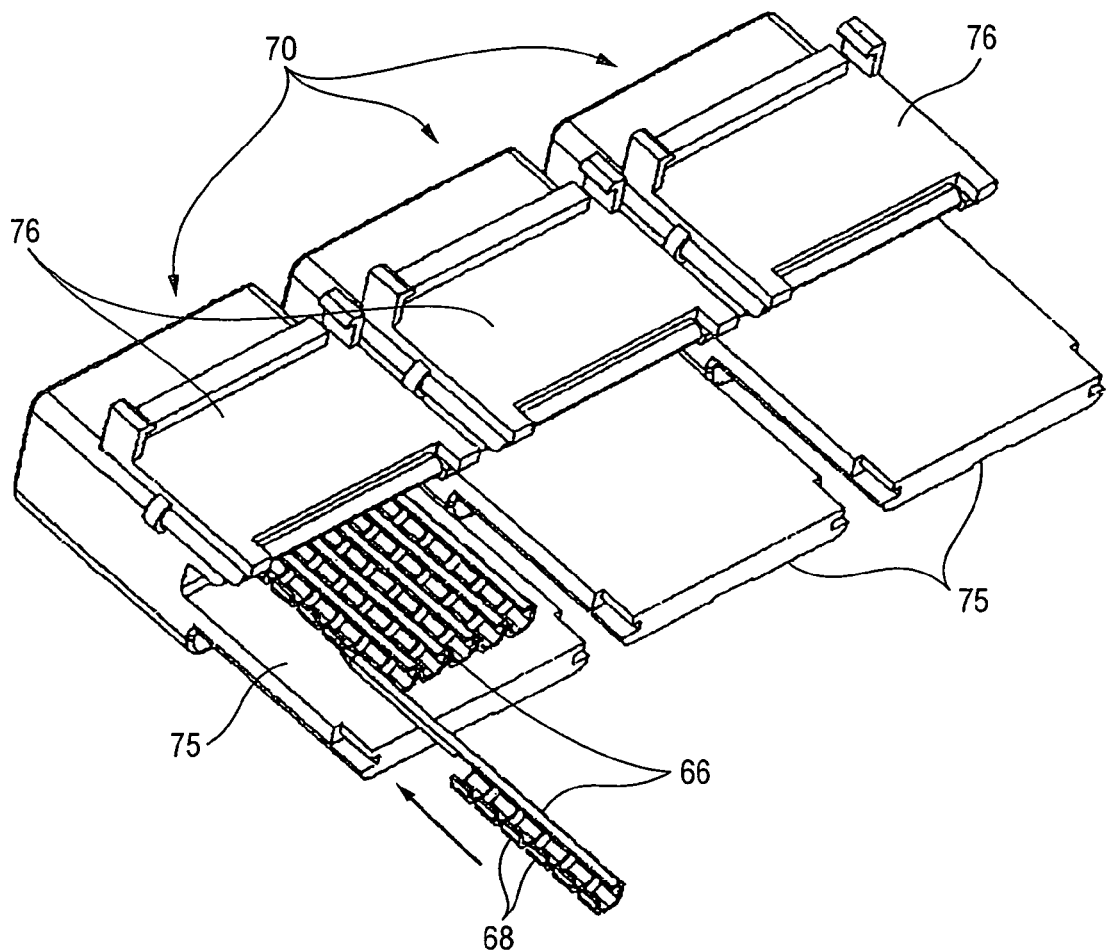
FIG. 30 is a perspective view showing a process in which, in the joint connector equipped with terminal component pins having a spring contact piece, the terminal component pins are pressed into the pin press-in holes on the joint-side insulation housing.
Figure 31:
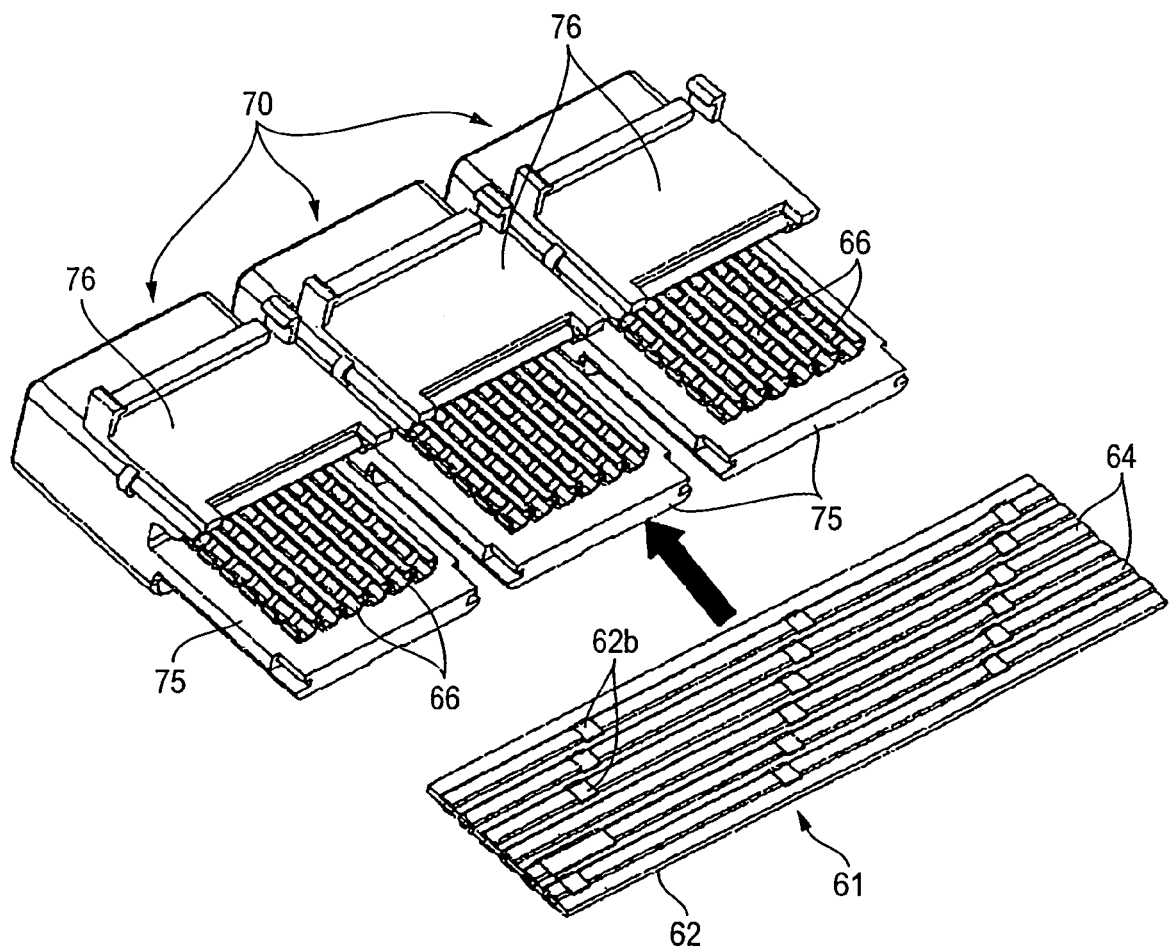
FIG. 31 is a perspective view showing a process in which, in the joint connectors shown in FIG. 30, the flexible flat wiring member is inserted between each of the spring contact pieces and the wire disposing member supporting plate.
Figure 32:
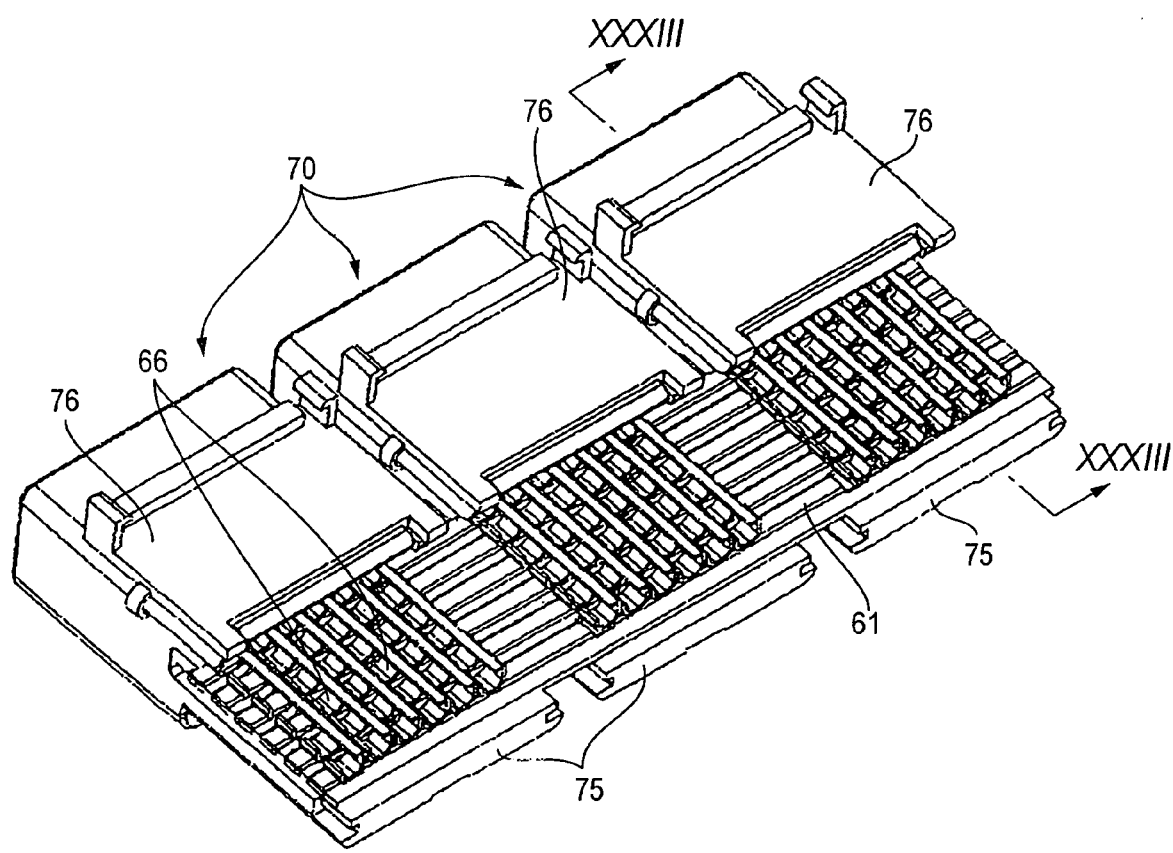
FIG. 32 is a perspective view showing a state in which, in the joint connectors shown in FIG. 30, the flexible flat wiring member has been inserted between each of the spring contact pieces and the wire disposing member supporting plate.
Figure 33:
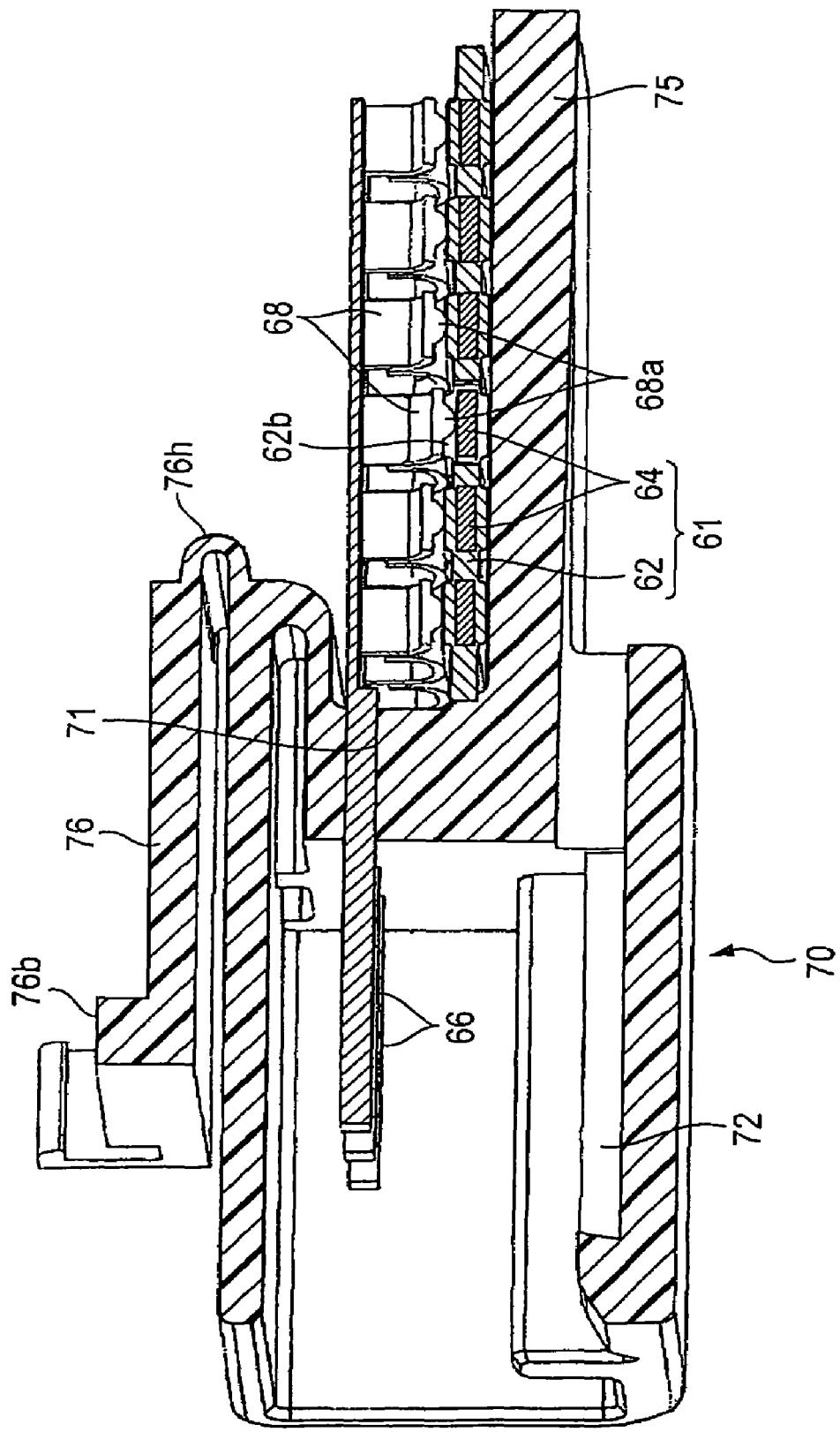
FIG. 33 is a perspective view showing a section taken along a XXXIII-XXXIII line shown in FIG. 32.

A preferred example of the above is shown in FIGS. 30-32. In the rear portion of the terminal component pins 60 (a portion exposed on the wire disposing member supporting plate 75), a plurality of spring contact pieces 68, which are aligned in the axial direction, are formed. The spring contact pieces 68 extend downward from the main body portion of the terminal component pins 60 and have a configuration such that the same warp upward in intermediate portion thereof. From the warped surface; i.e., the bottom face thereof, a contact projection 68*a* protrudes downward. It is provided so that, when a flexible flat wiring member 61 is inserted between the spring contact pieces 68 and the wire disposing member supporting plate 75, which is positioned immediately below the same, in a state where the respective spring contact pieces 68 are warped upward (flexible deformation), the contact projections 68*a* flexibly come into contact with the upper face of the flexible flat wiring member 61; and further, it is provided so that, at the portions where the windows 62*b* are formed in the insulation coating layer 62 to expose the conductor 64 in the flexible flat wiring member 61, the contact projections 68*a* flexibly come into contact with the conductor 64 through the windows 62*b*; thereby, the terminal component pins 66 having contact projections 68*a* are electrically connected to the conductor 64.

According to the above arrangement, the terminal component pins 66 and the flexible flat wiring member 61 can be electrically connected to each other without carrying out welding or the like. Further, as shown in the figures, by forming the same number of spring contact pieces 68 as that of the entire terminal component pins 66 thereon, and by forming the terminal component pins 66 into a common configuration, and by setting the contact points to the positions of the windows 62*b* on the flexible flat wiring member 61, mass production of the terminal component pins 66 is possible resulting in a reduction in cost.

Furthermore, by using a press-connection blade, the joint-side terminals and the flexible wiring member can be connected to each other.

Figure 34:
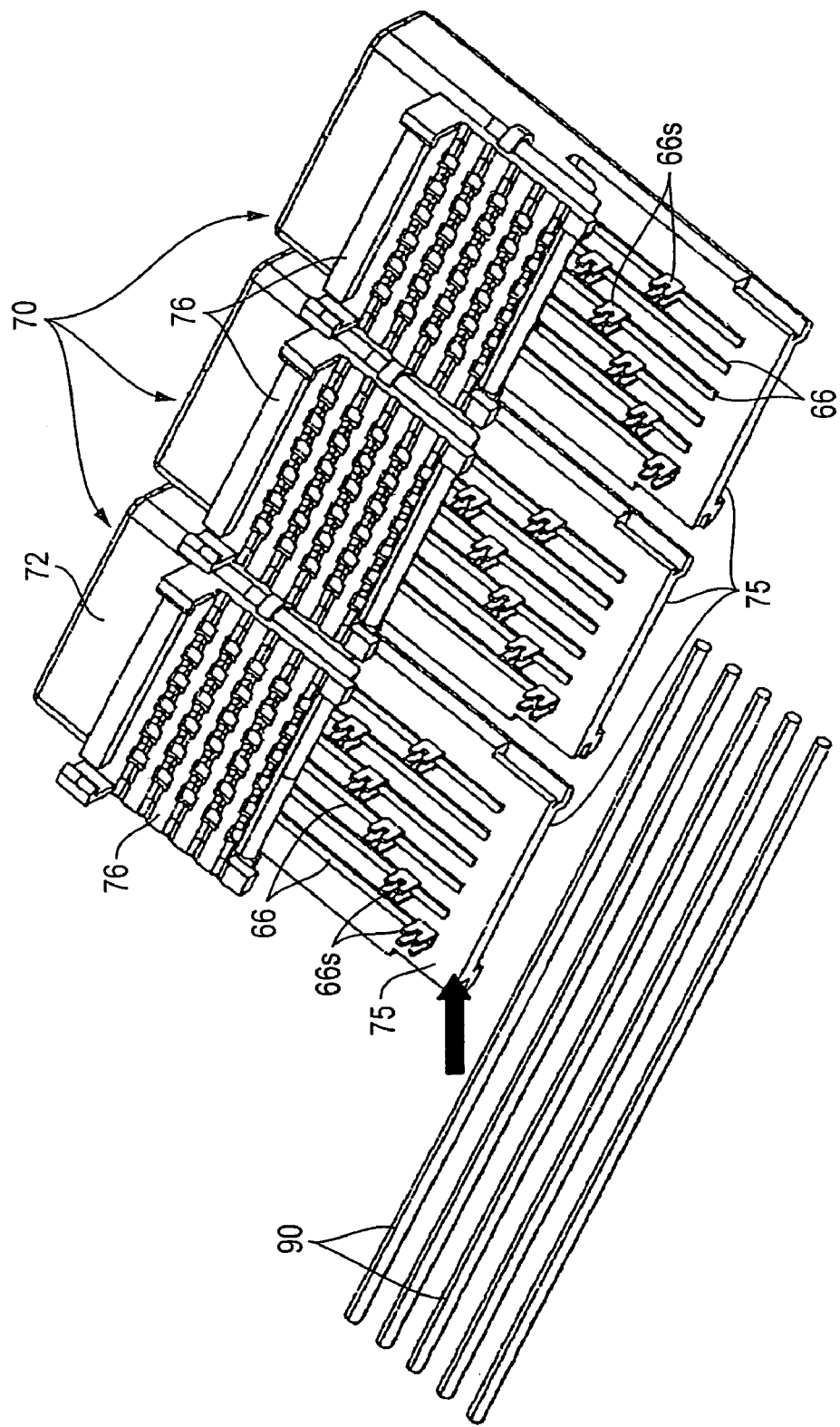
FIG. 34 is a perspective view showing a state, in the joint connector equipped with terminal component pins having a press-connection blade, before insulated wires constituting flexible wiring members are pressed to connect to the press-connection blades.
Figure 35:
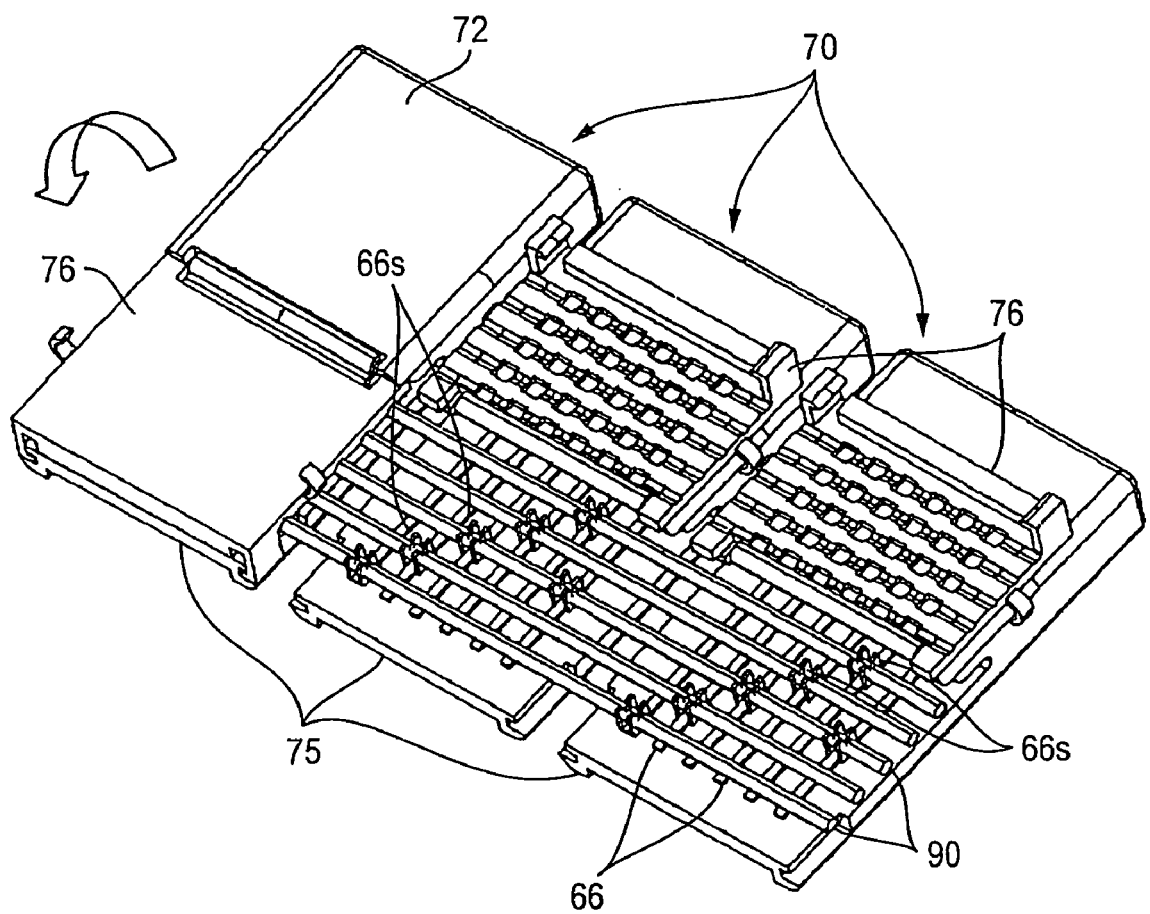
FIG. 35 is a perspective view showing a state where, in the joint connector shown in FIG. 34, the insulated wires are connected to each of the press-connection blades.

An example of the above is shown in FIG. 34 and FIG. 35. In the rear portion of the respective terminal component pins 60 constituting the joint-side terminals (a portion exposed on the wire disposing member supporting plate 75), press-connection blades 66*s* are formed while shifting the position thereof in the axial direction. Each of the press-connection blades 66s have a bifurcated configuration and have a blade therebetween protruding upward from the main body portion of the terminal component pin 60. It is provided so that, after setting the insulated wire 90 constituting the flexible wiring member on the respective press-connection blades 66s from the top, by pressing the same downward, the press-connection blades 66s cut into the insulation coating layer of the insulated wire 90 and come into contact with the conductor therein; thereby the conductor and the terminal component pins 66 having the press-connection blades 66s are electrically connected.

In this embodiment, according to the plurality of insulated wires 90 aligned in a specific direction, a flexible wiring member, which is capable of deforming while deforming in the direction perpendicular to the deforming direction thereof is formed. The flexible wiring member can be wound, the same as the above-described embodiments on the wire harness main body portion.

The above-described plurality of joint-side insulation housings 70 are arranged with a space in the direction parallel to the arrangement direction of the terminal component pins 66 held by the housings 70 and each of the housings 70 is independent from each other. According to the warp-deformation of the flexible wiring member in the area between the joint-side insulation housings 70, the winding on the wire harness main body portion is achieved. However, when the joint-side insulation housings 70 are in a state where each of them is allowed to displace its position freely relative to each other, the relative displacement gives a load to the flexible wiring member in the shearing direction.

Figure 36A:
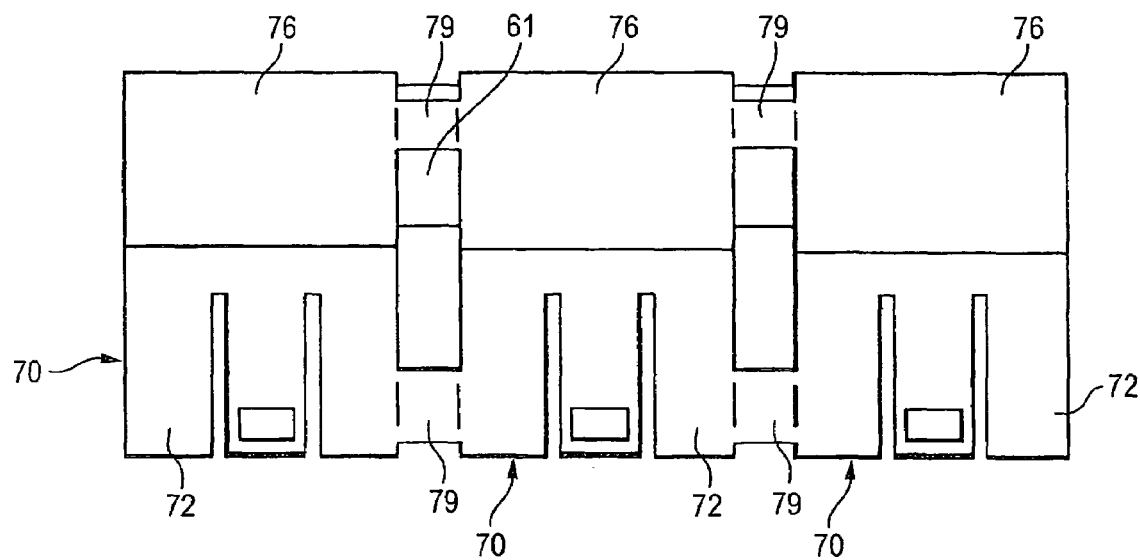
FIG. 36A is a plane view showing the joint connectors in which the neighboring joint-side insulation housings are connected via a flexible contact section.
Figure 36B:
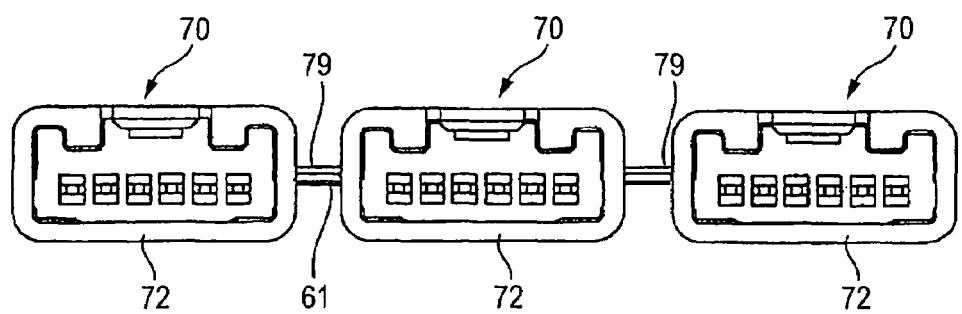
FIG. 36B is a front view thereof.

As a means for reducing the above shearing load, a structure shown in FIGS. 36A and 36B is effective. In the figures, the hood 72 of the neighboring joint-side insulation housings 70 and the covers 76 are connected to each other via the thin flexible connecting sections 79. The respective flexible connecting sections 79 are capable of flexible deforming in the same direction as the flexible deformation of the flexible flat wiring member 61, which are held by the respective joint-side insulation housings 70. In the figures, three joint-side insulation housings 70 and the flexible connecting sections 79, which connect them to each other, are formed integrally using a resin material.

According to the structure as described above, since the housings are connected to each other via the flexible connecting sections 79, the relative displacement between the housings is reduced. Accordingly, the maximum value of the load acting on the flexible flat wiring member 61 (or other flexible wiring member) is largely reduced. Further, the respective flexible connecting sections 79 are capable of deforming flexibly in the same direction as the flexible deformation of the flexible flat wiring member 61 in the area between the housings 70. Accordingly, the flexible connecting sections 79 can be wound around the wire harness main body portion without problem in the sane manner as that of one which has no flexible connecting sections 79.

Further, in the present invention, various arrangements are possible to obtain advantageous effects in the state after being wound.

Figure 37:
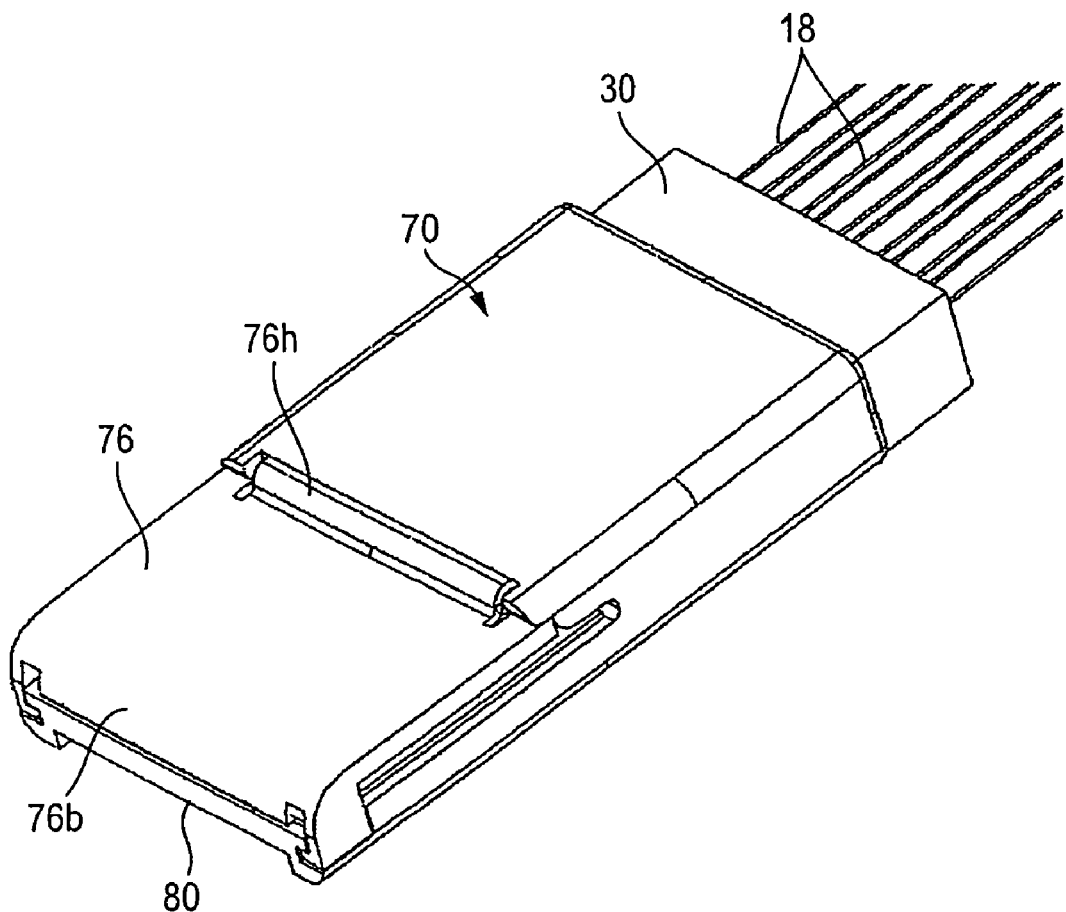
FIG. 37 is a perspective view showing an example in which the edge of the joint-side insulation housing is rounded.

For example, as the joint-side insulation housing 70 shown in FIG. 37, the edge at the boundary between the main body portion of the cover 76 and the wiring member restricting wall 76b at the rear side thereof is formed into a smoothly curved face. In a state where the housing 70 is wound around the wire harness main body portion, such problem that the edge interferes with something during handling the wire harness is prevented.

In the case where the joint connector is wound so that the housings 30 are aligned along the peripheral direction of the wire harness main body portion as shown in FIG. 8, the number of the wound housings 30 is limited depending on the peripheral length of the wire harness main body portion. When the joint connector is wound around the wire harness main body portion in a spiral configuration, a plurality of housings can be wound irrespective of the peripheral length.

Figure 38:
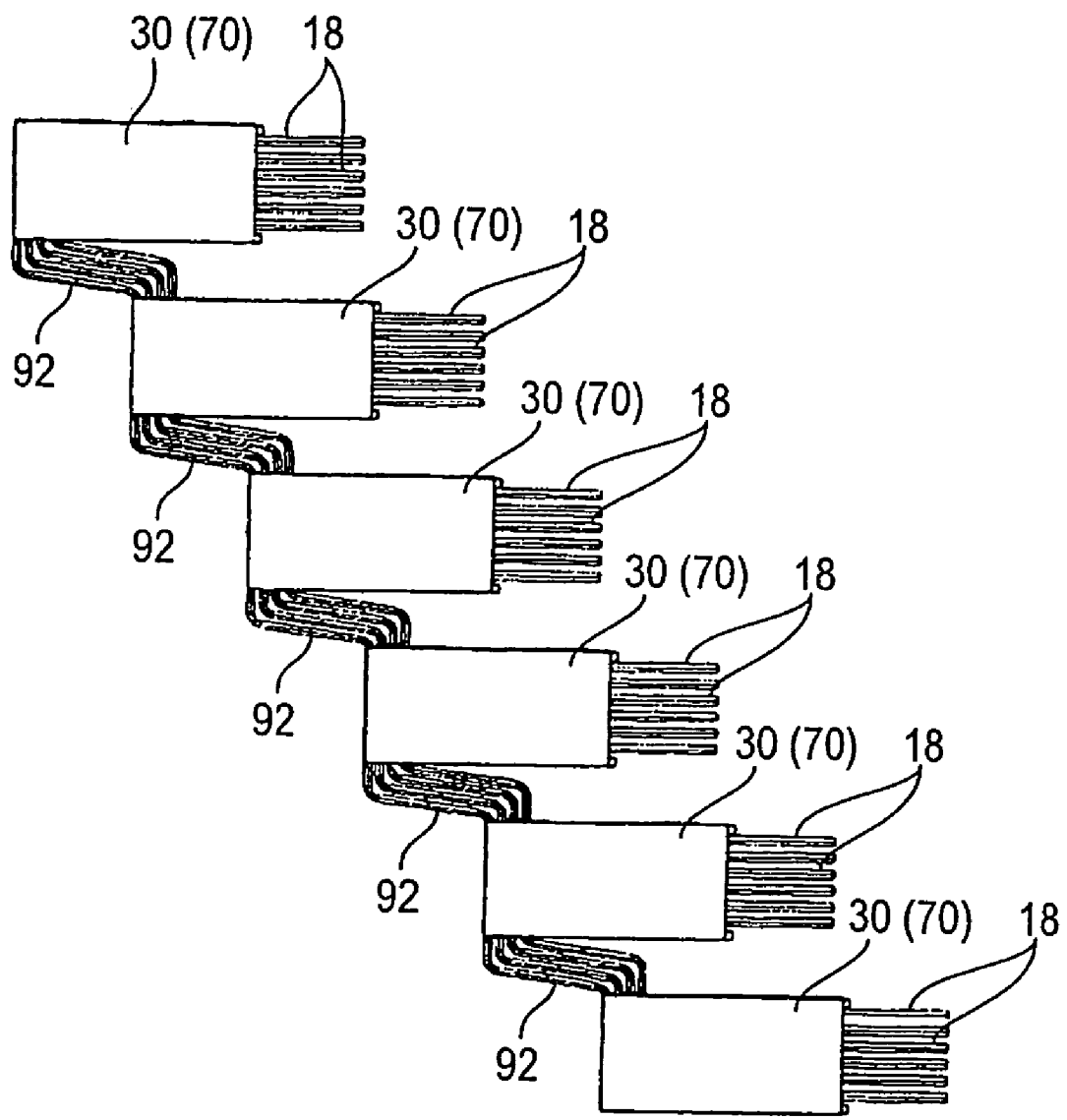
FIG. 38 is a plane view showing an example of the joint connectors in which flexible-wiring members are formed into a stair-like shape.

FIG. 38 shows an example of the structure, which allows the above spiral winding. The flexible wiring members 92 are formed in a stair-like shape. In each step, the insulation housings 30 and 70 are arranged and the flexible wiring members 92 are held by the joint-side insulation housing 70 (in the embodiment in which the joint-side insulation housing 70 is eliminated as shown in FIG. 5, the same are held by the wire-side insulation housing 30 as shown in the figure), thereby it is provided so that the insulation housings 30 and 70 arranged being shifted in the position thereof in a stair-like shape.

Figure 39:
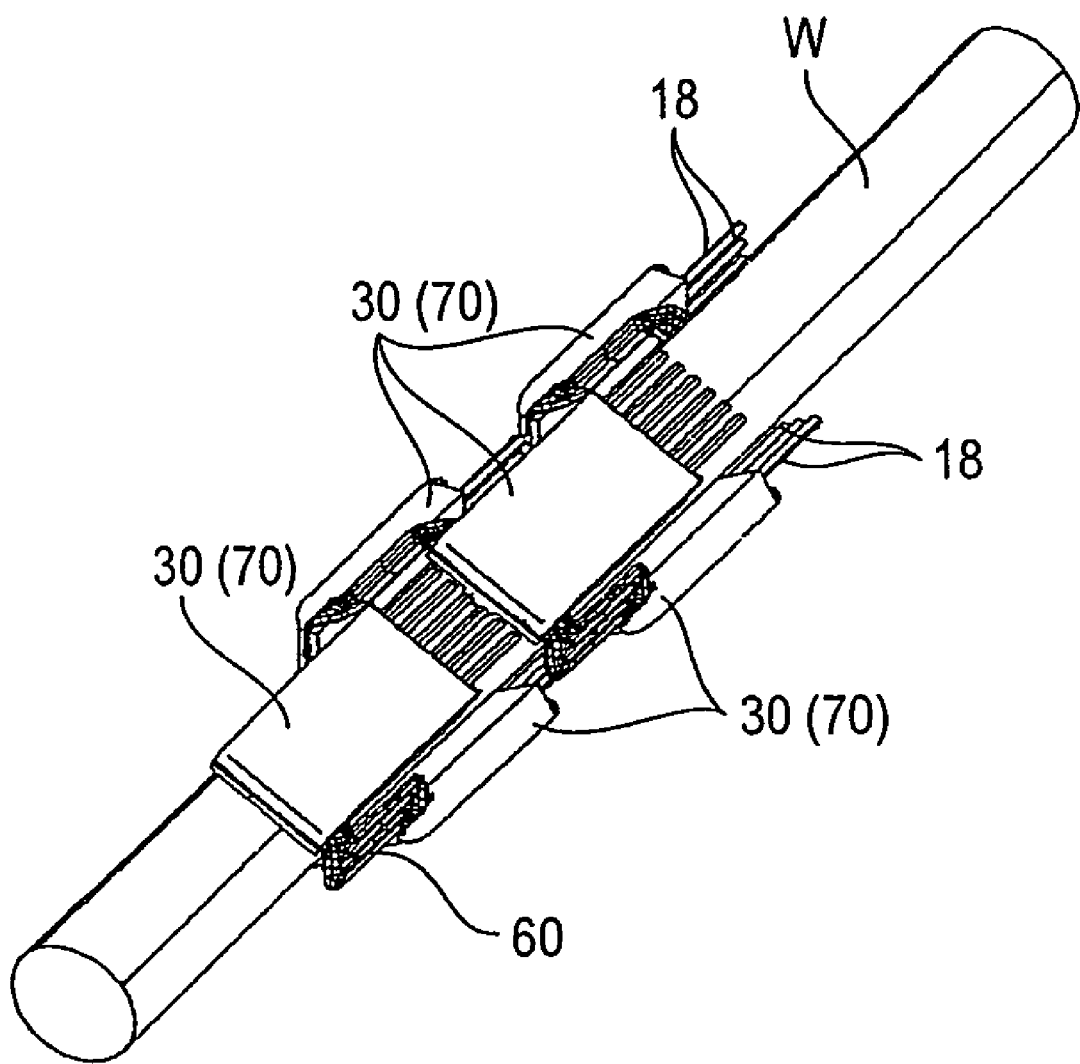
FIG. 39 is a perspective view showing a state where the joint connectors shown in FIG. 38 are wound into a spiral configuration on the external peripheral surface of the main body portion of the wire harness.
Figure 40:
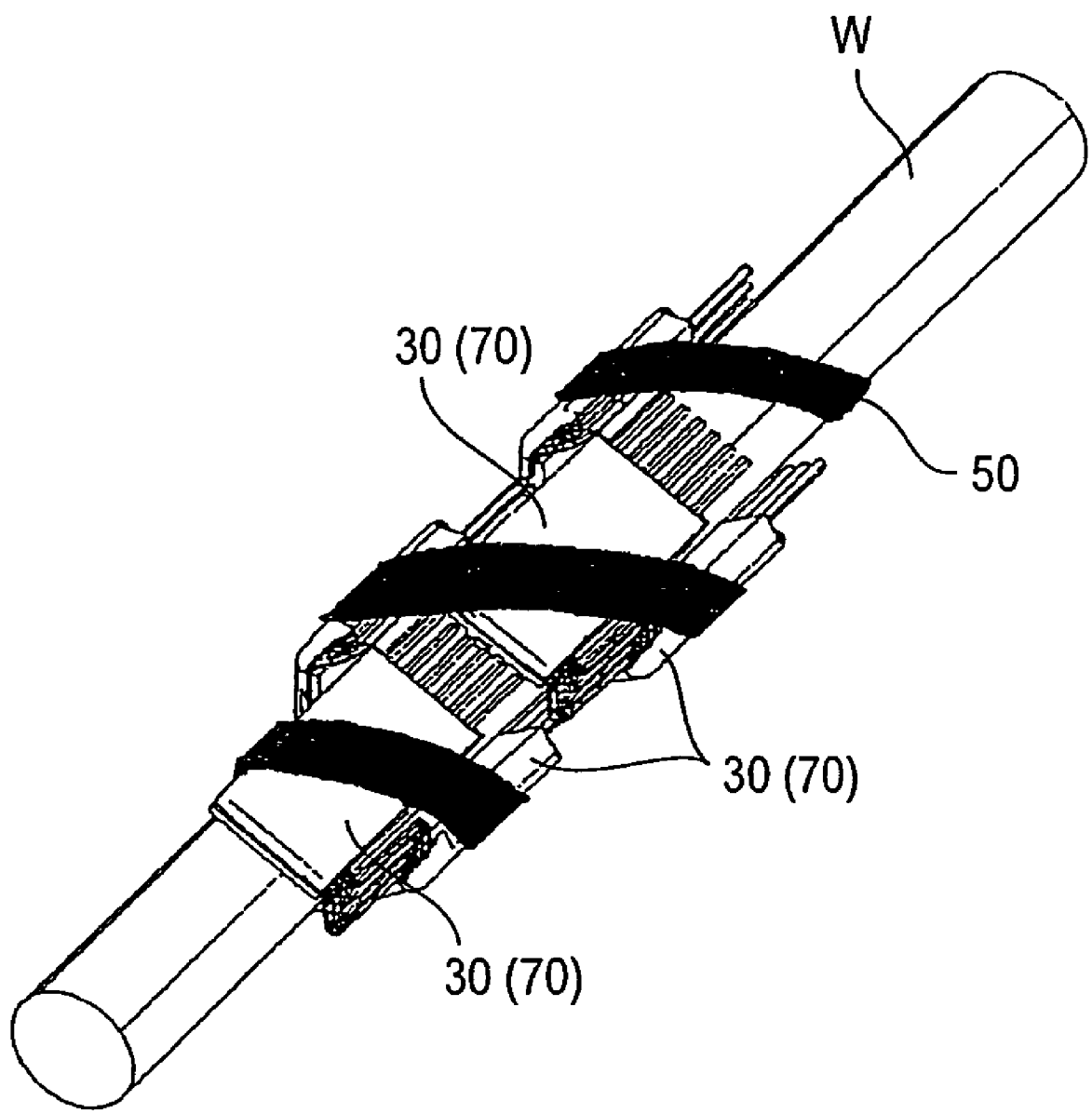
FIG. 40 is a perspective view showing a state where the joint connectors shown in FIG. 39 are fixed by a tape.

When the above joint connector is wound around the main body portion of the wire harness W as shown in FIG. 39, the housings 30 and 70 are arranged while shifting the position thereof in the spiral configuration. Accordingly, a plurality of housings 30 and 70 can be wound irrespective of the peripheral length of the wire harness main body portion. In this case, as shown in FIG. 40, a tape 50 for fixing the joint connector is wrapped in a spiral configuration.

Further, in an example of winding shown in FIG. 8, the substantial outer diameter of the wire harness W increases by two times the thickness of the housing 30. However, in a state of winding shown in FIG. 39 and FIG. 40, the position of the housings 30 and 70 is shifted in the axial direction, such advantage whereby the substantial outer diameter can be reduced accordingly.

As described with reference to the embodiments, according to the present invention, specified configuration of the flexible wiring member can be preferably selected. Accordingly, the configuration can be selected desirably within a range that the winding is possible around the external peripheral surface of the wire harness main body portion.

In the above-described embodiments, terminal component pins 66 constituting the joint-side terminal are male terminals; and the wire-side terminals fitted therewith are female terminals 20. According to the present invention, joint-side terminals may be female terminals; and wire-side terminals may be male terminals.

A third embodiment of the present invention will be described first, with reference to FIGS. 41-45.

The joint connector shown in these drawings includes wire-side terminals 120 fixed respectively to the ends of each electric wires 118 which form a wire harness, an insulation housing 130 which holds the plurality of wire-side terminals 120, and a plurality of short-circuit members 114.

The wire-side terminal 120 exemplarily shown in these drawings includes, closer to its tip end, a box-like female contact 122 which accepts a spring contactor 121, and behind this, a conductor barrel 124 pressed to a conductive portion of the corresponding electric wire 118 and an insulation barrel 126 pressed to an insulation sheath of the electric wire 118. The wire-side terminal 120 has such a universal shape which permits use of the wire-side terminal 120 as other electric wires of the wire harness (i.e., an electric wire irrelevant to the joint connector), and therefore, the joint connector shown in these drawings is advantageously versatile.

The insulation housing 130 includes a compressed main housing 132, a cover 134, which is shaped like a thin plate so as to cover the main housing 132, and thin wall hinges 136, which can be deformed and which link one ends of the main housing 132 and the cover 134 to each other such that the main housing 132 and the cover 134 can revolve relative to each other, all of which are of an insulating material such as a synthetic resin and molded as one unit.

The main housing 132 includes a plurality of (six in the drawings) terminal chambers 138 arranged on the same plane, and the front end of each terminal chamber 138 has terminal insertion holes 139 which accept male terminal sections 114a of the short-circuit member 14 which will be described later. Disposed to a ceiling wall of the respective terminal chamber 138 are lances 140 which primarily engage with engagement teeth 123 of the female contacts 122 of the inserted wire-side terminals 120, and windows 142 which release middle portions of the terminals to above are formed behind the lances 140.

Meanwhile, in this embodiment, two short-circuit members 114 are provided for one insulation housing 130. Each short-circuit member 114 is formed by a so-called bus bar which is a metal plate whose thickness is smaller than the height of the main housing 132, and each short-circuit member 114 includes, as one integrated unit, three pin-like male terminal sections 114a, which can be inserted in the respective female contacts 122 of the inserted wire-side terminals 120 which are located adjacent to each other within the main housing 132, and a terminal linking section 114b which links these male terminal sections 114a to each other in a perpendicular direction to the axial direction of the male terminal sections 114a.

A structure for holding the short-circuit members 114 with the insulation housing 130 will now be described.

A short-circuit member support 144 extends from the main housing 132 of the insulation housing 130 toward the tip ends of the wire-side terminals 120. The short-circuit member support 144 joins with the main housing 132 at a location immediately below the respective terminal insertion holes 139, and the top surface of the short-circuit member support 144 is a short-circuit member guiding surface 144s. The height of the short-circuit member guiding surface 144s is set such that when the short-circuit members 114 slide as they are seated on the short-circuit member guiding surface 144s, the male terminal sections 114a of the short-circuit members 114 are respectively fit in the female contacts 122 of the specified wire-side terminals 120.

A lock projection 144b disposed at the end of the short-circuit member support 144, and at locations closer to the terminal insertion holes 139 from the lock projection 144b, there is a through groove 144a which extends in the direction of arrangement of the terminal chambers 138.

Together with the short-circuit member support 144, the cover 134 forms a short-circuit member protector. The cover 134 revolves around the hinges 136, thus switching between an open location at which the cover 134 releases the windows 142 and the short-circuit member support 144 of the main housing 132 toward above and a close location at which the cover 134 covers these.

To be more specific, the cover 134 includes, as one integrated unit, a main cover 46 which covers the main housing 132 from above at the close location and a short-circuit member cover 148 which together with the short-circuit member support 144 covers the short-circuit members 14 at the close location.

The back surface of the main cover 146 seats projections 147 which enter inside the window 142 in the close state described above. When entering inside the window 142 and readying to abut the female contacts 122 of the inserted wire-side terminals 120 from the rear end side, the projections 147 secondarily engage with the wire-side terminals 120.

Figure 43:
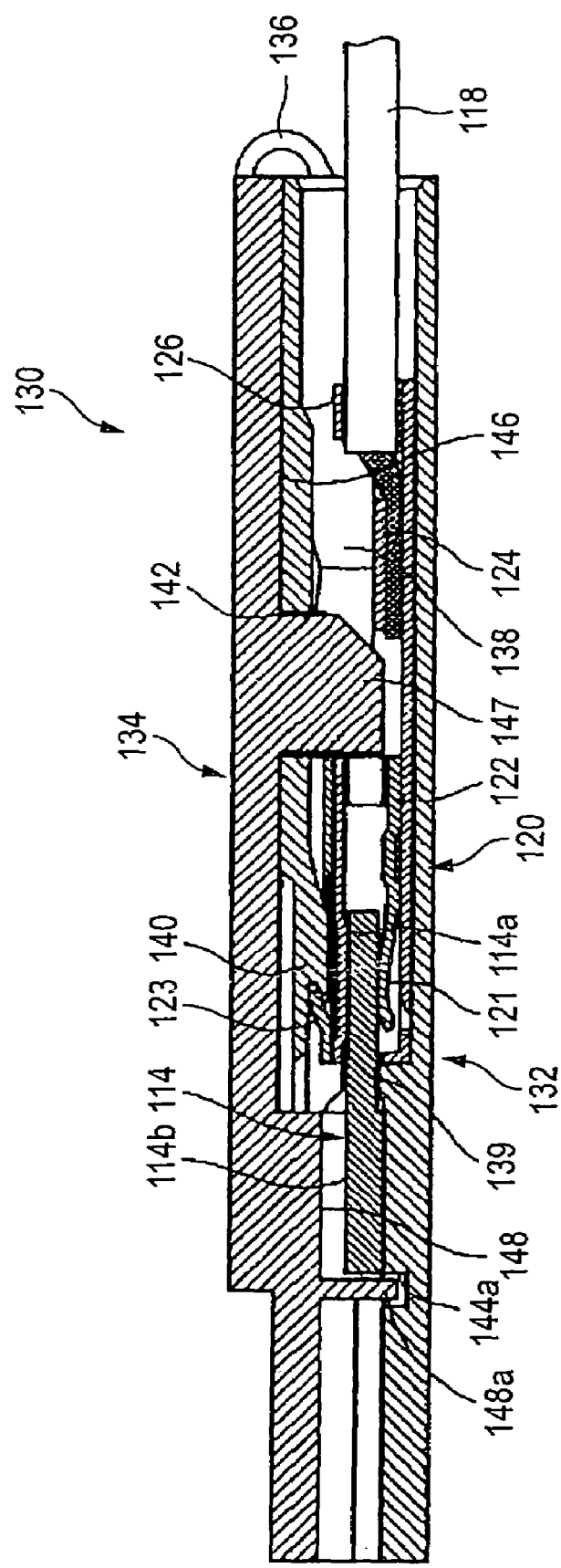
FIG. 43 is a cross sectional view which shows the state where a wire-side terminals held in the insulation housing and a short-circuit members are joined to each other.

The back surface of the short-circuit member cover 148 seats a short-circuit member restricting wall 148a, which has such a shape that can be inserted in the through groove 144a of the short-circuit member support 144, i.e., a plate-like shape which extends in the direction of arrangement of the terminal chambers 138, and at the end of the short-circuit member cover 148, there is a lock frame 148b which can engage with the lock projection 144b. The cover 134 is locked at the close location when the lock projection 144b and the lock frame 148b engage with each other, and at this close location, the short-circuit member restricting wall 148a fits in the through groove 144a. The locations of the short-circuit member restricting wall 148a and the through groove 144a are set such that as the short-circuit member restricting wall 148a moves closer to the rear ends of the short-circuit members 114 (i.e., the ends closer to the terminal linking section 114b) in a condition where the short-circuit members 114 are fit with predetermined wire-side terminals 120 as shown in FIG. 43, the short-circuit members 114 are restricted from moving away from the wire-side terminals 120.

Using this connector, it is easy to short-circuit specified electric wires 118 contained in the wire harness with each other, in the following sequence.

Figure 41:
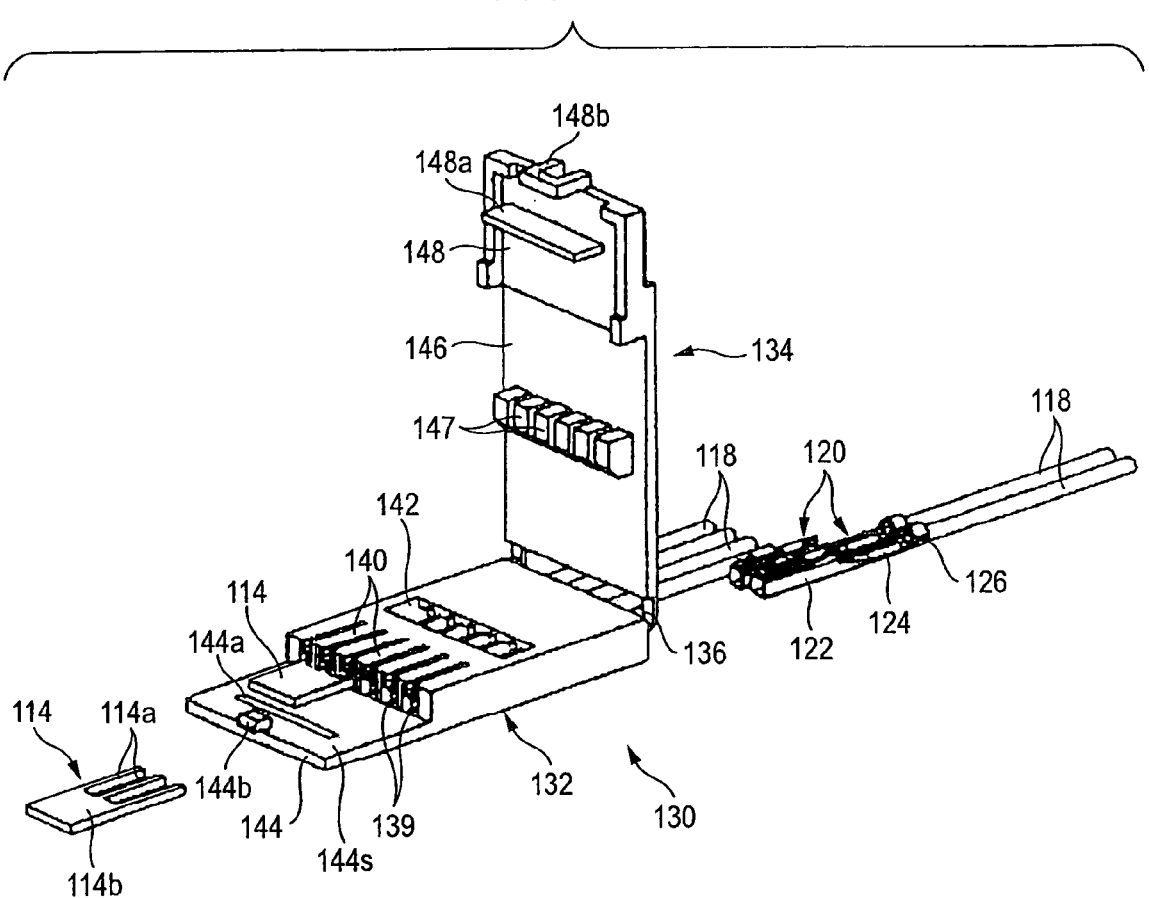
FIG. 41 is an exploded perspective view which shows a joint connector according to a third embodiment of the present invention.
Figure 42:
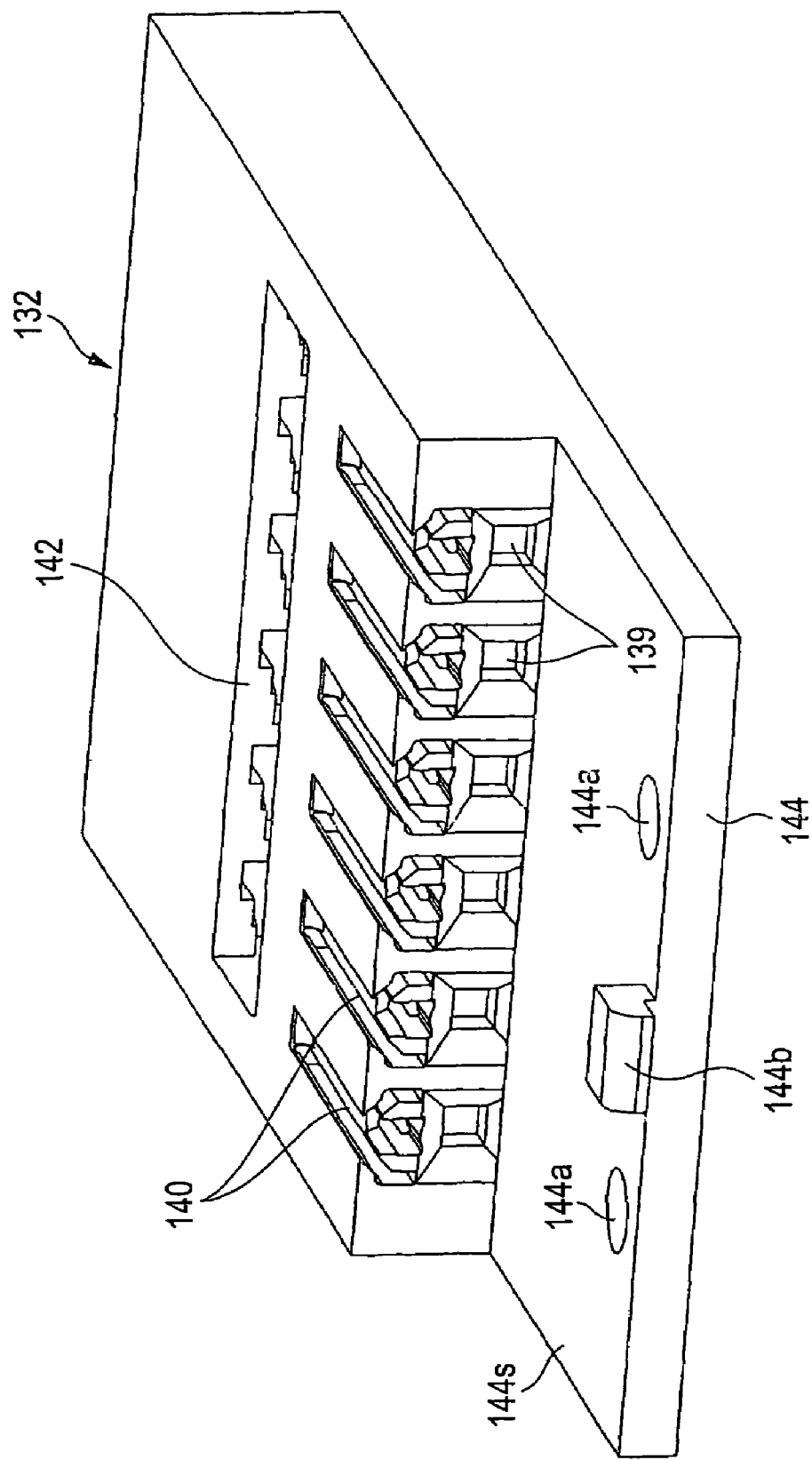
FIG. 42 is a perspective view which shows a main portion of a insulation housing of the joint connector.

1) At a pre-process step of fabricating the wire harness, the wire-side terminals 120 are held inside the insulation housing 130 (FIG. 41).

2) At a last step, the short-circuit member 114 short-circuits specified wire-side terminals 120 with each other. To be more specific, with the cover 134 of the respective insulation housing 130 open, the short-circuit member 114 having an appropriate shape slides as it is seated on the short-circuit member guiding surface 144s, and the respective male terminal sections 114a of the short-circuit member 114 are fit in the specified female contacts 122 of the associated wire-side terminals.

At this stage, depending upon how the end shape of the short-circuit member 114 is set (and in specified, depending upon the number of the male terminal sections 114a), it is possible to establish a desired short circuit. For instance, in the event that the insulation housing 130 holds six wire-side terminals 120 as shown in the drawings, one short-circuit member 114 including six male terminal sections 114a will short-circuit all wire-side terminals 120 with each other, and alternatively, a combination of the short-circuit member 114 including four male terminal sections 114a and the short-circuit member 114 including two male terminal sections 114a will create such a short circuit which short-circuits four wire-side terminals 120 with each other and separately short-circuits two wire-side terminals 120 with each other.

When short circuits independent from each other are to be formed using a plurality of short-circuit members 114, it is important that these short-circuit members 114 are disposed away from each other and accordingly insulated from each other, which is a matter of course.

Figure 44:
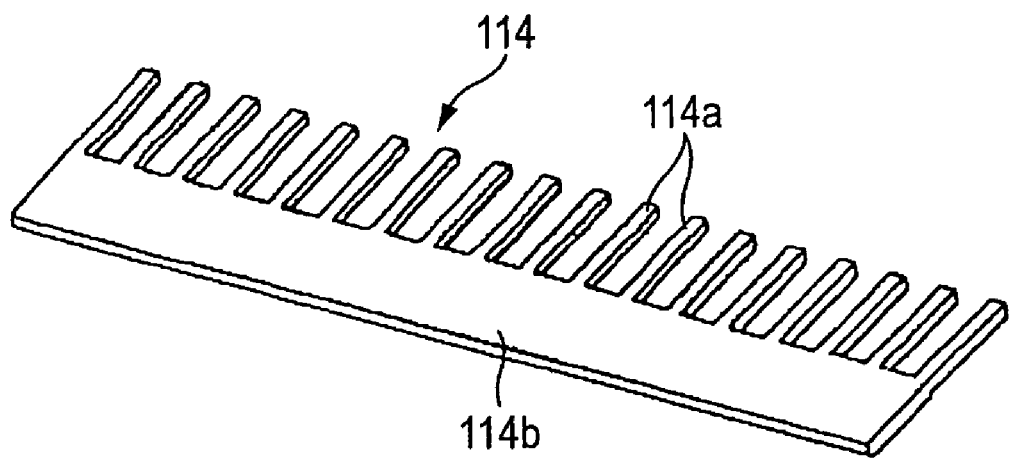
FIG. 44 is a perspective view which shows the state where the joint connector is wound around and fixed to a main portion of the wire harness.

Further, the short-circuit members 114 may be manufactured by arbitrary methods: For example, the short-circuit members 114 may be punched out one at a time from a metal plate, or alternatively, a long short-circuit member 114 may be formed in which many male terminal sections 114a are defined as shown in FIG. 44 and any desired number of male terminal sections 114a may be severed off from the long short-circuit member each time.

3) The cover 134 is closed. Consequently, the terminal chamber 138 of the cover 134 and the short-circuit member support 144 cover the short-circuit member 114 for effective protection from outside (FIG. 43). Since this also positions the short-circuit member restricting wall 148a immediately behind the short-circuit member 114, the short-circuit member 114 is effectively restricted from moving backward, i.e., restricted from moving away from the wire-side terminals 120, whereby the connection between the short-circuit member 114 and the wire-side terminals 120 is more securely maintained.

Figure 45:
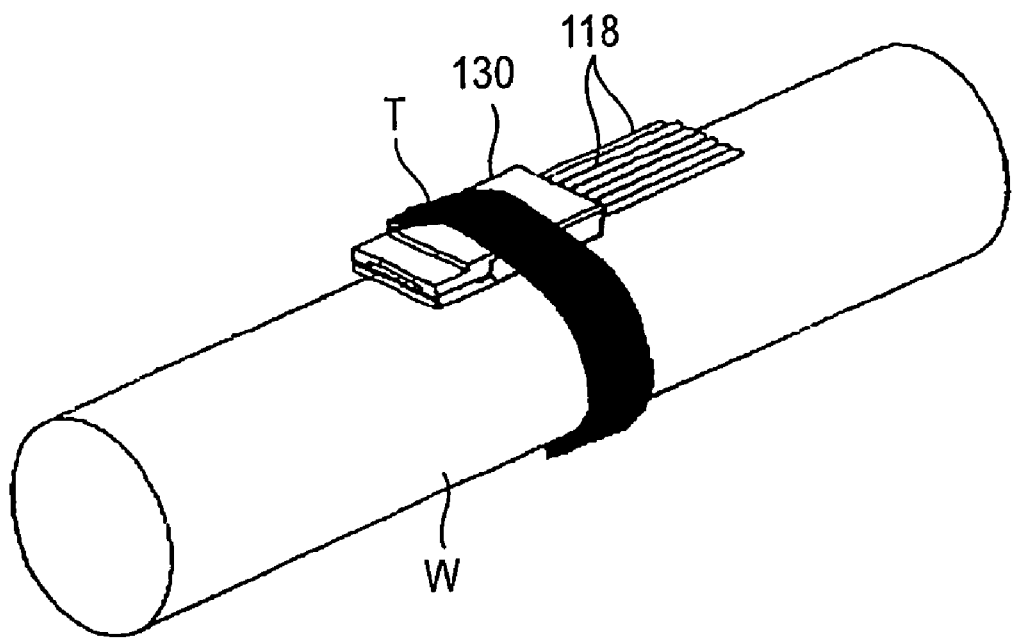
FIG. 45 is a perspective view which shows the state where the joint connector is wound around and fixed to the main portion of the wire harness.
Figure 46:
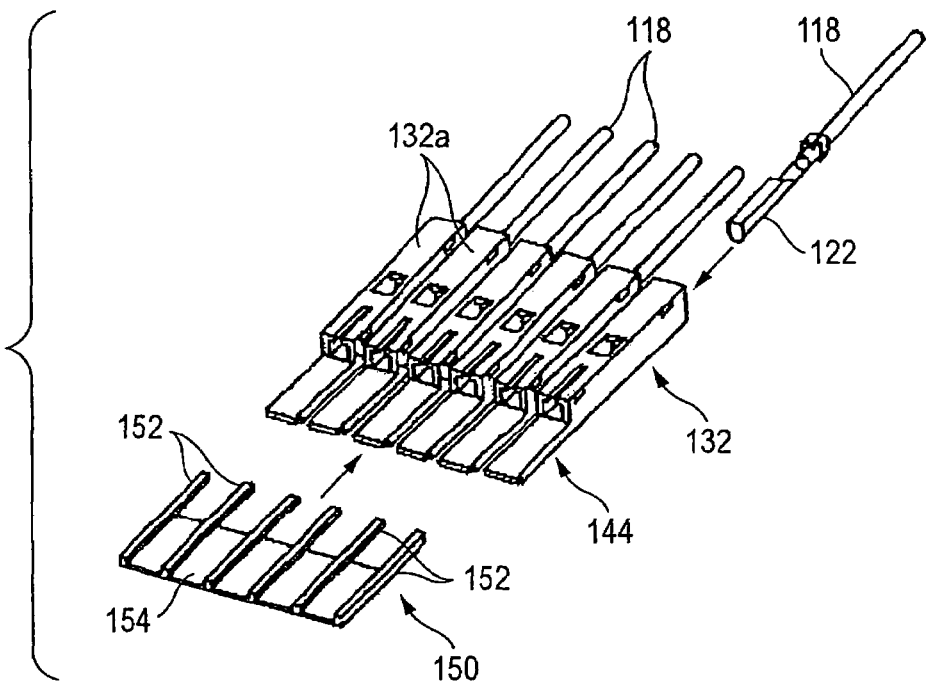
FIG. 46 is an exploded perspective view which shows the main housing and the short-circuit members of the joint connector according to a fourth embodiment of the present invention.
Figure 47:
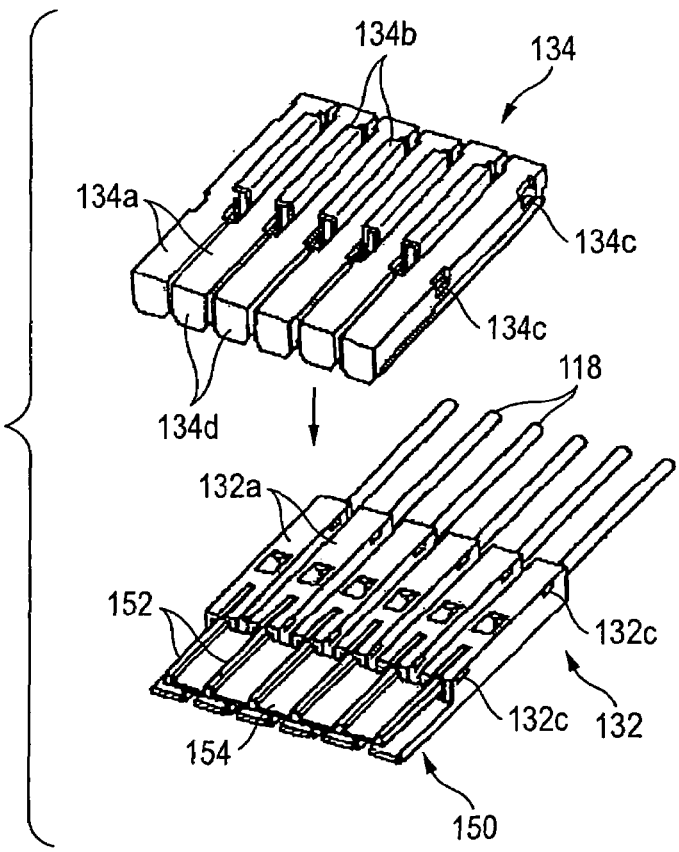
FIG. 47 is an exploded perspective view which shows the step of mounting the cover to the main housing of the joint connector which is shown in FIG. 46.

4) As shown in FIG. 45, the insulation housing 130 is placed abutting a main portion of a wire harness W, an adhesive tape T is wound around and fixed to this.

Since the entire connector including the insulation housing 130 is made very thin, the connector sticks out only a little beyond the main portion of the wire harness W even during winding, and therefore, it is possible to dispose the wire harness W even in a narrow space without any inconvenience.

Further, when the insulation housing 130 itself is formed such that the insulation housing 130 can be deformed along the circumferential surface of the wire harness W, it is possible to wind the entire connector around even such a wire harness W whose circumferential surface has a large curvature (i.e., a small diameter). This example is shown in FIGS. 46-50 as a fourth embodiment.

In the fourth embodiment, the main housing 132 and the cover 134 of the insulation housing 30 are molded as separate members in such a manner that each can be deformed along the circumferential surface of the wire harness W.

Figure 48A:
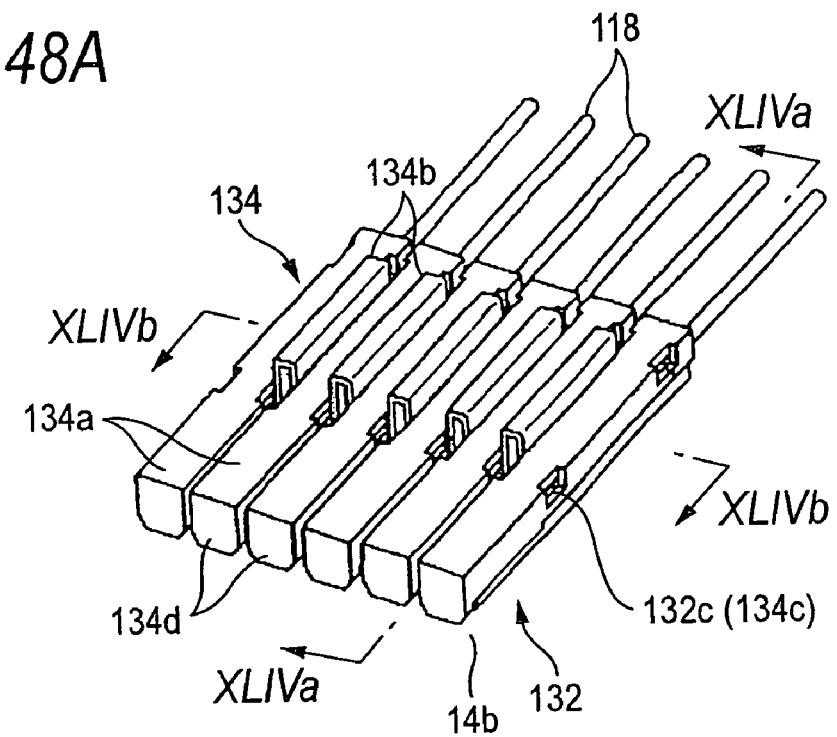
FIG. 48A is a perspective view of the state as viewed above that the cover has been mounted to the main housing which is shown in FIG. 47.
Figure 48B:
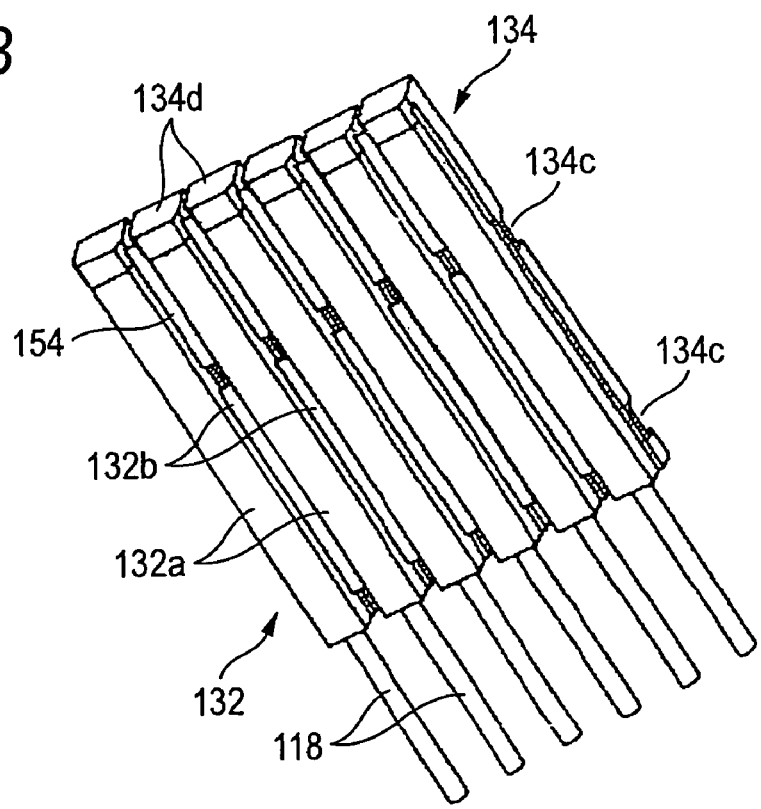
FIG. 48B is a perspective view of the state as viewed from below.
Figure 49A:
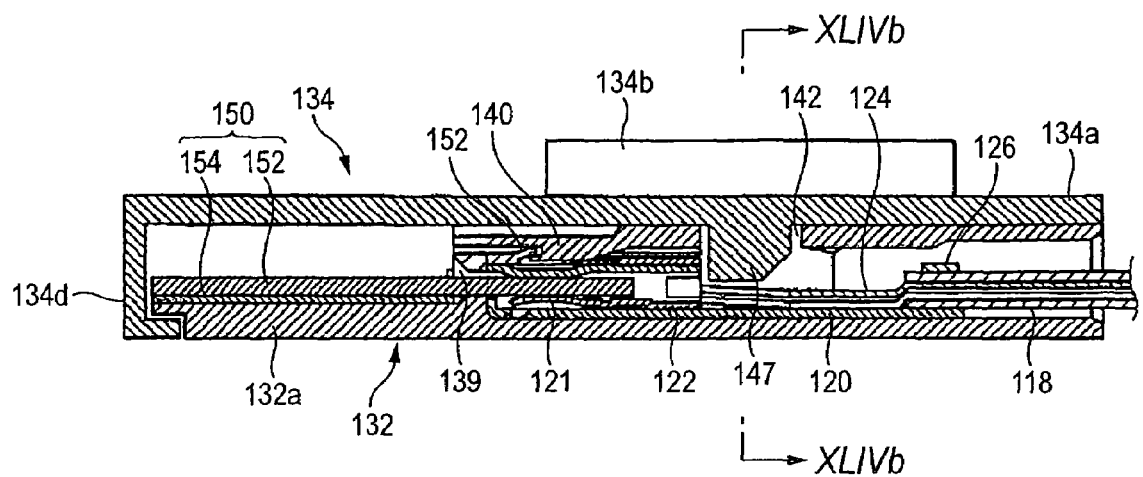
FIG. 49A is a cross sectional view of FIG. 48A taken along a XLIVa-XLIVa line.
Figure 49B:
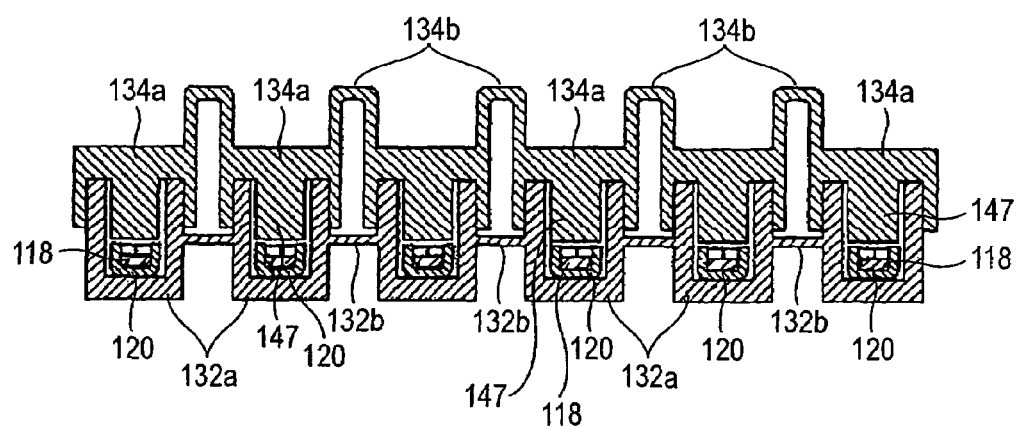
FIG. 49B is a cross sectional view of FIG. 49A taken along a XLIVb-XLIVb line.

To be more specific, as shown in FIG. 48B and FIG. 49, the main housing 132 of the insulation housing 30 is, including the short-circuit member support 144, split in the width direction (the direction of arrangement of the terminal chambers 138), and a plurality of (six in the drawings) terminal holders 132a forming the split portion are molded as one with hinges 132b which link the adjacent terminal holders 132a to each other. The respective hinges 132b are sufficiently thinner than the terminal holders 132a, thus forming bending portions which can bend (i.e., which can be deformed) in a direction which is perpendicular to the axial direction of the wire-side terminals 120 and the direction of arrangement of the wire-side terminals 120.

This is similar as the cover 134 in that split cover portions 134a each obtained by splitting the cover for each terminal holder 132a are molded integral with hinges 134b which link the adjacent split cover portions 134a to each other, and that the respective hinges 134b are sufficiently thinner than the respective split cover portions 134a, thus forming bending portions which can bend (i.e., which can be deformed) in the same direction as the hinges 132b of the main housing 132. In addition, the projections 147 which secondarily engage with the terminals are also split in accordance with the split cover portions 134a.

Windows 132c and projections 34c which can engage with each other are formed respectively in the side wall of the main housing 132 and the side wall of the cover 134. As the windows 132c and the projections 134c engage with each other, the cover 134 remains mounted to the main housing 132.

Further, at the front ends of the respective split cover portions 134a, there are short-circuit member restricting walls 134d which cover the short-circuit member support 144 of the main housing 132 from the end surface side.

Meanwhile, a short-circuit member 150 includes a plurality of (six in the drawings) pin-like male terminal sections 152, which can be fit in the respective female contacts 122 of the wire-side terminals 120, and a terminal linking member 154 which links the male terminal sections 152 to each other in a perpendicular direction to the axial direction of the male terminal sections 152. The terminal linking member 154 is formed by a flexible wire material which can be deformed in the same direction as the direction in which the hinges 132b of the main housing 132 bend. As the respective male terminal sections 152 are soldered, welded or otherwise fixed to a conductive portion of the terminal linking member 54, the male terminal sections 152 are electrically connected with each other via the terminal linking member 154.

The flexible wire material is preferably a flat wire material in which a plurality of compressed rectangular conductors are arranged parallel to each other and integrated with each other by a thin-wall insulator, a flexible printed circuit board seating a printed short circuit, an FPC, etc. In addition, depending upon the circuit structure of the terminal linking member 154, it is possible to short-circuit only specified male terminal sections 152 with each other. Alternatively, the terminal linking member 154 may be formed by a metal thin-wall sheet material which is flexible.

In such a joint connector, as in the third embodiment, the cover 134 is attached to the main housing 132 after insertion of the respective male terminal sections 152 of the short-circuit member 150 in the female contacts 122 of the wire-side terminals 120 in a condition that the inserted wire-side terminals 120 are held within the main housing 132 of the insulation housing 130, thereby short-circuiting appropriate wire-side terminals 120 with each other via the short-circuit member 150 while effectively protecting the short-circuit member 150 covered with the cover 134 and the short-circuit member support 144 from outside. Further, the short-circuit member restricting walls 134d of the cover 134 restrict the short-circuit member 150 from slipping away, whereby the short-circuit member 150 and the wire-side terminals 120 are connected more securely.

Figure 50:
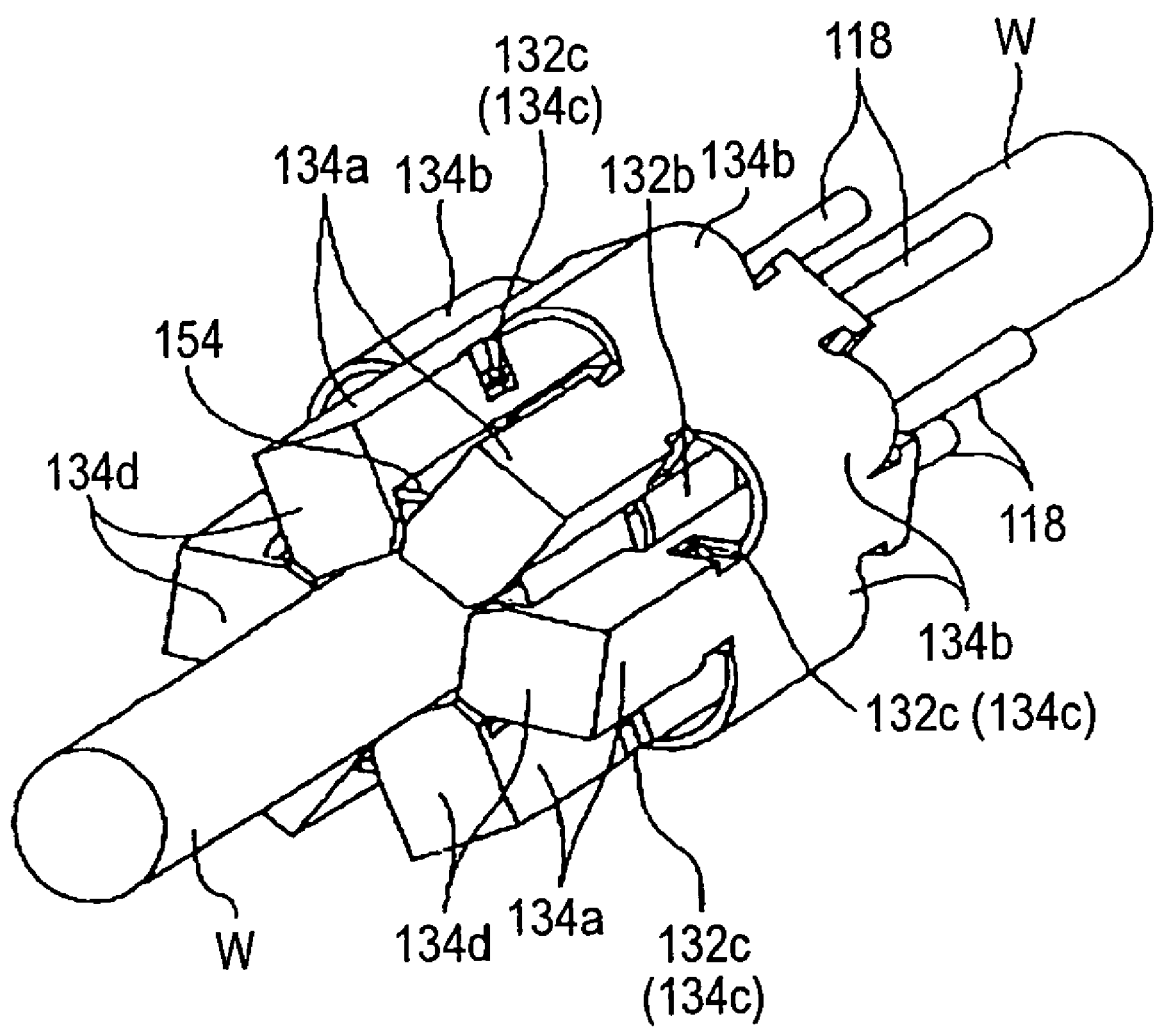
FIG. 50 is a perspective view which shows the state where the joint connector which is shown in FIGS. 48A, 48B, 49A and 49B has been wound around the main portion of the wire harness.

Moreover, in this embodiment, since the main housing 132 and the cover 134 which form the insulation housing 130 can bend at the hinges 132b and 134b in the direction perpendicular to the axial direction and the direction of arrangement of the wire-side terminals 120 (i.e., the direction toward below in FIG. 49B) and since the terminal linking member 154 of the short-circuit member 150 can be deformed in the same direction as the bending direction, the insulation housing 130 can be wound around and fixed to the circumferential surface of the wire harness W as shown in FIG. 50 for instance. The present invention is thus applicable to a wire harness W having a large curvature (i.e., a small diameter).

While the bending portions (hinges) 132b and 134b are formed between all wire-side terminals 120 in the fourth embodiment, this is not limiting and the bending portions may be formed between only some wire-side terminals 120 instead. The number and the locations of the bending portions may be determined properly in accordance with the intended use (e.g., the shape of the wire harness W which the housing is to be wound around). It is a matter of course that where the insulation housing 130 does not include the cover 134, the bending portions may be formed only in the main housing 132.

Meanwhile, the short-circuit member 150 is not necessarily limited to such a short-circuit member whose terminal linking member 54 can be deformed, but may be such a short-circuit member which is split at locations corresponding to the bending portions of the insulation housing 130 in a parallel direction to the direction of arrangement of the wire-side terminals. For instance, in the event that the short-circuit member 114 is split into two at the center in the width direction as shown in FIGS. 41-45, a bending portion may be formed in the insulation housing 130 at this center location, thereby making it possible to bend the entire connector at this center location.

According to one aspect of the present invention, a joint-side terminal is provided to a thin flexible wiring member to form a joint member. Accordingly, the entire joint member can be largely reduced in thickness. Thus, when the above is wound around a wire harness, the protrusion amount of the joint member can be reduced.

As for the joint member, for example, the flexible wiring member is preferably a flexible printed circuit substrate formed with a conductor pattern on a substrate having flexibility, and the conductor pattern preferably includes protruding portions constituting each of the joint-side terminals. According to the above arrangement, depending on the configuration design of the conductor pattern, various connection circuits can be formed. Accordingly, the degree of freedom in designing is increased, and by forming the protruding portion integrally on the conductor pattern as the joint-side terminal, the structure can be simplified.

In this case, by providing so that a reinforcement plate having such a configuration that the same substantially coincides with the protruding portion, is overlapped with protruding portion of the conductor pattern and fixed thereto, the joint-side terminal portion can be reinforced effectively while maintaining the flexibility and thin structure of the entire joint member.

Also, the flexible wiring member may be a flat wiring member integrally formed with a flat insulation layer around a plurality of conductors aligned parallel to each other on the same plane, and to each conductor of the flat wiring member, a terminal component member extending in a direction substantially perpendicular thereto is connected, and these terminal component members are arranged being aligned in the longitudinal direction of the flat wiring member to form the joint-side terminals.

In this configuration also, by arranging the combination of the connection between the conductor and the terminal component member of the flat wiring member, various connection circuits can be formed resulting in an increased degree of freedom in designing.

Further, on the end portions in the longitudinal direction of the flat wiring member, projections and recesses for increasing the distance along the face between the conductors are preferably formed. According to this configuration, it is possible to prevent a short-circuit between the conductors in end portion further reliably.

According to another aspect of the invention, by simply fitting each joint-side terminal formed on the joint member with the wire-side terminal fixed to the terminal of the specified wire, a connection circuit of the joint member and specified wires can be readily connected. And in this state, by winding and fixing the flexible wiring member of the joint member to the wire harness main body portion, the specified wires can be electrically connected, and a wire harness with a small protrusion amount of the joint member can be formed.

In the joint connector, it is preferable to include a plurality of wire-side insulation housings for holding the wire-side terminals, wherein it is provided so that, in a state where the wire-side terminals held by these wire-side insulation housings and the joint-side terminals of the joint member are fitted with each other, the flexible wiring member of the joint member is flexible in the positions between the wire-side insulation housings.

By providing the wire-side insulation housing as described above, the insulation conditions between the wire-side terminals outside the joint member can be reliably ensured. And such a problem that wire-side terminals, which should not be short-circuited therebetween, are short-circuited can be prevented further reliably.

Further, when the wire-side insulation housing includes a means for holding a plurality of wire-side terminals in a state where these wire-side terminals are aligned on substantially the same plane, a plurality of wire-side terminals, which are integrated by the wire-side insulation housing, can be fitted with the joint-side terminals as a unit resulting in an increased efficiency of the connecting work. Further, the wire-side insulation housing holds a plurality of wire-side terminals in a state where these terminals are aligned on substantially the same plane. Accordingly, a flat and thin configuration can be obtained. Thus, even when the wire-side insulation housing is employed, when the entire connector is wound around the wire harness main body portion, the protrusion amount can be reduced.

Further, the wire-side insulation housing preferably has a wiring member holding section for holding the flexible wiring member of the joint member in a position where the wire-side terminal held by the wire-side insulation housing and the joint-side terminal of the joint member are fitted with each other.

According to this configuration, the flexible wiring member is held by the wiring member holding section at the wire-side insulation housing side in a position where the wire-side terminals and the joint-side terminals are fitted with each other. Accordingly, the fitting conditions are reliably ensured with a simple structure.

In particular, the flexible wiring member constituting the joint member is preferably formed with through-holes, and the wire-side insulation housing is formed with wiring member holding projections capable of being fitted with the through-holes in a position where each wire-side terminal held by the wire-side insulation housing and joint-side terminal of the joint member are fitted with each other.

According to this configuration, with such a simple structure that the wiring member holding projection at the wire-side insulation housing is fitted with the through-hole formed at the flexible wiring member, relative position between the wire-side insulation housing and the wire-side terminals and the joint member, which are held thereby, is fixed.

Further, when the relative position between the wiring member holding projections in each of the wire-side insulation housings and the wire-side terminals held by the wire-side insulation housings is different in each of the wire-side insulation housings, incorrect connection between the joint-side terminal and the wire-side terminal (joint-side terminal is erroneously connected with a wire-side terminal, which should not be connected) is reliably prevented.

Further, when the joint connector includes joint-side insulation housings each fitted with each of the wire-side insulation housings, wherein, in each of the joint-side insulation housings, a joint-side terminal, which is fitted with a wire-side terminal held by wire-side insulation housing fitted with the joint-side insulation housing, is held, by holding the joint-side insulation housing, it is possible to prevent a short-circuit between the joint-side terminals further reliably; and by fitting the joint-side insulation housing with the wire-side insulation housing, it is possible to carry out the fitting work of the wire-side terminals with the corresponding joint-side terminals as a job lot.

Here, the joint-side insulation housing preferably has a flexible wiring member holding section capable of being opened and closed, the flexible wiring member holding section is arranged so as to allow, in its open position, the insertion of each joint-side terminal into the joint-side insulation housing, and after that insertion, by being closed from the open position to the close position, to hold flexible wiring member connected to the joint-side terminal.

According to this configuration, in a state where the flexible wiring member holding section is opened, each of joint-side terminals of the joint member can be inserted into the joint-side insulation housing, and from that state, by closing the flexible wiring member holding section to hold the flexible wiring member, the flexible wiring member and joint-side terminal can be covered.

Here, the joint-side insulation housings may be independent from each other. However, in such a case, the joint-side insulation housings largely displace their relative position; and it causes an external force in the shearing direction to act on the flexible wiring member. To cope with this, when joint-side insulation housings neighboring each other are connected to each other via flexible connecting section flexible in the same direction as the flexible direction of the flexible wiring member, by restricting the relative displacement among the joint-side insulation housings with the flexible connecting section, the flexible wiring member can be protected, and further, while allowing flexible the connecting section to warp, the winding thereof on the wire harness external peripheral surface can be carried out with no problem.

According to another aspect of the invention, by connecting the wiring member connecting portion of the joint-side terminal held by the respective joint-side insulation housing to the predetermined conductor in the flexible wiring member, a joint member, in which wiring member connecting portions of the specified joint-side terminal are electrically connected via the flexible wiring member, can be formed. And by connecting the joint-side insulation housing holding the respective joint-side terminals and the wire-side insulation housing holding the respective wire-side terminals to each other to fit the joint-side terminals with the wire-side terminals corresponding thereto, the specified wires in the wire harness can be electrically connected to each other. And further, it is possible to wind the joint connector on the external peripheral surface of the wire harness to fix thereto.

Particularly, when, in the wire-side insulation housing, a plurality of wire-side terminals are held in a state being aligned on substantially the same plane, and in the joint-side insulation housing, a plurality of joint-side terminals are held being aligned on substantially the same plane in a arrangement capable of being fitted with wire-side terminals corresponding thereto, it is possible to form both of the wire-side insulation housing and the joint-side insulation housing into a flat configuration. And further, it is possible to reduce the extending dimension in the diameter direction when the same is wound around the external peripheral surface of the wire harness.

Here, each joint-side insulation housing preferably has a flexible wiring member supporting section formed in a neighboring position in the direction perpendicular to the arrangement direction of the joint-side terminals with respect to the wiring member connecting portion of each joint-side terminal, and it is provided so that, in a state where the flexible wiring member is inserted between the flexible wiring member supporting section and each wiring member connecting portion, electrical connection between the flexible wiring member and each wiring member connecting portion is allowed.

According to this configuration, by inserting the flexible wiring member between the wiring member connecting portions and the flexible wiring member supporting sections to hold the same, it is possible to facilitate the work of electrical connection between the wiring members and the wiring member connecting portions.

In particular, each joint-side insulation housing preferably has a flexible wiring member supporting section in a position adjacent to the wiring member connecting portion leaving a space into which the flexible wiring member can be inserted between the wiring member connecting portions of each joint-side terminal and the same; and in the flexible wiring member supporting section, through-holes for welding, into which electrodes for welding with the conductor of the flexible wiring member can be inserted in a state where the flexible wiring member is inserted in the space, are formed.

According to this configuration, in a state where the flexible wiring member is inserted between the wiring member connecting portions and the flexible wiring member supporting sections, it is possible to insert the electrodes into the through-hole for welding into the flexible wiring member supporting section to carry out electrical connection between the wiring member connecting portions and the corresponding conductor of the flexible wiring member with a welding.

Further, the wiring member connecting portion of each joint-side terminal has preferably a spring contact section connected to the conductor by contacting resiliently with the conductor of the flexible wiring member in a state where the flexible wiring member is inserted into the space.

According to this configuration, by simply inserting the flexible wiring member between the spring contact section and the flexible wiring member supporting section, it is possible to bring the spring contact section and the predetermined conductor in the flexible wiring member into contact with each other using the resilient force of the spring contact section to electrically connect the same to each other.

Further, each joint-side terminal preferably has, as the wiring member connecting portion, a press-connection blade for cutting into the insulation material of the flexible wiring member to come into contact with the internal conductor thereof by a press force; and the joint-side insulation housing has a terminal supporting plate for supporting a portion of the joint-side terminal formed with the press-connection blade from the side opposite the press-connection blade.

Further, each joint-side terminal may have, as the wiring member connecting portion, a press-connection blade for cutting into the insulation material of the flexible wiring member to come into contact with the internal conductor thereof by a press force; and the joint-side insulation housing has a terminal supporting plate for supporting a portion of the joint-side terminal formed with the press-connection blade from the side opposite the press-connection blade.

In the above-described joint connector, the joint-side insulation housings arranged in the positions neighboring each other are preferably connected to each other via flexible connecting sections, which are flexible in the same direction as the flexible direction of the flexible wiring member.

According to this configuration, it is possible to protect the flexible wiring member by restricting the relative displacement between the joint-side insulation housings with the flexible connecting section; and further, the same can be wound around the wire harness external peripheral surface with no problem while deforming the flexible connecting section.

Further, the joint-side insulation housings preferably have a flexible wiring member holding section, which is capable of being opened and closed; and the flexible wiring member holding section is arranged so as, at its open position, to expose the wiring member connecting portion of each joint-side terminal to the outside; and at its close position, to hold the flexible wiring member, which is connected to each wiring member connecting portion at the open position.

According to this configuration, it is possible that, in a state where the flexible wiring member holding section is opened, after electrically connecting the wiring member connecting portion to the predetermined conductor of the flexible wiring member, the flexible wiring member holding section is closed to hold the flexible wiring member, and thus to cover the flexible wiring member.

In the joint connectors, which have been described above, in the joint connectors having the wire-side insulation housings and the joint-side insulation housings, the flexible wiring member is preferably formed in a stair-like shape so that position of the insulation housing shifts in a stair-like shape in the direction perpendicular to the longitudinal direction of the flexible wiring member.

According to the joint connector as described above, the joint connector can be wound around the wire harness main body portion in a spiral configuration. Accordingly, it is possible that, even when the number of the joint-side insulation housings and the wire-side insulation housings relative to the external peripheral length of the wire harness main body portion, the insulation housings are wound with no problem while extending the same in the axial direction of the wire harness main body portion. Also, since there are not a plurality of insulation housings in the same position in the axial direction, it is possible to, for example, compared to the case where the joint connector is wound to align a plurality of insulation housings in the peripheral direction of the wire harness main body portion, reduce the substantial outer diameter of the wire harness.

According to another aspect of the invention, the short-circuit member is fit from the axial direction in the female contacts of the wire-side terminals held approximately on the same plane and specified wire-side terminals are short-circuited with each other, and hence, it is not necessary to increase the height of any one of the wire-side terminals and the insulation housing and it is therefore possible to greatly reduce the thickness of the connector as a whole. It is thus possible to ensure that this joint connector when wound around the wire harness sticks out only a little.

Further, it is possible to build various types of short circuits using common insulation housings depending upon how the shape and the structure of the short-circuit member (the number of the male terminal sections in particular) is set, which is advantageous in terms of versatility as well.

For example, using a structure that a plurality of short-circuit members are fit with specified wire-side terminals with these short-circuit members located away from each other, it is possible to divide the wire-side terminals held in the insulation housing into a plurality of groups and to short-circuit the electric wires with each other group by group.

The short-circuit member is preferably such a short-circuit member which is obtained by forming the plurality of male terminal sections and the terminal linking section which links the male terminal sections to each other as one integrated unit of a conductive material. This simple structure achieved by a small number of parts and components permits short-circuiting of specified wire-side terminals with each other.

To be more specific, a structure formed by a metal plate which is thinner than the insulation housing is preferable. Use of such a short-circuit member facilitates thickness reduction of the entire connector, and the structure of the short-circuit member itself is simplified.

Alternatively, when the insulation housing is structured such that at locations between mutually adjacent specified wire-side terminals, bending portions are disposed which can bend in a direction perpendicular to the axial direction of the wire-side terminals and the direction of arrangement of the wire-side terminals, and the terminal linking section of the short-circuit member is formed so that at locations corresponding to the bending portions, the terminal linking section can bend in the same direction as the direction of bending of the bending portions or such that at locations corresponding to the bending portions, the terminal linking section is split in a direction parallel to the direction of arrangement of the wire-side terminals, it is possible to bend the insulation housing itself along the circumferential surface of the wire harness, and therefore, wind the joint connector around even a wire harness having a large curvature (i.e., a small diameter) in a stable fashion.

The insulation housing may include the bending portions at locations between some wire-side terminals or all wire-side terminals. The latter more flexibly adapt to the outer shape of a wire harness.

A preferable specific structure of the insulation housing including the bending portions is that a terminal holder which holds the wire-side terminals is molded integral with thin-wall hinges which form the bending portions. By means of this structure, it is possible to bend the insulation housing itself while suppressing an increase in the number of parts and components which form the insulation housing and maintain a simple structure.

The terminal linking section of the short-circuit member which can bend is preferably such a terminal linking section which is formed of a flexible wire material which can be deformed in the same direction as the direction of bending of the bending portions for instance. With this structure, a desirable short circuit can be created depending upon the wiring in the flexible wire material.

The insulation housing preferably includes a short-circuit member protector which protects the short-circuit members which are connected with the wire-side terminals.

The short-circuit member protector preferably includes a short-circuit member support which extends from a main portion of the insulation housing toward the tip end side of the wire-side terminals, and the location of the short-circuit member support is set such that as the short-circuit members slide as they are seated on the short-circuit member support, the male terminal sections of the short-circuit members are inserted in the female contacts of the specified wire-side terminals.

This structure provides the short-circuit member support a function of guiding the short-circuit members toward the wire-side terminals, improves the operation effectiveness, and covers the short-circuit members from one side and effectively protects the short-circuit members with the short-circuit members linked with the wire-side terminals. Further, since the short-circuit member support extends from the main portion of the insulation housing toward the tip end side of the wire-side terminals, the short-circuit member support is formed without increasing the height of the connector almost at all.

In addition, where the short-circuit member protector of the insulation housing is formed so that the short-circuit member protector can be switched between an open condition at which portions of the insulation housing which receive the male terminal sections of the short-circuit members are released and a close condition at which the short-circuit members fit with the specified wire-side terminals are covered, secure protection of the short-circuit member support is provided by closing the short-circuit member protector and accordingly covering the short-circuit members after fitting the short-circuit members in the wire-side terminals with the short-circuit member protector open.

In the event that the short-circuit member protector includes a short-circuit member restricting member which restricts, in the close condition, the short-circuit members from moving away from the female contacts, restriction of the short-circuit members more securely maintains the connection between the short-circuit members and the wire-side terminals.

The present invention is also directed to a method of electrically connecting a plurality of electric wires contained in a wire harness with each other using the joint connector, including the steps of: fixing the wire-side terminals to the ends of specified electric wires among the electric wires contained in the wire harness; holding the wire-side terminals within the insulation housing; fitting the male terminal sections of the short-circuit members in the female contacts of the specified wire-side terminals held within the insulation housing and electrically connecting the wire-side terminals with each other; and fixing the insulation housing to a main portion of the wire harness after the electric connection.

Using this method, as the male terminal sections of the short-circuit members whose shape corresponds to a desired short-circuit pattern is fit in the female contacts of the appropriate wire-side terminals after setting the wire-side terminals in the insulation housing, the short-circuit pattern is easily and flexibly created.

As described above, according to the present invention, wires including the wire harness are connected to the conductor of the flexible wiring member, which can be wound around the wire harness, via the joint-side terminal, and the connection circuit for electrically connecting the specified joint-side terminals in the joint-side terminals to the flexible wiring member included therein. Accordingly, the following effect is obtained; i.e., the thickness of the entire structure is reduced, and thus the protrusion amount when the same is wound around the wire harness can be reduced.

As described above, the present invention is directed to a joint connector for electrically connecting a plurality of electric wires contained in a wire harness with each other including an insulation housing holding a plurality of wire-side terminals side by side approximately on the same plane and a short-circuit member, which includes a plurality of male terminal sections which can be inserted each from the tip end side into female contacts of these wire-side terminals and a terminal linking section which links and electrically connects these male terminal sections to each other, such that the male terminal sections of the short-circuit member can be fit in the female contacts of the wire-side terminals from outside the insulation housing. As compared therefore to where a bus bar plate is inserted to the wire-side terminals from the direction of the height of the wire-side terminals as in a conventional technique, it is possible to greatly reduce the thickness of the joint connector as a whole and achieve an effect that the joint connector, when wound around a wire harness, sticks out only a little.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A joint member for electrically connecting a plurality of wires included in a wire harness to each other, the joint member comprising:
   a flexible wiring member extending in one direction and having a flexibility so as to allow winding around the wire harness with a longitudinal direction of the flexible wiring member oriented in a peripheral direction of the wire harness or in a direction inclined with respect to the peripheral direction;
   joint-side terminals provided in a plurality of positions aligned in the longitudinal direction of the flexible wiring member and protruding outward from an edge portion extending in the longitudinal direction of the flexible wiring member to be connected to each of the wires; and
   a connection circuit provided in the flexible wiring member that electrically connects specific joint-side terminals of the joint-side terminals with one another,
   wherein the joint-side terminals are configured so that, when connected to one or more wire side terminals, a male end of at least one of the joint-side terminals or at least one of the wire-side terminals is compatible with a female end of a respective at least one of the wire-side terminals or at least one of the joint-side terminals,
   the joint-side terminals are arranged in a single layer,
   wire-side terminals that are connected to the joint-side terminals are connected in a single layer, and
   respective joint-side terminals and wire-side terminals are aligned along a common longitudinal axis when connected.

2. The joint member according to claim 1, wherein the flexible wiring member includes a flexible printed circuit substrate formed with a conductor pattern on a substrate having flexibility, the conductor pattern including protruding portions constituting each of the joint-side terminals.

3. The joint member according to claim 2, wherein a reinforcement plate is fixed to a protruding portion so as to overlap the protruding portion.

4. The joint member according to claim 1, wherein the flexible wiring member includes a flat wiring member integrally formed with a flat insulation layer around a plurality of conductors aligned parallel to each other on the same plane, and to each conductor of the flat wiring member, a terminal component member extending in a direction substantially perpendicular thereto is connected, and the terminal component members are arranged being aligned in the longitudinal direction of the flat wiring member to form the joint-side terminals.

5. The joint member according to claim 4, wherein projections and recesses for increasing a distance along a face between the conductors are formed on an end portion in the longitudinal direction of the flat wiring member.

6. A joint connector comprising:
   a joint member for electrically connecting a plurality of wires included in a wire harness to each other; and
   a plurality of wire-side terminals,
   wherein the joint member includes:
      a flexible wiring member extending in one direction and having a flexibility so as to allow winding around the wire harness with a longitudinal direction of the flexible wiring member oriented in a peripheral direction of the wire harness or in a direction inclined with respect to the peripheral direction;
      joint-side terminals provided in a plurality of positions aligned in the longitudinal direction of the flexible wiring member and protruding outward from an edge portion extending in the longitudinal direction of the flexible wiring member to be connected to each of the wires; and a connection circuit provided in the flexible wiring member and electrically connecting specific joint-side terminals of the joint-side terminals with one another, wherein the wire-side terminals are fixed to terminals of specified wires in the wires included in the wire harness and capable of being fitted with each joint-side terminal included in the joint member, each of the wire-side terminals is fitted with a joint-side terminal of the joint member to be electrically connected to each other, and the joint-side terminals and the wire side terminals are configured so that, when connected, a male end of at least one of the joint-side terminals or at least one of the wire-side terminals is compatible with a female end of a respective at least one of the wire-side terminals or at least one of the joint-side terminals, and the joint-side terminals are arranged in a single layer, wire-side terminals and the joint-side terminals are connected in a single layer, and respective joint-side terminals and wire-side terminals are aligned along a common longitudinal axis when connected.

7. The joint connector according to claim 6, wherein the flexible wiring member includes a flexible printed circuit substrate formed with a conductor pattern on a substrate having flexibility, the conductor pattern including protruding portions constituting each of the joint-side terminals.

8. The joint connector according to claim 7, wherein a reinforcement plate is fixed to the protruding portion so as to overlap the protruding portion.

9. The joint connector according to claim 6, wherein the flexible wiring member includes a flat wiring member integrally formed with a flat insulation layer around a plurality of conductors aligned parallel to each other on the same plane, and to each conductor of the flat wiring member, a terminal component member extending in a direction substantially perpendicular thereto is connected, and the terminal component members are arranged being aligned in the longitudinal direction of the flat wiring member to form the joint-side terminals.

10. The joint connector according to claim 9, wherein projections and recesses for increasing a distance along a face between the conductors are formed on an end portion in the longitudinal direction of the flat wiring member.

11. The joint connector according to claim 6 further comprising a plurality of wire-side insulation housings for holding the wire-side terminals, wherein, in a state where the wire-side terminals held by the wire-side insulation housings and the joint-side terminals are fitted with each other, the flexible wiring member is provided to be flexible within the positions between the wire-side insulation housings.

12. The joint connector according to claim 11, wherein each wire-side insulation housing includes a holding member that holds a plurality of wire-side terminals in a state where the wire-side terminals are aligned on substantially the same plane.

13. The joint connector according to claim 11, wherein each wire-side insulation housing includes a wiring member holding section for holding the flexible wiring member of the joint member in a position where the wire-side terminal held by the wire-side insulation housing and the joint-side terminal of the joint member are fitted with each other.

14. The joint connector according to claim 13, wherein the flexible wiring member constituting the joint member is formed with through-holes, and wherein the wire-side insulation housing is formed with wiring member holding projections to be fitted with the through-holes in a position where each wire-side terminal held by the wire-side insulation housing and the joint-side terminal of the joint member are fitted with each other.

15. The joint connector according to claim 14, wherein the relative position between the wiring member holding projections in each of the wire-side insulation housings and the wire-side terminals held by the wire-side insulation housings is different in each of the wire-side insulation housings.

16. The joint connector according to claim 11, wherein the flexible wiring members are formed in a stair-like shape so that a position of each of the wire-side insulation housings shifts in a stair-like shape in the direction perpendicular to the longitudinal direction of the flexible wiring member.

17. A wire harness comprising a joint connector to electrically connect specified wires to each other, the joint connector including a joint member for electrically connecting a plurality of wires included in a wire harness to each other;

and a plurality of wire-side terminals, the joint member comprising:

a flexible wiring member extending in one direction and having a flexibility so as to allow winding around the wire harness with a longitudinal direction of the flexible wiring member oriented in a peripheral direction of the wire harness or in a direction inclined with respect to the peripheral direction;

joint-side terminals provided in a plurality of positions aligned in the longitudinal direction of the flexible wiring member and protruding outward from an edge portion extending in the longitudinal direction of the flexible wiring member to be connected to each of the wires;

a connection circuit provided in the flexible wiring member and electrically connects specific joint-side terminals of the joint-side terminals with one another, wherein the wire-side terminals are fixed to terminals of specified wires in the wires included in the wire harness and capable of being fitted with each joint-side terminal included in the joint member, each of the wire-side terminals is fitted with a joint-side terminal of the joint member to be electrically connected to each other, the joint-side terminals and the wire side terminals are configured so that, when connected, a male end of at least one of the joint-side terminals or at least one of the wire-side terminals is compatible with a female end of a respective at least one of the wire-side terminals or at least one of the joint-side terminals, and the joint-side terminals are arranged in a single layer, wire-side terminals and the joint-side terminals are connected in a single layer, respective joint-side terminals and wire-side terminals are aligned along a common longitudinal axis when connected, and the flexible wiring member of the joint member is wound around a main body portion of the wire harness and fixed thereto in a state where each of the wire-side terminals are fixed to the terminals of specified wires and the wire-side terminal, each of the joint-side terminals of the joint member being fitted with other.

18. A wire harness comprising a joint connector to electrically connect specified wires to each other, the joint connector including: a joint member for electrically connecting a plurality of wires included in a wire harness to each other; a plurality of wire-side terminals; and a plurality of wire-side insulation housings for holding the wire-side terminals, the joint member comprising:

- a flexible wiring member extending in one direction and having a flexibility so as to allow winding around the wire harness with a longitudinal direction of the flexible wiring member oriented in a peripheral direction of the wire harness or in a direction inclined with respect to the peripheral direction;
- joint-side terminals provided in a plurality of positions aligned in the longitudinal direction of the flexible wiring member and protruding outward from an edge portion extending in the longitudinal direction of the flexible wiring member to be connected to each of the wires; and
- a connection circuit provided in the flexible wiring member and electrically connects specific joint-side terminals of the joint-side terminals with one another,
- wherein the wire-side terminals are fixed to terminals of specified wires in the wires included in the wire harness and capable of being fitted with each joint-side terminal included in the joint member,
- each of the wire-side terminals is fitted with a joint-side terminal of the joint member to be electrically connected to each other,
- the joint-side terminals and the wire side terminals are configured so that, when connected, a male end of at least one of the joint-side terminals or at least one of the wire-side terminals is compatible with a female end of a respective at least one of the wire-side terminals or at least one of the joint-side terminals, and
- the joint-side terminals are arranged in a single layer,
- wire-side terminals and the joint-side terminals are connected in a single layer,
- respective joint-side terminals and wire-side terminals are aligned along a common longitudinal axis when connected,
- in a state where the wire-side terminals held by the wire-side insulation housings and the joint-side terminals are fitted with each other, the flexible wiring member is provided to be flexible within the positions between the wire-side insulation housings,
- the flexible wiring members are formed in a stair-like shape so that a position of each of the wire-side insulation housings shifts in a stair-like shape in the direction perpendicular to the longitudinal direction of the flexible wiring member,
- each of the wire-side terminals is fixed to the terminals of the specified wires,
- the joint member to be connected to the wire-side terminals is held by the wire-side insulation housing, and
- the flexible wiring member of the joint member is wound around a main body portion of the wire harness in a spiral configuration and fixed thereto.

* * * * *